United States Patent
Noda et al.

(10) Patent No.: US 9,728,398 B2
(45) Date of Patent: *Aug. 8, 2017

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Takaaki Noda, Toyama (JP); Satoshi Shimamoto, Toyama (JP); Shingo Nohara, Toyama (JP); Yoshiro Hirose, Toyama (JP); Kiyohiko Maeda, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 62 days.

This patent is subject to a terminal disclaimer.

(21) Appl. No.: 14/227,809

(22) Filed: Mar. 27, 2014

(65) Prior Publication Data

US 2015/0072537 A1    Mar. 12, 2015

(30) Foreign Application Priority Data

Sep. 9, 2013    (JP) .................. 2013-186482

(51) Int. Cl.
*C23C 16/00* (2006.01)
*H01L 21/02* (2006.01)
(Continued)

(52) U.S. Cl.
CPC ........ *H01L 21/02126* (2013.01); *C23C 16/36* (2013.01); *C23C 16/401* (2013.01);
(Continued)

(58) Field of Classification Search
CPC . C23C 16/36; C23C 16/401; C23C 16/45531; C23C 16/45534;
(Continued)

(56) References Cited

U.S. PATENT DOCUMENTS 7,084,076 B2    8/2006 Park et al.
8,329,599 B2    12/2012 Fukazawa et al.
(Continued)

FOREIGN PATENT DOCUMENTS

CN    103168344 A    6/2013
JP    2004-040110 A    2/2004
(Continued)

OTHER PUBLICATIONS

Korean Notice of Preliminary Rejection, KR Application No. 10-2015-0113942, Mar. 3, 2016, 4 pages.
(Continued)

Primary Examiner — Kelly M Gambetta
(74) Attorney, Agent, or Firm — Volpe and Koenig, P.C.

(57) ABSTRACT

A method of manufacturing a semiconductor device, includes: forming a thin film containing silicon, oxygen and carbon or a thin film containing silicon, oxygen, carbon and nitrogen on a substrate by performing a cycle a predetermined number of times. The cycle includes supplying a precursor gas serving as a silicon source and a carbon source or a precursor gas serving as a silicon source but no carbon source, and a first catalyst gas to the substrate; supplying an oxidizing gas and a second catalyst gas to the substrate; and supplying a modifying gas containing at least one selected from the group consisting of carbon and nitrogen to the substrate.

16 Claims, 21 Drawing Sheets

(51) Int. Cl.
  *C23C 16/52* (2006.01)
  *C23C 16/455* (2006.01)
  *C23C 16/44* (2006.01)
  *H01J 37/32* (2006.01)
  *C23C 16/36* (2006.01)
  *C23C 16/40* (2006.01)

(52) U.S. Cl.
  CPC .... *C23C 16/4412* (2013.01); *C23C 16/45523* (2013.01); *C23C 16/45531* (2013.01); *C23C 16/45534* (2013.01); *C23C 16/45553* (2013.01); *C23C 16/45561* (2013.01); *C23C 16/45578* (2013.01); *C23C 16/52* (2013.01); *H01J 37/32449* (2013.01); *H01J 37/32559* (2013.01); *H01L 21/0228* (2013.01); *H01L 21/0234* (2013.01); *H01L 21/02211* (2013.01); *H01L 21/02321* (2013.01); *H01L 21/02329* (2013.01); *H01L 21/02332* (2013.01); *H01L 21/02337* (2013.01)

(58) Field of Classification Search
  CPC ............. C23C 16/45553; C23C 16/52; C23C 16/45523; C23C 16/45561; C23C 16/45578; C23C 16/4412
  USPC ............................................ 427/248.1, 249.1
  See application file for complete search history.

(56) References Cited

U.S. PATENT DOCUMENTS

| | | | |
|---|---|---|---|
| 8,535,479 B2 | 9/2013 | Mizuno et al. | |
| 9,018,104 B2 | 4/2015 | Hirose et al. | |
| 9,053,927 B2 | 6/2015 | Hirose et al. | |
| 2004/0018694 A1 | 1/2004 | Lee et al. | |
| 2005/0268848 A1* | 12/2005 | Wang | C23C 16/45525 118/719 |
| 2011/0076789 A1* | 3/2011 | Kuroda | H01L 21/266 438/14 |
| 2012/0122302 A1 | 5/2012 | Weidman et al. | |
| 2013/0084714 A1* | 4/2013 | Oka | H01L 21/02126 438/765 |
| 2014/0273524 A1 | 9/2014 | Nguyen et al. | |
| 2014/0287596 A1* | 9/2014 | Hirose | H01L 21/022 438/786 |
| 2016/0002039 A1 | 1/2016 | Thompson | |

FOREIGN PATENT DOCUMENTS

| | | |
|---|---|---|
| JP | 2008-071894 A | 3/2008 |
| JP | 2009-206312 A | 9/2009 |
| JP | 2009-272558 A | 11/2009 |
| JP | 2011-108737 A | 6/2011 |
| JP | 2013-140945 A | 7/2013 |
| JP | 2014-183218 A | 9/2014 |
| KR | 10-0564609 B1 | 3/2006 |
| KR | 10-2011-0034538 A | 11/2009 |
| TW | 201137951 A1 | 11/2011 |
| WO | 2011/125395 | 10/2011 |

OTHER PUBLICATIONS

Chinese Notification of First Office Action, CN Patent Application No. 2014101390974, Oct. 8, 2016, 10 pages (English translation provided).

* cited by examiner

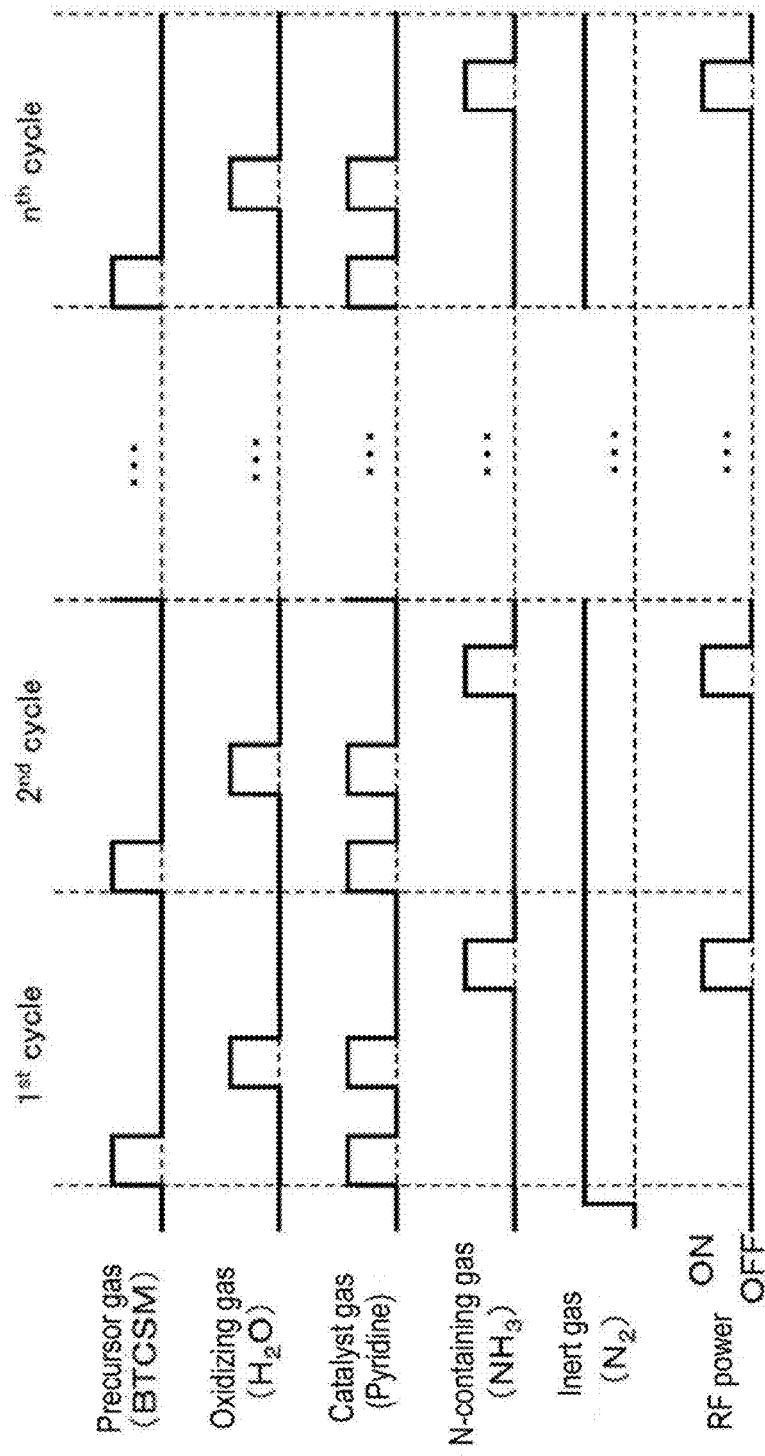

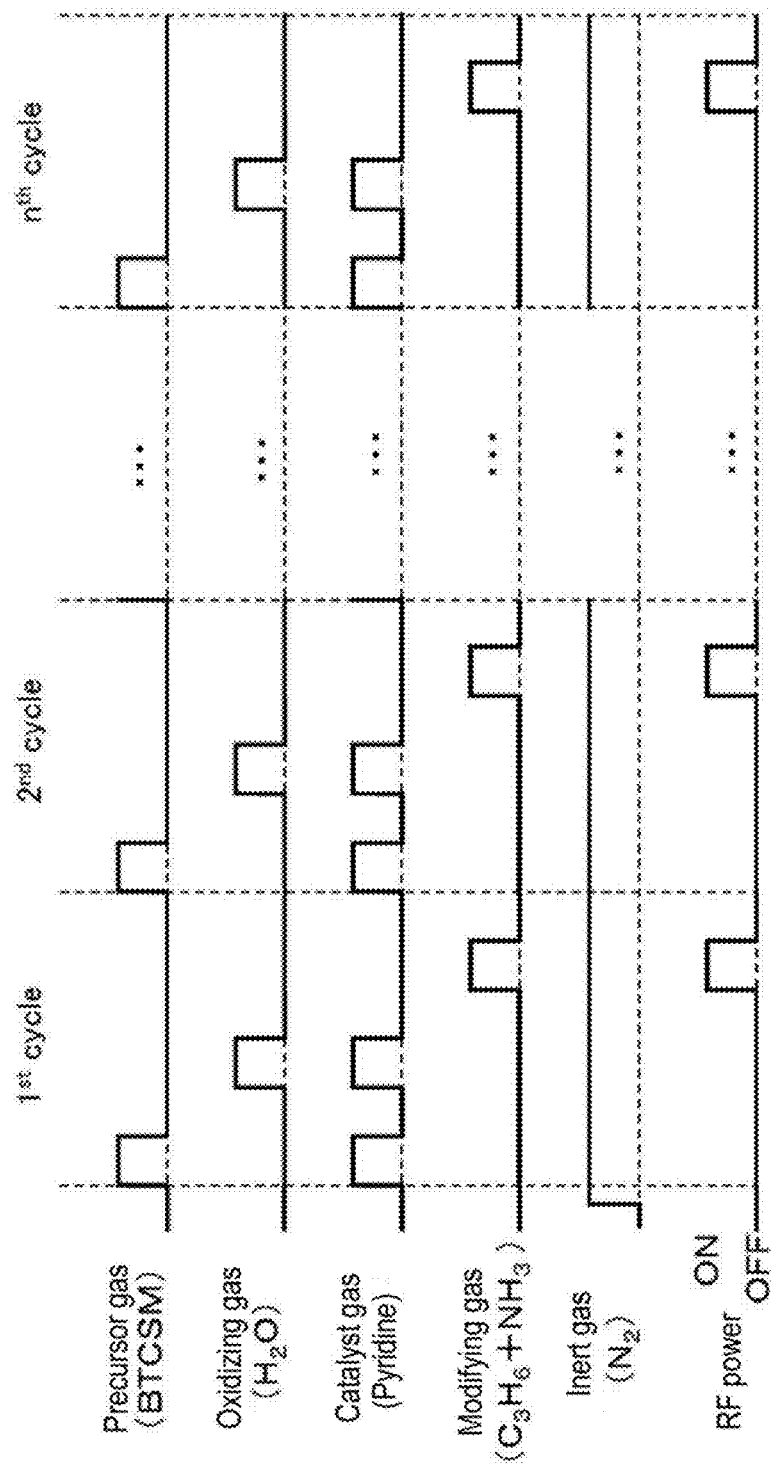

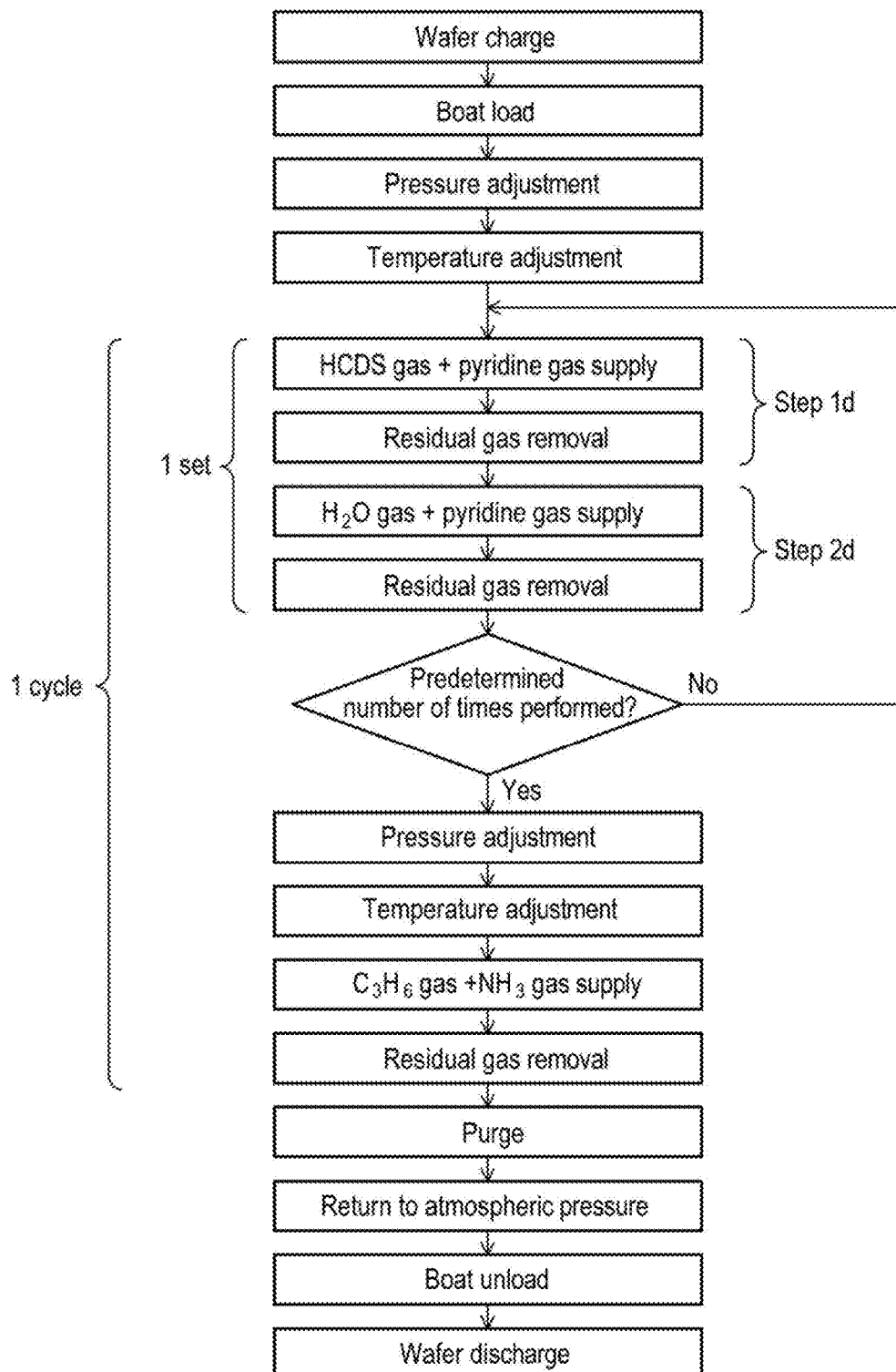

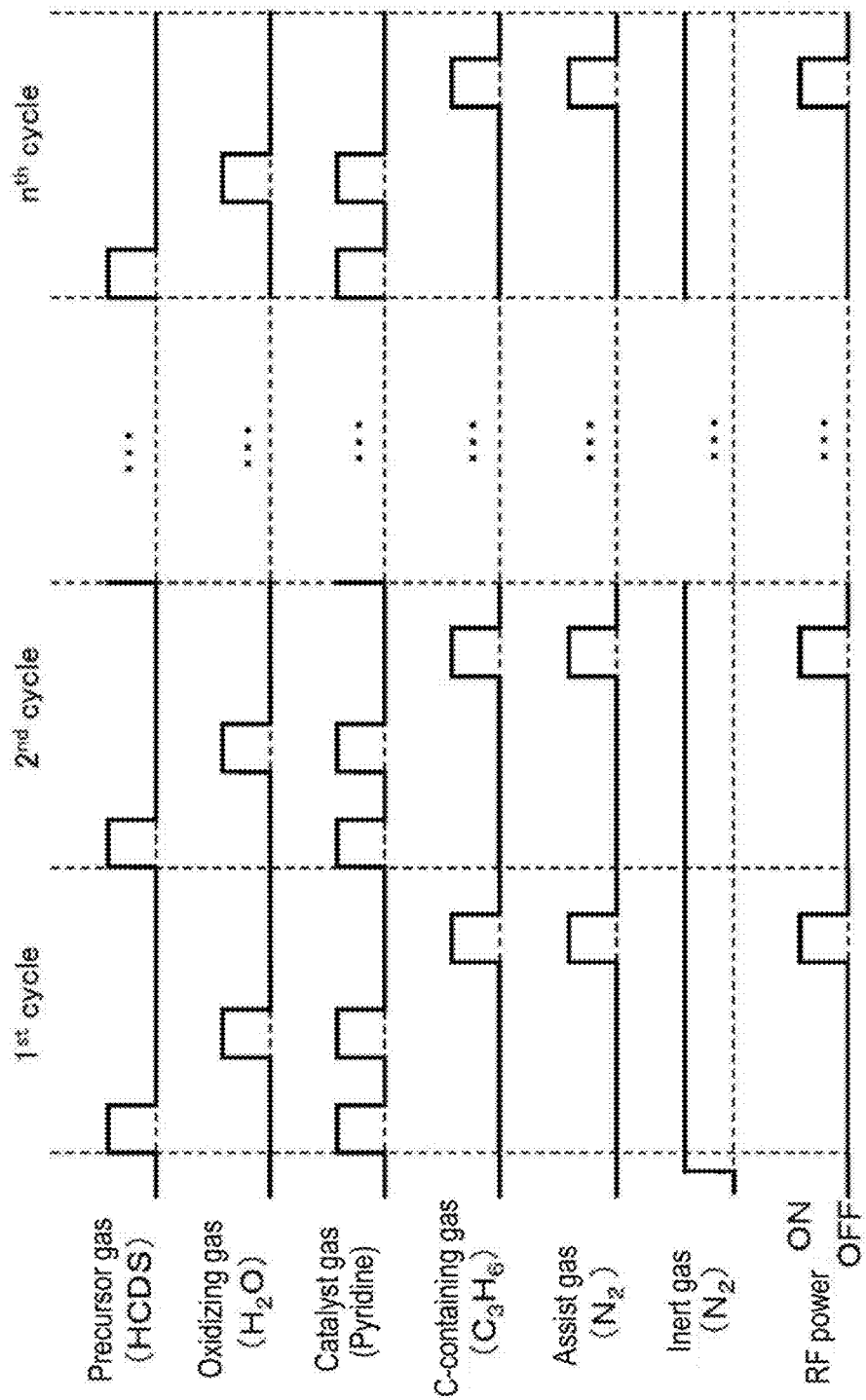

FIG. 14
| Name | Pyridine | Aminopyridine | Picoline | Lutidine |
|---|---|---|---|---|
| Composition formula | $C_5H_5N$ | $C_5H_6N_2$ | $C_6H_7N$ | $C_7H_9N$ |
| Structural formula | 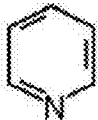 | 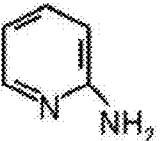 | 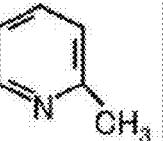 | 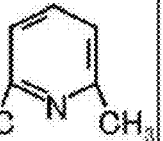 |
| Acid dissociation constant (pKa) | 5.67 | 6.89 | 6.07 | 6.96 |
| Name | Pyridine | Quinoline | Piperazine | Piperidine |
| Composition formula | $C_4H_4N_2$ | $C_9H_7N$ | $C_4H_{10}N_2$ | $C_5H_{11}N$ |
| Structural formula | 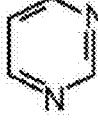 | 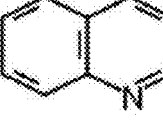 | 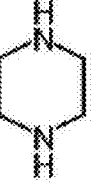 | 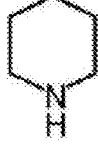 |
| Acid dissociation constant (pKa) | 1.30 | 4.97 | 9.80 | 11.12 |

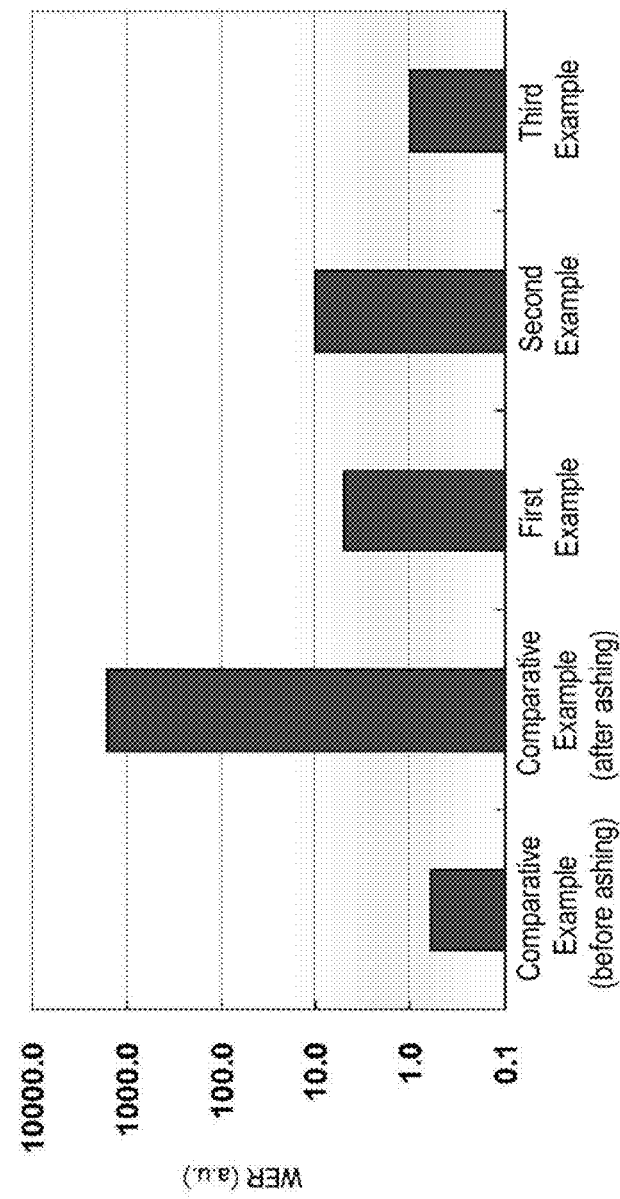

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2013-186482, filed on Sep. 9, 2013, the entire contents of which are incorporated herein by reference.

TECHNICAL FIELD

The present disclosure relates to a method of manufacturing a semiconductor device, a substrate processing apparatus, and a recording medium.

BACKGROUND

A process of forming a thin film such as a silicon oxide film or the like on a substrate by supplying a precursor gas containing silicon or other element(s), an oxidizing gas and so on to the substrate may be performed during manufacture of semiconductor devices. In this case, the film can be formed at a relatively low temperature, for example by using a catalyst gas, thereby improving thermal history of the semiconductor devices.

When the above-mentioned film is formed on the substrate, a resistance to wet etching by hydrofluoric acid (HF aqueous solution) or the like can be improved by adding an element such as carbon or the like to the film.

However, under a relatively low temperature condition, a sufficient amount of carbon may not be introduced into the film, which may result in difficulty in obtaining a film having a high etching resistance. In addition, a film added with carbon may have a low ashing resistance.

SUMMARY

The present disclosure provides some embodiments of a method of manufacturing a semiconductor device, which is capable of forming a film having a high etching resistance and a high ashing resistance.

According to some embodiments, there is provided a method of manufacturing a semiconductor device, including: forming a thin film containing silicon, oxygen and carbon or a thin film containing silicon, oxygen, carbon and nitrogen on a substrate by performing a cycle a predetermined number of times, the cycle including: supplying a precursor gas serving as a silicon source and a carbon source or a precursor gas serving as a silicon source but no carbon source, and a first catalyst gas to the substrate; supplying an oxidizing gas and a second catalyst gas to the substrate; and supplying a modifying gas containing at least one selected from the group consisting of carbon and nitrogen to the substrate.

According to some embodiments, there is provided a substrate processing apparatus including: a process chamber in which a substrate is accommodated; a precursor gas supply system configured to supply a precursor gas serving as a silicon source and a carbon source or a precursor gas serving as a silicon source but no carbon source into the process chamber; an oxidizing gas supply system configured to supply an oxidizing gas into the process chamber; a catalyst gas supply system configured to supply first and second catalyst gases into the process chamber; a modifying gas supply system configured to supply a modifying gas containing at least one selected from the group consisting of carbon and nitrogen into process chamber; and a control unit configured to control the precursor gas supply system, the oxidizing gas supply system, the catalyst gas supply system and the modifying gas supply system such that a thin film containing silicon, oxygen and carbon or a thin film containing silicon, oxygen, carbon and nitrogen is formed on the substrate by performing a cycle a predetermined number of times, the cycle including: supplying the precursor gas and the first catalyst gas to the substrate within the process chamber; supplying the oxidizing gas and the second catalyst gas to the substrate within the process chamber; and supplying the modifying gas to the substrate within the process chamber.

According to some embodiments, there is provided a non-transitory computer-readable recording medium storing a program that causes a computer to perform a process of forming a thin film containing silicon, oxygen and carbon or a thin film containing silicon, oxygen, carbon and nitrogen on a substrate within a process chamber by performing a cycle a predetermined number of times, the cycle including: supplying a precursor gas serving as a silicon source and a carbon source or a precursor gas serving as a silicon source but no carbon source, and a first catalyst gas to the substrate within the process chamber; supplying an oxidizing gas and a second catalyst gas to the substrate within the process chamber; and supplying a modifying gas containing at least one selected from the group consisting of carbon and nitrogen to the substrate within the process chamber.

BRIEF DESCRIPTION OF THE DRAWINGS

FIGS. 8A and 8B are views illustrating gas supply and RF power supply timings in the film forming sequence and gas supply and RF power supply timings in a modification of the film forming sequence, respectively, according to the second embodiment.

FIG. 9 is a view illustrating a flow of film formation in a film forming sequence according to a third embodiment.

FIGS. 12A and 12B are views illustrating gas supply and RF power supply timings in the another modification of the film forming sequence and gas supply and RF power supply timings in still another modification of the film forming sequence, respectively, according to the third embodiment.

FIGS. 13A and 13B are views illustrating catalytic reactions in the film forming sequence according to the first embodiment, FIG. 13A being a view illustrating a catalytic reaction in Step 1a and FIG. 13B being a view illustrating a catalytic reaction in Step 2a.

FIG. 14 is a table showing names, chemical composition formulas, chemical structural formulas and acid dissociation constants of various amines used as catalyst gases.

FIG. 16 is a graph showing wet etching rates of films formed under various conditions of Examples and Comparative Examples.

DETAILED DESCRIPTION

First Embodiment

A first embodiment will be now described with reference to the drawings.

(1) General Configuration of Substrate Processing Apparatus

Figure 1:
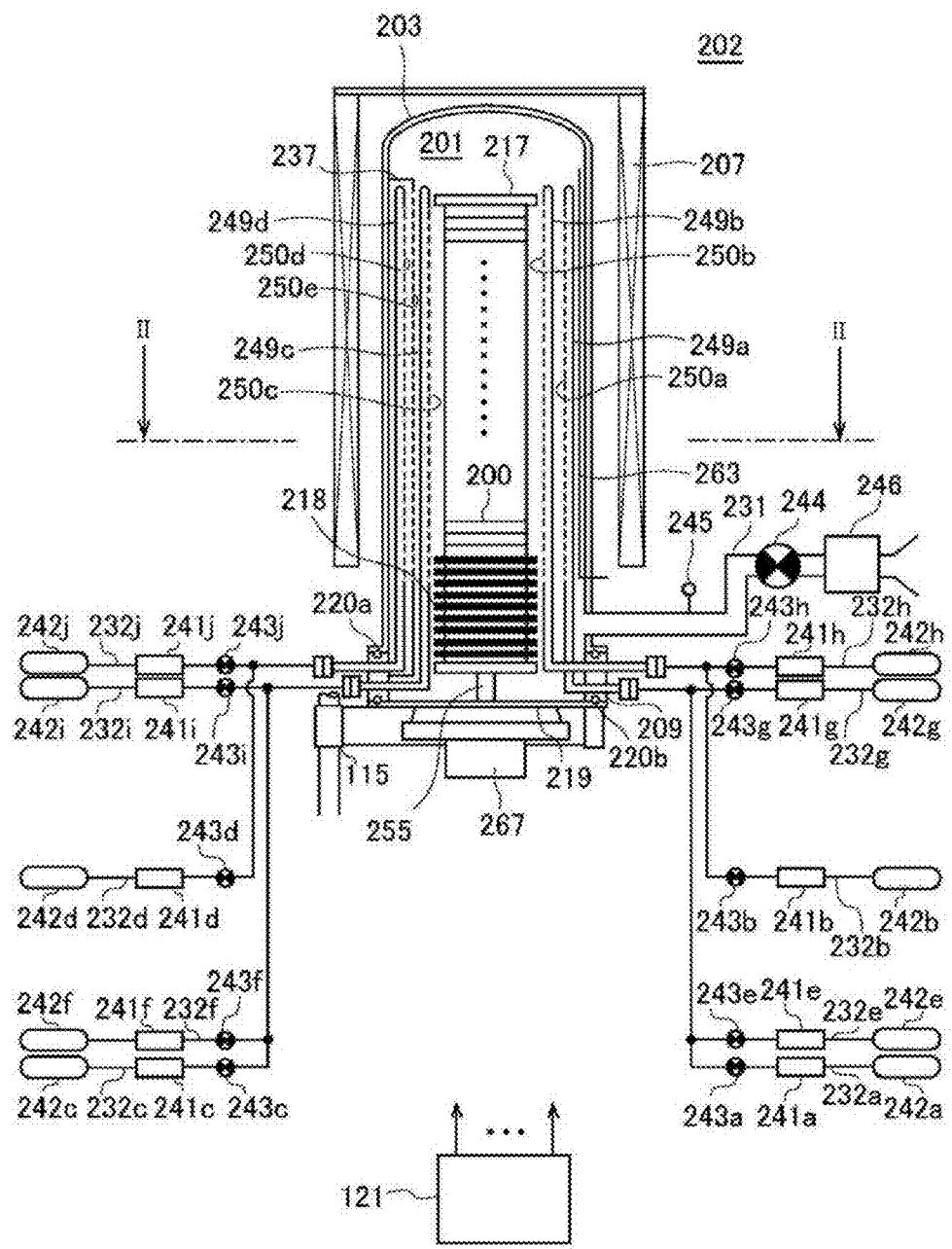
FIG. 1 is a schematic view illustrating a configuration of a vertical processing furnace of a substrate processing apparatus, in which a portion of the processing furnace is shown in a longitudinal sectional view, according to a first embodiment.
Figure 2:
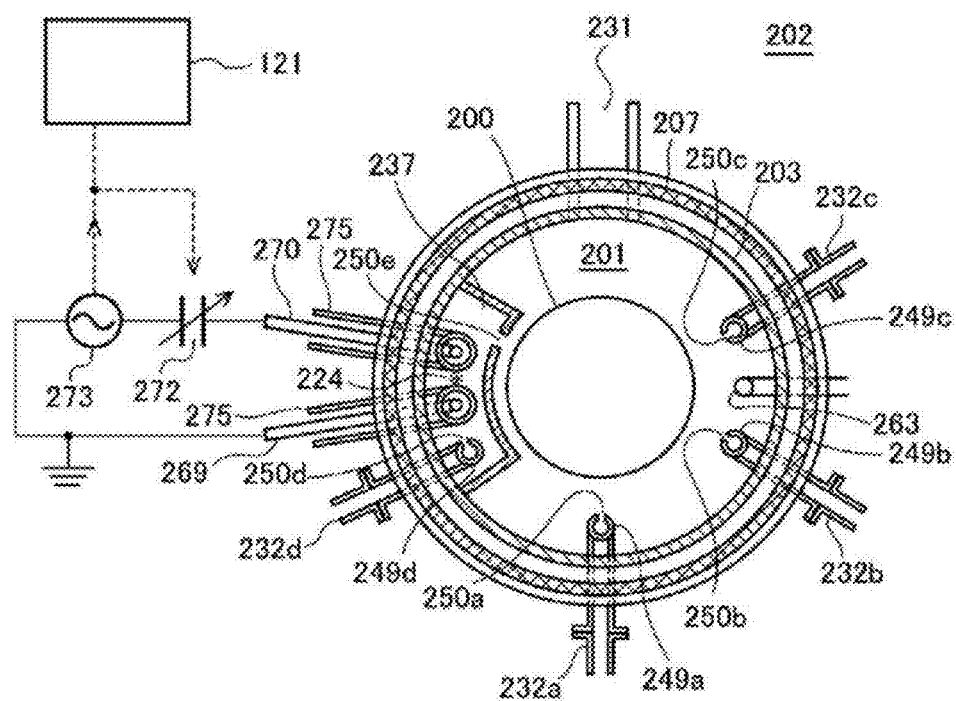
FIG. 2 is a schematic view illustrating a configuration of the vertical processing furnace of the substrate processing apparatus, in which a portion of the processing furnace is shown in a sectional view taken along line II-II in FIG. 1, according to the first embodiment.

FIG. 1 is a schematic view illustrating a configuration of a vertical processing furnace 202 of a substrate processing apparatus according to some embodiments, in which a portion of the vertical processing furnace 202 is shown by a longitudinal cross-sectional view. FIG. 2 is a schematic view illustrating a configuration of the vertical processing furnace of the substrate processing apparatus, in which a portion of the processing furnace is shown in a sectional view taken along line II-II in FIG. 1, according to the first embodiment. As shown in FIG. 1, the vertical processing furnace 202 has a heater 207 as a heating means (heating mechanism). The heater 207 has a cylindrical shape and is supported by a heater base (not shown) as a support plate so as to be vertically arranged. The heater 207 acts also as an activating mechanism (exciting unit) to activate (excite) gas with heat, as will be described later.

A reaction tube 203 is disposed inside the heater 207 in a concentric form along the heater 207. The reaction tube 203 is made of a heat resistant material such as quartz ($SiO_2$) or silicon carbide (SiC) and has a cylindrical shape with its upper end closed and its lower end opened. Below the reaction tube 203 is disposed a manifold (inlet flange) 209 in a concentric form along the reaction tube 203. The manifold 209 is made of metal such as stainless steel and has a cylindrical shape with its upper and lower ends opened. The top side of the manifold 209 is configured to support the reaction tube 203 in engagement with the bottom side of the reaction tube 203. Also, an O-ring 220a as a seal member is interposed between the manifold 209 and the reaction tube 203. As the manifold 209 is supported by the heater base, the reaction tube 203 remains in a vertical posture. A process vessel (reaction vessel) is mainly configured by the reaction tube 203 and the manifold 209. A process chamber 201 is provided in a hollow cylindrical portion of the reaction tube 203 and is configured to accommodate a plurality of wafers 200. The wafers 200 are horizontally stacked in multiple stages to be aligned in a vertical direction in a boat 217 which will be described later.

Nozzles 249a to 249d are provided in the process chamber 201 to penetrate through a lower portion of the reaction tube 203. Gas supply pipes 232a to 232d are respectively connected to the nozzles 249a to 249d. A gas supply pipe 232e is connected to the gas supply pipe 232a. A gas supply pipe 232f is connected to the gas supply pipe 232c. In this way, the four nozzles 249a to 249d and the plurality of gas supply pipes 232a to 232f are provided in the reaction tube 203 to allow several types of gases to be supplied into the process chamber 201.

A $(SiCl_3)_2CH_2$ (BTCSM) gas source 242a serving as a precursor gas source is connected to an upstream end portion of the gas supply pipe 232a. A $Si_2Cl_6$ (HCDS) gas source 242e serving as a precursor gas source is connected to an upstream end portion of the gas supply pipe 232e. A $H_2O$ gas source 242b serving as an oxidation gas source is connected to an upstream end portion of the gas supply pipe 232b. A $C_5H_5N$ (pyridine) gas source 242c serving as a catalyst gas source is connected to an upstream end portion of the gas supply pipe 232c. A $C_3H_6$ gas source 242f serving as a carbon-containing modifying gas source is connected to an upstream end portion of the gas supply pipe 232f. A $NH_3$ gas source 242d serving as a nitrogen-containing modifying gas source is connected to an upstream end portion of the gas supply pipe 232d. $N_2$ gas sources 242g to 242j serving as inert gas sources are respectively connected to upstream end portions of gas supply pipes 232g to 232j respectively connected to the gas supply pipes 232a to 232d. Mass flow controllers (MFCs) 241a to 241j serving as flow rate controllers (flow rate control units) and valves 243a to 243j serving as opening/closing valves are respectively installed in the gas supply pipes 232a to 232j in this order from an upstream direction. In addition, downstream end portions of the gas supply pipes 232g to 232j are respectively connected to the gas supply pipes 232a to 232d at downstream sides of the valves 243a to 243d. Downstream end portions of the gas supply pipes 232e and 232f are respectively connected to the gas supply pipes 232a and 232c at downstream sides of the valves 243a and 243c.

The above-mentioned nozzles 249a to 249c are respectively connected to leading end portions of the gas supply pipes 232a to 232c. The nozzles 249a to 249c are respectively vertically disposed along the inner wall of the reaction tube 203 in a circular arc-shaped space between the inner wall of the reaction tube 203 and the wafers 200, as shown in FIG. 2. That is, the nozzles 249a to 249c are disposed in a flank of a wafer arrangement region where the wafers 200 are arranged. Each of the nozzles 249a to 249c is configured as an L-like long nozzle and has its horizontal portion disposed to penetrate through a side wall of the manifold 209 and its vertical portion disposed to rise from at least one end of the wafer arrangement region toward the other end thereof. Gas supply holes 250a to 250c through which gas is supplied are respectively disposed at side surfaces of the nozzles 249a to 249c. As shown in FIG. 2, the gas supply holes 250a to 250c are opened toward a center of the reaction tube 203 to supply gas to the wafers 200. The gas supply holes 250a to 250c are disposed at a predetermined opening pitch from a lower portion to an upper portion of the reaction tube 203. The gas supply holes 250a to 250c have the same opening area.

The above-mentioned nozzle 249d is connected to a leading end portion of the gas supply pipe 232d. The nozzle 249d is installed inside a buffer chamber 237 that is a gas diffusion space. The buffer chamber 237 is installed in an arc-shaped space between the inner wall of the reaction tube 203 and the wafers 200. The buffer chamber 237 is vertically disposed along the inner wall of the reaction tube 203 in the stacking direction of the wafers 200. That is, the buffer chamber 237 is installed at the side of the wafer arrangement region, in which the wafers 200 are arranged. A plurality of gas supply holes 250e through which gas is supplied is formed in an end portion of a wall of the buffer chamber 237 adjacent to the wafers 200. The gas supply holes 250e are opened toward the center of the reaction tube 203 to supply gas toward the wafers 200. The gas supply holes 250e are disposed at a predetermined opening pitch from a lower portion to an upper portion of the reaction tube 203. The gas supply holes 250e have the same opening area.

As shown in FIG. 2, the nozzle 249d is installed along the inner wall of the reaction tube 203 to rise upward in the stacking direction of the wafers 200 in an end portion of the buffer chamber 237 opposite to the end portion thereof in which the gas supply holes 250e are formed. That is, the nozzle 249d is installed at the side of the wafer arrangement region, in which the wafers 200 are arranged. The nozzle 249d is configured as an L-shaped long nozzle and has its horizontal portion installed to penetrate through the lower sidewall of the reaction tube 203 and its vertical portion installed to rise from one end portion of the wafer arrangement region toward the other end portion thereof. A plurality of gas supply holes 250d through which gas is supplied is formed in a side surface of the nozzle 249d. As shown in FIG. 2, the gas supply holes 250d are opened toward the center of the buffer chamber 237. The gas supply holes 250d are disposed at a predetermined opening pitch from a lower portion to an upper portion of the reaction tube 203 in the same way as the gas supply holes 250e of the buffer chamber 237. The plurality of gas supply holes 250d may have the same opening area and the same opening pitch from an upstream side (lower portion) to a downstream side (upper portion) when a pressure difference between the interior of the buffer chamber 237 and the interior of the process chamber 201 is small. However, when the pressure difference is large, the opening area of each gas supply hole 250d may be set larger and the opening pitch of each gas supply hole 250d may be set smaller at the downstream side than the upstream side.

In this embodiment, by adjusting the opening area or opening pitch of each gas supply hole 250d from the upstream side to the downstream side as described above, gases may be ejected at substantially the same flow rate from the respective gas supply holes 250d despite a flow velocity difference. In addition, the gases ejected from the respective gas supply holes 250d are first introduced into the buffer chamber 237, and a flow velocity difference of the gases becomes uniform in the buffer chamber 237. That is, particle velocity of the gases ejected from the respective gas supply holes 250d into the buffer chamber 237 is reduced in the buffer chamber 237, and then are ejected from the respective gas supply holes 250e into the process chamber 201. Therefore, the gases ejected from the respective gas supply holes 250d into the buffer chamber 237 have a uniform flow rate and flow velocity when the gases are ejected from the respective gas supply holes 250e into the process chamber 201.

In the method of supplying gas using long nozzles according to the embodiment, the gas may be transferred through the nozzles 249a to 249d and the buffer chamber 237 disposed in an arc-shaped longitudinal space defined by the inner wall of the reaction tube 203 and end portions of the stacked wafers 200. The gas is first ejected into the reaction tube 203 near the wafers 200 through the gas supply holes 250a to 250e opened in the nozzles 249a to 249d and buffer chamber 237, respectively. Thus, a main flow of the gas in the reaction tube 203 follows a direction parallel to surfaces of the wafers 200, i.e., the horizontal direction. With this configuration, the gas can be uniformly supplied to the respective wafers 200, and thus, a film thickness of a thin film formed on each of the wafers 200 can be uniform. In addition, a gas after flowing on the surface of the wafers 200, i.e., a residual gas after the reaction, flows toward an exhaust port, i.e., the exhaust pipe 231 to be described later, but a flow direction of the residual gas is not limited to the vertical direction but may be appropriately adjusted by a position of the exhaust port.

As a precursor gas containing silicon (Si), carbon (C) and a halogen element [fluorine (F), chlorine (Cl), bromine (Br) or the like] and having a Si—C bonding, a methylene group-containing chlorosilane-based precursor gas, which is a precursor gas containing, for example, Si, a methylene group as an alkylene group, and a chloro group as a halogen group, is supplied from the gas supply pipe 232a into the process chamber 201 through the MFC 241a, the valve 243a and the nozzle 249a. As used herein, the term "methylene group-containing chlorosilane-based precursor gas" refers to a silane-based precursor gas containing a methylene group and a chloro group, i.e., a precursor gas containing at least Si, a C-containing methylene group and Cl as a halogen element. An example of the methylene group-containing chlorosilane-based precursor gas supplied from the gas supply pipe 232a may include a methylenebis(trichlorosilane) gas, i.e., a bis(trichlorosilyl)methane ((SiCl$_3$)$_2$CH$_2$, abbreviation: BTCSM) gas.

Figure 15A:
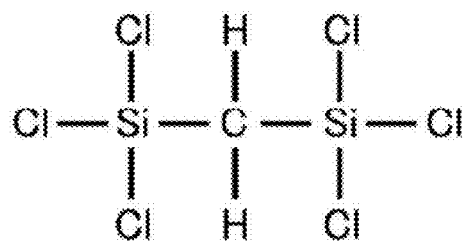
FIGS. 15A to 15E are views showing chemical structural formulas of various silanes used as precursor gases, FIGS. 15A to 15E showing chemical structural formulas of BTCSM, BTCSE, TCDMDS, DCTMDS and MCPMDS, respectively.

As shown in FIG. 15A, BTCSM contains a methylene group as an alkylene group in its chemical structural formula (In one molecule). The methylene group contained in BTCSM has two bonds combined with Si, thereby forming a Si—C—Si bonding. A Si—C bonding in the precursor gas is a portion of the Si—C—Si bonding contained in BTCSM and the methylene group contained in BTCSM contains C constituting this Si—C bonding.

The precursor gas containing Si, C and the halogen element and having the Si—C bonding may include, for example, an ethylene group-containing chlorosilane-based precursor gas, which is a precursor gas containing, for example, Si, an ethylene group as an alkylene group, and a chloro group as a halogen group. An example of the ethylene group-containing chlorosilane-based precursor gas supplied from the gas supply pipe 232a may include an ethylenebis(trichlorosilane) gas, i.e., a 1,2-bis(trichlorosilyl)ethane ((SiCl$_3$)$_2$C$_2$H$_4$, abbreviation: BTCSE) gas.

Figure 15B:
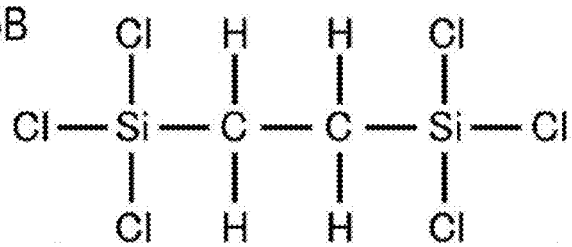

As shown in FIG. 15B, BTCSE contains an ethylene group as an alkylene group in its chemical structural formula (In one molecule). The ethylene group contained in BTCSE has two bonds combined with Si, thereby forming a Si—C—C—Si bonding. A Si—C bonding in the precursor gas is a portion of the Si—C—C—Si bonding contained in BTCSE and the ethylene group contained in BTCSE contains C constituting this Si—C bonding.

As used herein, the term "alkylene group" refers to a functional group formed by removing two hydrogen (H) atoms from chain-like saturated hydrocarbon (alkane) represented by a general formula: $C_nH_{2n+2}$. That is, the alkylene group is an aggregation of atoms represented by a general formula: $C_nH_{2n}$. An example of the alkylene group may include a propylene group, a butylene group and the like, in addition to the above-mentioned methylene group and ethylene group. Thus, the precursor gas containing Si, C and the halogen element and having the Si—C bonding includes an alkylenehalosilane-based precursor gas containing Si, an alkylene group and a halogen element. The alkylenehalosilane-based precursor gas may be also referred to as an alkylene group-containing halosilane gas having a structure where an alkylene group is introduced between, for example, Si—Si bondings, with many halogen elements combined with a Si bond in the halosilane-based precursor gas. The alkylenehalosilane-based precursor gas includes the BTCSM gas and the BTCSE gas.

The precursor gas containing Si, C and the halogen element and having the Si—C bonding may include, for example, a methyl group-containing chlorosilane-based precursor gas, which is a precursor gas containing, for example, Si, a methyl group as an alkyl group, and a chloro group as a halogen group. The methyl group-containing chlorosilane-based precursor gas refers to a silane-based precursor gas containing a methyl group and a chloro group, i.e., a precursor gas containing at least Si, a C-containing methyl group and Cl as a halogen element. An example of the methyl group-containing chlorosilane-based precursor gas may include a 1,1,2,2-tetrachloro-1,2-dimethyl disilane (($CH_3)_2Si_2Cl_4$, abbreviation: TCDMDS) gas, 1,2-dichloro-1,1,2,2-tetramethyldisilane (($CH_3)_4Si_2Cl_2$, abbreviation: DCTMDS) gas, 1-monochloro-1,1,2,2,2-pentamethyldisilane (($CH_3)_5Si_2Cl$, abbreviation: MCPMDS) gas and the like.

Figure 15C:
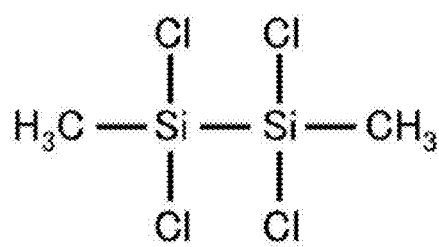

As shown in FIG. 15C, TCDMDS contains two methyl groups as alkyl groups in its chemical structural formula (In one molecule). The two methyl groups contained in TCDMDS has bonds combined with Si, thereby forming a Si—C bonding. A Si—C bonding contained in the precursor gas is a Si—C bonding in, for example, TCDMDS and each of the two methyl groups contained in TCDMDS contains C constituting this Si—C bonding.

Figure 15D:
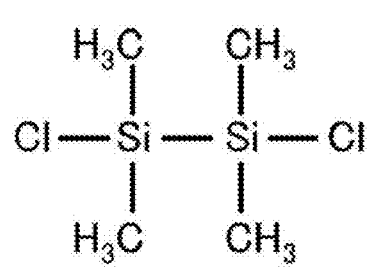

As shown in FIG. 15D, DCTMDS contains four methyl groups as alkyl groups in its chemical structural formula (In one molecule). The four methyl groups contained in DCTMDS has bonds combined with Si, thereby forming a Si—C bonding. A Si—C bonding contained in the precursor gas is a Si—C bonding in, for example, DCTMDS and each of the four methyl groups contained in DCTMDS contains C constituting this Si—C bonding.

Figure 15E:
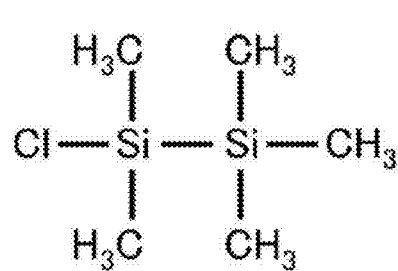

As shown in FIG. 15E, MCPMDS contains five methyl groups as alkyl groups in its chemical structural formula (In one molecule). The five methyl groups contained in MCPMDS has bonds combined with Si, thereby forming a Si—C bonding. A Si—C bonding contained in the precursor gas is a portion of a Si—C bonding in, for example, MCPMDS and each of the five methyl groups contained in MCPMDS contains C constituting this Si—C bonding. Unlike the precursor gases such as the above-mentioned BTCSM gas, BTCSE gas, TCDMDS gas and DCTMDS gas, the MCPMDS gas has an asymmetrical structure where arrangement of the methyl groups and chloro groups surrounding Si is asymmetrical in the MCPMDS molecules (in its chemical structural formula). Thus, this embodiment may employ not only precursor gases having the symmetrical chemical structural formulas shown in FIGS. 15A to 15D but also precursor gases having the asymmetrical chemical structural formula shown in FIG. 15E.

As used herein, the term "alkyl group" refers to a functional group formed by removing one hydrogen (H) atom from a chain-like saturated hydrocarbon (alkane) represented by a general formula: $C_nH_{2n+2}$. That is, the alkyl group is an aggregation of atoms represented by a general formula: $C_nH_{2n+1}$. An example of the alkyl group may include a propyl group, a butyl group and the like, in addition to the above-mentioned methyl group. Thus, the precursor gas containing Si, C and the halogen element and having the Si—C bonding includes an alkylhalosilane-based precursor gas containing Si, an alkyl group and a halogen element. The alkylhalosilane-based precursor gas may be also referred to as an alkyl group-containing halosilane gas having a structure where some alkyl groups of the halosilane-based precursor gas are substituted with alkyl groups. The alkylhalosilane-based precursor gas includes the TCDMDS gas, the DCTMDS gas and the MCPMDS gas.

The BTCSM gas, the BTCSE gas, the TCDMDS gas, the DCTMDS gas and the MCPMDS gas may be referred to as precursor gases containing a halogen element (Cl) and at least two Si atoms in one molecule and having a Si—C bonding. These gases may be also referred to as precursor gases serving as both of a silicon (Si) source and a carbon (C) source. Use of these types of precursor gases makes it possible to introduce C into a film to be formed at a high concentration, as will be described later. On the other hand, as will be described later, an HCDS gas (a chlorosilane-based precursor gas containing no C in gas molecules) and a BTBAS gas (an aminosilane-based precursor gas containing C but no Si—C bonding) are precursor gases serving as a Si source but no C source. Use of these types of precursor gases provides little chance of introducing C into a film to be formed, as will be described later.

As a precursor gas containing silicon (Si) and a halogen element, i.e., a halosilane-based precursor gas containing no C in gas molecules, a chlorosilane-based precursor gas containing Si and a chloro group as a halogen group but no C in gas molecules is supplied from the gas supply pipe 232e into the process chamber 201 through the MFC 241e, the valve 243e, the gas supply pipe 232a and the nozzle 249a. As described above, the chlorosilane-based precursor gas containing no C in gas molecules is a precursor gas serving as a Si source but no C source. An example of the chlorosilane-based precursor gas containing no C in gas molecules and supplied from the gas supply pipe 232e may include a hexachlorodisilane ($Si_2Cl_6$, abbreviation: HCDS) gas.

As used herein, the term "precursor gas" refers to a gaseous precursor, for example, a gas obtained by evaporating a precursor staying in a liquid state under room temperature and atmospheric pressure, or a precursor in a gas state under room temperature and atmospheric pressure. In the specification, the term "precursor" includes a "liquefied precursor", a "gaseous precursor", or both. Therefore, in the specification, the term "halosilane-based precursor (chlorosilane-based precursor)" includes a "liquefied halosilane-based precursor (chlorosilane-based precursor)", a "gaseous halosilane-based precursor gas (chlorosilane-based precursor gas)", or both. When a liquid precursor in a liquid state under normal temperature and pressure, such as BTCSM, BTCSE, TCDMDS, DCTMDS, MCPMDS or HCDS, is used, the liquid precursor is vaporized by a vaporization system, such as a vaporizer or a bubbler, and supplied as a precursor gas (such as BTCSM gas, BTCSE gas, TCDMDS gas, DCTMDS gas, MCPMDS gas, or HCDS gas).

An oxidizing gas, i.e., a gas containing oxygen (O) (oxygen-containing gas), is supplied from the gas supply pipe $232b$ into the process chamber 201 through the MFC $241b$, the valve $243b$, and the nozzle $249b$. The oxidizing gas supplied from the gas supply pipe $232b$ may include, for example, vapor ($H_2O$ gas) which may be generated by mixing an oxygen ($O_2$) gas and a hydrogen ($H_2$) gas supplied into an external combustion apparatus (not shown).

A nitrogen (N)-containing gas (nitrogen-based gas) having an electron lone pair, which serves as a catalyst gas having an acid dissociation constant (pKa) of 1 to 11, more specifically 5 to 11, or further more specifically 5 to 7, is supplied from the gas supply pipe $232c$ into the process chamber 201 via the MFC $241c$, the valve $243c$ and the nozzle $249c$. Here, the acid dissociation constant (pKa) is one of the indices indicating strength of acid quantitatively and represents an equilibrium constant (Ka) in a dissociation reaction by which hydrogen ions are released from an acid, by a negative common logarithm. The catalyst gas containing N having an electron lone pair acts to weaken an O—H bonding force of a surface of the wafer 200 or an oxidizing gas such as a $H_2O$ gas to promote precursor gas dissociation and an oxidation reaction by a $H_2O$ gas. An example of the nitrogen-based gas containing N having an electron lone pair may include an amine-based gas containing amine in which at least one of the hydrogen atoms in ammonia ($NH_3$) is substituted with an alkyl group such as a hydrocarbon group. An example of the catalyst gas supplied from the gas supply pipe $232c$ may include a pyridine ($C_5H_5N$) gas which is an amine-based gas.

As shown in FIG. 14, examples of various amines used as the catalyst gas may include aminopyridine ($C_5H_6N_2$, pKa=6.89), picoline ($C_6H_7N$, pKa=6.07), lutidine ($C_7H_9N$, pKa=6.96), pyrimidine ($C_4H_4N_2$, pKa=1.30), quinoline ($C_9H_7N$, pKa=4.97), piperazine ($C_4H_{10}N_2$, pKa=9.80), piperidine ($C_5H_{11}N$, pKa=11.12) and the like, in addition to the pyridine ($C_5H_5N$, pKa=5.67). The various amines shown in FIG. 14 may be cyclic amines having cyclic hydrocarbon groups. These cyclic amines may be also referred to as heterocyclic compounds having a cyclic structure formed by several kinds of elements such as C and N, i.e., nitrogen-containing heterocyclic compounds. These amine-based gases as the catalyst gases may be also referred to as amine-based catalyst gases.

As used herein, the term "amine-based gas" refers to a gaseous amine gas, for example, a gas obtained by evaporating amine staying in a liquid state under room temperature and atmospheric pressure, or amine in a gas state under room temperature and atmospheric pressure. In the specification, the term "amine" includes "liquefied amine", "gaseous amine", or both. When amine in a liquid state under normal temperature and pressure, such as pyridine, aminopyridine, picoline, lutidine, pyrimidine, quinoline, piperazine or piperidine, is used, the liquid amine is vaporized by a vaporization system, such as a vaporizer or a bubbler, and supplied as an amine-based gas (such as pyridine gas, aminopyridine gas, picoline gas, lutidine gas, pyrimidine gas, quinoline gas, piperazine gas or piperidine gas). In contrast, when amine in a gas state under normal temperature and pressure, such as trimethylamine (($CH_3$)$_3$N, abbreviation: TMA) to be described later, is used, the amine may be supplied as an amine-based gas without being vaporized by a vaporization system, such as a vaporizer or a bubbler.

A modifying gas containing at least one selected from the group consisting of carbon (C) and nitrogen (N), such as a carbon (C)-containing gas, is supplied from the gas supply pipe $232f$ into the process chamber 201 through the MFC $241f$, the valve $243f$, the gas supply pipe $232c$ and the nozzle $249c$. The C-containing gas may include a hydrocarbon-based gas. The hydrocarbon may be saturated hydrocarbon, unsaturated hydrocarbon, chained hydrocarbon or cyclic hydrocarbon. An example of the C-containing gas supplied from the gas supply pipe $232f$ may include a propylene ($C_3H_6$) gas which is a hydrocarbon-based gas containing a chained unsaturated hydrocarbon having one double-bond.

A modifying gas containing at least one selected from the group consisting of C and N, such as a nitrogen (N)-containing gas, is supplied from the gas supply pipe $232d$ into the process chamber 201 through the MFC $241d$, the valve $243d$, the nozzle $249d$ and the buffer chamber 237. The N-containing gas may include a non-amine-based gas. An example of the N-containing gas supplied from the gas supply pipe $232d$ may include a $NH_3$ gas which is a non-amine-based gas.

An inert gas such as a nitrogen ($N_2$) gas is supplied from the gas supply pipes $232g$ to $232j$ into the process chamber 201 through the respective MFCs $241g$ to $241j$, the respective valves $243g$ to $243j$, the respective gas supply pipes $232a$ to $232d$, the respective nozzles $249a$ to $249d$ and the buffer chamber 237. The $N_2$ gas serving as the inert gas acts as a purge gas. The $N_2$ gas supplied from the gas supply pipe $232j$ may act as an assist gas (ignition gas) that assists plasma ignition.

When the above-mentioned gases flow from the respective gas supply pipes as described above, a precursor gas supply system for supplying a precursor gas is mainly configured by the gas supply pipes $232a$ and $232e$, the MFCs $241a$ and $241e$ and the valves $243a$ and $243e$. It may be considered that the nozzle $249a$, the BTCSM gas source $242a$ and the HCDS gas source $242e$ are included in the precursor gas supply system. The precursor gas supply system may also be called a precursor supply system. The precursor gas supply system may be considered as a collection of multiple supply lines (supply systems) for supplying several kinds of precursor gases serving as different element sources and several kinds of precursor gases having different molecular structures. That is, the precursor gas supply system may be considered as a collection of a BTCSM gas supply line mainly configured by the gas supply pipe $232a$, the MFC $241a$ and the valve $243a$ and an HCDS gas supply line mainly configured by the gas supply pipe $232e$, the MFC $241e$ and the valve $243e$. It may be considered that the nozzle $249a$ and corresponding precursor gas sources $242a$ and $242e$ are included in each of the supply lines.

An oxidizing gas supply system is mainly configured by the gas supply pipe $232b$, the MFC $241b$ and the valve $243b$. It may be considered that the nozzle $249b$ and the $H_2O$ gas source $242b$ are included in the oxidizing gas supply system.

A catalyst gas supply system is mainly configured by the gas supply pipe $232c$, the MFC $241c$ and the valve $243c$. It may be considered that the nozzle $249c$ and the pyridine gas source $242c$ are included in the catalyst gas supply system. The catalyst gas supply system may also be called an amine-based catalyst gas supply system.

A modifying gas supply system for supplying a modifying gas containing at least one selected from the group consisting of C and N is mainly configured by the gas supply pipes $232d$ and $232f$, the MFCs $241d$ and $241f$ and the valves $243d$ and $243f$. It may be considered that the nozzle $249d$, the buffer chamber 237, the $NH_3$ gas source $242d$ and the $C_3H_6$ gas source 242f are included in the modifying gas supply system. The modifying gas supply system may be considered as a collection of multiple supply lines (supply systems) for supplying several kinds of modifying gases serving as different element sources and several kinds of modifying gases having different molecular structures. That is, the modifying gas supply system may be considered as a collection of a $NH_3$ gas supply line mainly configured by the gas supply pipe 232d, the MFC 241d and the valve 243d and a $C_3H_6$ gas supply line mainly configured by the gas supply pipe 232f, the MFC 241f and the valve 243f. It may be considered that the corresponding nozzles 249d and 249c, the corresponding modifying gas sources 242d and 242f and the buffer chamber 237 are included in each of the supply lines.

An inert gas supply system is mainly configured by the gas supply pipes 232g to 232j, the MFCs 241g to 241j and the valves 243g to 243j. It may be considered that the downstream side of the gas supply pipes 232a to 232d from the connection site with the gas supply pipes 232g to 232j, the nozzles 249a to 249d, the buffer chamber 237 and the $N_2$ gas sources 242g to 242j are included in the inert gas supply system. The inert gas supply system also acts as a purge gas supply system. The gas supply pipe 232j for supplying a $N_2$ gas as an assist gas, the MFC 241j and the valve 243j may also be called an assist gas supply system. It may be considered that the nozzle 249d, the buffer chamber 237 and the $N_2$ gas source 242j are included in the assist gas supply system.

In addition, for supply systems other than the precursor gas supply system and the modifying gas supply system, such as the oxidizing gas supply system and the catalyst gas supply system, multiple supply lines (supply systems) for supplying several kinds of gases having different molecular structures may be provided.

In the buffer chamber 237, as illustrated in FIG. 2, two elongated conductive rod-shaped electrodes 269 and 270 are disposed to extend from the lower portion to the upper portion of the reaction tube 203 in the stacking direction of the wafers 200. Each of the rod-shaped electrodes 269 and 270 is disposed in parallel to the nozzle 249d. Each of the rod-shaped electrodes 269 and 270 is covered with an electrode protection tube 275 for protecting each electrode from an upper portion to a lower portion thereof. One of the rod-shaped electrodes 269 and 270 is connected to a high-frequency power source 273 through a matcher 272, and the other is connected to a ground corresponding to a reference electric potential. By applying high-frequency power from the high-frequency power source 273 between the rod-shaped electrodes 269 and 270 through the matcher 272, plasma is generated in a plasma generation region 224 between the rod-shaped electrodes 269 and 270. A plasma generator (plasma generating unit) serving as a plasma source is mainly configured by the rod-shaped electrodes 269 and 270 and the electrode protection tubes 275. The matcher 272 and the high-frequency power source 273 may also be included in the plasma source. Also, the plasma source functions as an activating mechanism (exciting unit) that activates (excites) a gas into a plasma state.

The electrode protection tubes 275 have a structure allowing the respective rod-shaped electrodes 269 and 270 to be inserted into the buffer chamber 237 in a state where each of the rod-shaped electrodes 269 and 270 is isolated from an internal atmosphere of the buffer chamber 237. Here, when an internal oxygen concentration of the electrode protection tube 275 is approximately equal to an oxygen concentration in an ambient air (atmosphere), each of the rod-shaped electrodes 269 and 270 inserted into the electrode protection tubes 275 is oxidized by the heat generated by the heater 207. Therefore, by filling the inside of the electrode protection tube 275 with an inert gas such as a nitrogen gas, or by purging the inside of the electrode protection tube 275 with an inert gas such as a nitrogen gas using an inert gas purging mechanism, the internal oxygen concentration of the electrode protection tube 275 decreases, thereby preventing oxidation of the rod-shaped electrodes 269 and 270.

The exhaust pipe 231 for exhausting an internal atmosphere of the process chamber 201 is installed at the reaction tube 203. A vacuum exhaust device, for example, a vacuum pump 246, is connected to the exhaust pipe 231 through a pressure sensor 245, which is a pressure detector (pressure detecting part) for detecting an internal pressure of the process chamber 201, and an auto pressure controller (APC) valve 244, which is a pressure adjuster (pressure adjusting part). The APC valve 244 is configured to perform/stop vacuum exhaust in the process chamber 201 by opening/closing a valve with the vacuum pump 246 actuated, and further to adjust the internal pressure of the process chamber 201 by adjusting a degree of the valve opening with the vacuum pump 246 actuated, based on the pressure information detected by the pressure sensor 245. An exhaust system is mainly configured by the exhaust pipe 231, the APC valve 244 and the pressure sensor 245. Also, the vacuum pump 246 may be included in the exhaust system. The exhaust pipe 231 is not limited to being installed in the reaction tube 203 but may be installed in the manifold 209, like the nozzles 249a to 249d.

A seal cap 219, which functions as a furnace port cover configured to hermetically seal a lower end opening of the manifold 209, is installed under the reaction tube 203. The seal cap 219 is configured to contact the lower end of the manifold 209 from below in the vertical direction. The seal cap 219 is made of metal such as stainless steel and has a disc shape. An O-ring 220, which is a seal member in contact with the lower end portion of the reaction tube 203, is installed at an upper surface of the seal cap 219. A rotary mechanism 267 configured to rotate the boat 217 to be described later is installed below the seal cap 219. A rotary shaft 255 of the rotary mechanism 267 passes through the seal cap 219 to be connected to the boat 217. The rotary mechanism 267 is configured to rotate the wafers 200 by rotating the boat 217.

The seal cap 219 is configured to be vertically elevated by a boat elevator 115, which is an elevation mechanism vertically disposed outside of the reaction tube 203. The boat elevator 115 is configured to enable the boat 217 to be loaded into or unloaded from the process chamber 201 by elevating the seal cap 219. That is, the boat elevator 115 is configured as a transfer device (transfer mechanism) that transfers the boat 217, i.e., the wafers 200, into and out of the process chamber 201.

The boat 217, which is used as a substrate support, is made of a heat resistant material such as quartz or silicon carbide and is configured to support the wafers 200 horizontally stacked in multiple stages with the centers of the wafers 200 concentrically aligned. In addition, a heat insulating plate 218 formed of a heat resistant material such as quartz or silicon carbide is installed at a lower portion of the boat 217 and configured such that heat from the heater 207 cannot be transferred to the seal cap 219. Instead of the heat insulating plate 218, a tube-like heat insulating member made of a heat resistant material such as quartz or silicon carbide may be installed at the lower portion of the boat 217.

A temperature sensor 263, which is a temperature detector, is installed in the reaction tube 203. Based on temperature information detected by the temperature sensor 263, an electric conduction state to the heater 207 is adjusted such that the interior of the process chamber 201 has a desired temperature distribution. The temperature sensor 263 is configured in an L-shape similar to the nozzles 249a to 249d and installed along the inner wall of the reaction tube 203.

Figure 3:
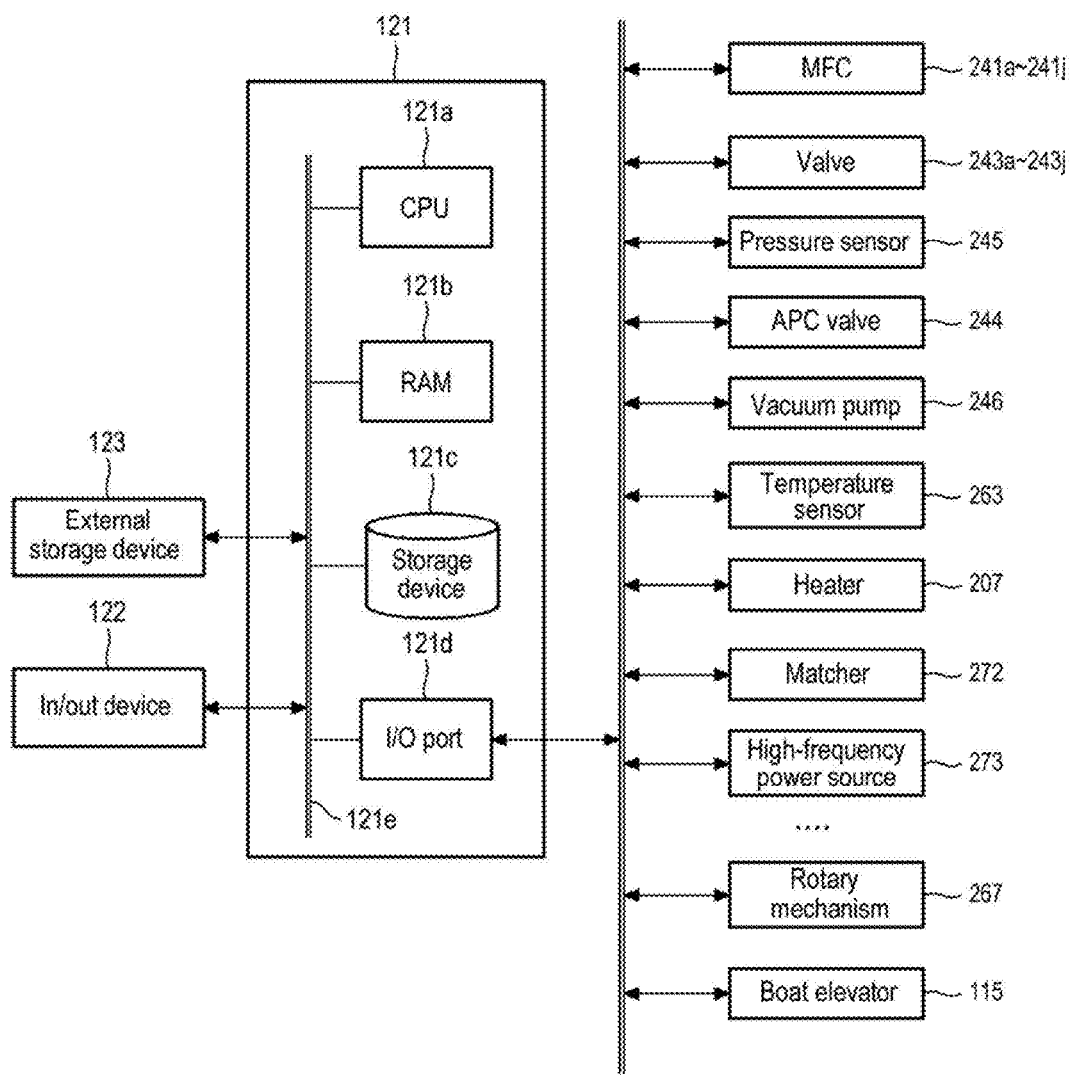
FIG. 3 is a schematic view illustrating a configuration of a controller of the substrate processing apparatus, in which a control system of the controller is shown in a block diagram, according to the first embodiment.

As illustrated in FIG. 3, a controller 121, which is a control unit (control means), is configured as a computer including a central processing unit (CPU) 121a, a random access memory (RAM) 121b, a memory device 121c and an I/O port 121d. The RAM 121b, the memory device 121c and the I/O port 121d are configured to exchange data with the CPU 121a via an internal bus 121e. An input/output device 122 including, for example, a touch panel or the like, is connected to the controller 121.

The memory device 121c is configured by, for example, a flash memory, a hard disc drive (HDD) or the like. A control program for controlling operation of the substrate processing apparatus or a process recipe, in which a sequence or condition for processing a substrate described later is written, is readably stored in the memory device 121c. Also, the process recipe functions as a program for the controller 121 to execute each sequence in the substrate processing process, which will be described later, to obtain a predetermined result. Hereinafter, the process recipe or control program may be generally referred to as "a program." Also, when the term "program" is used herein, it may include the case in which only the process recipe is included, the case in which only the control program is included, or the case in which both of the process recipe and the control program are included. In addition, the RAM 121b is configured as a memory area (work area) in which a program or data read by the CPU 121a is temporarily stored.

The I/O port 121d is connected to the MFCs 241a to 241j, the valves 243a to 243j, the pressure sensor 245, the APC valve 244, the vacuum pump 246, the temperature sensor 263, the heater 207, the matcher 272, the high-frequency power source 273, the rotary mechanism 267, the boat elevator 115 and the like.

The CPU 121a is configured to read and execute the control program from the memory device 121c. According to an input of an operation command from the input/output device 122, the CPU 121a reads the process recipe from the memory device 121c. In addition, the CPU 121a is configured to control the flow rate controlling operation of various types of gases by the MFCs 241a to 241j, the opening/closing operation of the valves 243a to 243j, the opening/closing operation of the APC valve 244 and the pressure adjusting operation by the APC valve 244 based on the pressure sensor 245, the operation of starting and stopping the vacuum pump 246, the temperature adjusting operation of the heater 207 based on the temperature sensor 263, the rotation and rotation speed adjusting operation of the boat 217 by the rotary mechanism 267, the elevation operation of the boat 217 by the boat elevator 115, the impedance adjusting operation of the matcher 272, the operation of supplying power by the high-frequency power source 273 and the like according to contents of the read process recipe.

Moreover, the controller 121 is not limited to being configured as a dedicated computer but may be configured as a general-purpose computer. For example, the controller 121 according to the embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, a means for supplying a program to a computer is not limited to the case in which the program is supplied through the external memory device 123. For example, the program may be supplied using a communication means such as the Internet or a dedicated line, rather than through the external memory device 123. Also, the memory device 121c or the external memory device 123 is configured as a non-transitory computer-readable recording medium. Hereinafter, these means for supplying the program will be simply referred to as "a recording medium." In addition, when the term "recording medium" is used herein, it may include a case in which only the memory device 121c is included, a case in which only the external memory device 123 is included, or a case in which both the memory device 121c and the external memory device 123 are included.

(2) Thin Film Forming Process

Next, an example of a sequence of forming a thin film on a substrate, which is one of the processes of manufacturing a semiconductor device by using the processing furnace 202 of the above-described substrate processing apparatus, will be described. In addition, in the following description, operations of the respective parts constituting the substrate processing apparatus are controlled by the controller 121.

In a film forming sequence of the embodiment,
a thin film containing silicon (Si), oxygen (O) and carbon (C) or a thin film containing silicon (Si), oxygen (O), carbon (C) and nitrogen (N) is formed on a wafer 200 as a substrate by performing a cycle a predetermined number of times, the cycle including:

supplying a precursor gas serving as a silicon (Si) source and a carbon (C) source or a precursor gas serving as a silicon source but no carbon source, and a first catalyst gas to the wafer 200;

supplying an oxidizing gas and a second catalyst gas to the wafer 200; and supplying a modifying gas containing at least one selected from the group consisting of carbon (C) and nitrogen (N) to the wafer 200.

Here, the cycle includes "the act of supplying the precursor gas and the catalyst gas", "the act of supplying the oxidizing gas and the catalyst gas" and "the act of supplying the modifying gas" and each act is included in one cycle one or more times. In one cycle, each act may be performed once or at least one of the acts may be performed several times. In one cycle, each act may be performed a same or different number of times. An order of performance of the acts in the cycle may be determined at random. In this manner, by appropriately changing the number of times, order and combination of the acts, thin films having different film qualities, film compositions and component ratios can be formed. In addition, the phrase "performing the cycle a predetermined number of times" means performing the cycle one or more times, i.e., performing the cycle once or repeating the cycle several times.

For example, in this embodiment, one cycle includes: forming a first thin film containing at least Si and O on the wafer 200 by performing a set a predetermined number of times, the set including: supplying a precursor gas and a catalyst gas to the wafer 200; and supplying an oxidizing gas and the catalyst gas to the wafer 200; and modifying the first thin film into a second thin film further containing C, a second thin film containing C and further containing N, or a second thin film further containing C and N by supplying a modifying gas to the wafer 200.

In addition, in the embodiment, each act may be performed under a non-plasma atmosphere.

Moreover, in the embodiment, in order to form a composition ratio of a thin film to be formed as a stoichiometric composition or another predetermined composition ratio different from the stoichiometric composition, supply conditions of a plurality of types of gases containing a plurality of elements constituting the film to be formed are controlled. For example, the supply conditions are controlled such that at least one element of a plurality of elements constituting the thin film to be formed stoichiometrically exceeds another element. Hereinafter, an example of a sequence of forming a film while controlling a ratio of the plurality of elements constituting the thin film to be formed, i.e., a composition ratio of the film, will be described.

Hereinafter, a film forming sequence of the embodiment will be described with reference to FIGS. 4 and 5A.

An example will be described in which a cycle is performed a predetermined number of times, for example, once, the cycle including: forming a silicon oxycarbide (SiOC) film as a first film containing Si, O and C on the wafer 200 by performing a set a predetermined number of (n) times, the set including: supplying a BTCSM gas containing silicon (Si), carbon (C) and a halogen element and having a Si—C bonding, as a precursor gas serving as a silicon (Si) source and a carbon (C) source, and a pyridine gas as a first catalyst gas, to the wafer 200 (Step 1a); and supplying a $H_2O$ gas as an oxidizing gas and the pyridine gas as a second catalyst gas to the wafer 200 (Step 2a); and modifying the SiOC film into a silicon oxycarbonitride (SiOCN) film as a second thin film containing C and further containing N.

According to this film forming sequence, the SiOCN film as a thin film containing Si, O, C and N, i.e., a SiOC film doped (added) with N, is formed on the wafer 200. In addition, this SiOCN film may be referred to as a silicon oxynitride (SiON) film doped (added) with C or a silicon oxide ($SiO_2$) film (hereinafter sometimes referred to as a SiO film) doped (added) with C and N.

In the specification, the term "wafer" is intended to include the "wafer itself" and "a laminated body (aggregated body) of a wafer and layers or films formed thereon (i.e., a wafer including layers or films formed on a surface of the wafer)". As used herein, the term "wafer surface" is intended to include "wafer surface itself" and "surface of a layer or film formed on an outermost surface of a wafer as a laminated body".

In the specification, the phrase "supplying a predetermined gas to a wafer" is intended to include "directly supplying a predetermined gas to a (exposed) surface of the wafer itself" and "supplying a predetermined gas to a layer or film formed on an outermost surface of a wafer of a laminated body". In the specification, the phrase "forming a layer (or film) on a wafer" is intended to include "directly forming a layer (or film) on a (exposed) surface of the wafer itself" and "forming a layer (or film) on a layer or film formed on an outermost surface of a wafer as a laminated body".

In the specification, the term "substrate" as used herein may be synonymous with the term "wafer," in which case the terms "wafer" and "substrate" may be used interchangeably in the above description.

(Wafer Charge and Boat Load)

When the plurality of wafers 200 are charged on the boat 217 (wafer charging), as illustrated in FIG. 1, the boat 217 supporting the plurality of wafers 200 is raised by the boat elevator 115 to be loaded into the process chamber 201 (boat loading). In this state, the seal cap 219 seals the lower end of the reaction tube 203 via the O-ring 220.

(Pressure Adjustment and Temperature Adjustment)

The interior of the process chamber 201 is vacuum exhausted by the vacuum pump 246 to a desired pressure (vacuum level). Here, the internal pressure of the process chamber 201 is measured by the pressure sensor 245, and the APC valve 244 is feedback-controlled based on the measured pressure information (pressure adjustment). Also, the vacuum pump 246 maintains a regular operation state at least until processing of the wafers 200 is terminated. Further, the process chamber 201 is heated by the heater 207 such that the wafers 200 reach a desired temperature. Here, an electrical conduction state to the heater 207 is feedback-controlled based on the temperature information detected by the temperature sensor 263 until the interior of the process chamber 201 reaches a desired temperature distribution (temperature adjustment). In addition, heating of the interior of the process chamber 201 by the heater 207 is continuously performed at least until processing of the wafers 200 is terminated. However, as will be described later, if the processing of the wafers 200 is performed at room temperature, heating of the interior of the process chamber 201 by the heater 207 may not be performed. Next, the boat 217 and wafers 200 begin to be rotated by the rotary mechanism 267 (wafer rotation). Furthermore, the rotation of the boat 217 and wafers 200 by the rotary mechanism 267 is continuously performed at least until processing of the wafers 200 is terminated.

(Process of Forming SiOC Film)

Thereafter, the following two steps (Steps 1a and 2a) are sequentially performed.

[Step 1a]

(Supply of BTCSM Gas and Pyridine Gas)

The valve 243a is opened to flow a BTCSM gas into the gas supply pipe 232a. A flow rate of the BTCSM is regulated by the MFC 241a. The BTCSM gas with its flow rate regulated is supplied from the gas supply holes 250a into the process chamber 201 and is exhausted from the exhaust pipe 231. At this time, the BTCSM gas is supplied to the wafers 200 (BTCSM gas supply). At the same time, the valve 243g is opened to flow an inert gas such as a $N_2$ gas into the gas supply pipe 232g. A flow rate of the $N_2$ gas is regulated by the MFC 241g. The $N_2$ gas with its flow rate regulated is supplied into the process chamber 201, along with the BTCSM gas, and is exhausted from the exhaust pipe 231.

At this time, the valve 243c is opened to flow a pyridine gas into the gas supply pipe 232c. A flow rate of the pyridine gas is regulated by the MFC 241c. The pyridine gas with its flow rate regulated is supplied from the gas supply holes 250c into the process chamber 201 and is exhausted from the exhaust pipe 231. At this time, the pyridine gas is supplied to the wafers 200 (pyridine gas supply). At the same time, the valve 243i is opened to flow an inert gas such as a $N_2$ gas into the gas supply pipe 232i. A flow rate of the $N_2$ gas is regulated by the MFC 241i. The $N_2$ gas with its flow rate regulated is supplied into the process chamber 201, along with the pyridine gas, and is exhausted from the exhaust pipe 231.

At this time, in order to prevent the BTCSM gas and the pyridine gas from being introduced into the nozzles 249b and 249d, the valves 243h and 243j are opened to flow the $N_2$ gas into the gas supply pipes 232h and 232j. The $N_2$ gas is supplied into the process chamber 201 via the gas supply pipes 232b and 232d, the nozzles 249b and 249d and the buffer chamber 237 and is exhausted from the exhaust pipe 231.

At this time, the APC valve 244 is appropriately regulated to set the internal pressure of the process chamber 201 to fall within a range of, for example, 1 to 13300 Pa, more specifically 133 to 2666 Pa. The flow rate of BTCSM gas controlled by the MFC 241a is set to fall within a range of, for example, 1 to 2000 sccm, more specifically 10 to 1000 sccm. The flow rate of pyridine gas controlled by the MFC 241c is set to fall within a range of, for example, 1 to 2000 sccm, more specifically 10 to 1000 sccm. The flow rates of $N_2$ gases controlled by the MFCs 241g to 241j are set to fall within a range of, for example, 100 to 10000 sccm. The time period during which the BTCSM gas and the pyridine gas are supplied to the wafers 200, that is, gas supply time (irradiation time), is set to fall within a range of, for example, 1 to 100 seconds, more specifically 5 to 60 seconds.

At this time, the heater 207 is set to a temperature such that the temperature of the wafer 200 is set to fall within a range of, for example, from room temperature to 150 degrees C., more specifically from room temperature to 100 degrees C., or further more specifically 50 to 100 degrees C. If no catalyst gas is used, when the temperature of the wafer 200 is less than 250 degrees C., it is hard to chemisorb BTCSM on the wafer 200, which may result in difficulty in obtaining a practical film forming rate. As in this embodiment, the use of the pyridine gas as a catalyst gas can eliminate this difficulty even when the temperature of the wafer 200 is less than 250 degrees C. Under the existence of the pyridine gas, when the temperature of the wafer 200 is equal to or less than 150 degrees C., more specifically equal to or less than 100 degrees C., the amount of heat applied to the wafers 200 can be reduced, thereby providing good control of a thermal history undergone by the wafers 200. In addition, under the existence of the pyridine gas, when the temperature of the wafer 200 is equal to or more than room temperature, BTCSM can be sufficiently adsorbed on the wafers 200 to obtain a sufficient film forming rate. Accordingly, the temperature of the wafer 200 may be set within a range from room temperature to 150 degrees C., more specifically from room temperature to 100 degrees C., or further more specifically 50 to 100 degrees C.

Under the above conditions, when the BTCSM gas is supplied to the wafers 200, a silicon (Si)-containing layer containing C and Cl and having a thickness of, for example, less than one atomic layer to several atomic layers is formed as a first layer on a surface (base layer) of the wafer 200. The Si-containing layer containing C and Cl may be a silicon (Si) layer containing C and Cl, a BTCSM gas adsorption layer, or both.

In this example, the Si layer containing C and Cl generally refers to a continuous or discontinuous layer made of Si and containing C and Cl, or a silicon (Si) thin film containing C and Cl and formed by laminating these continuous and discontinuous layers. The continuous layer made of Si and containing C and Cl may be sometimes referred to as a Si thin film containing C and Cl. In addition, Si constituting the Si layer containing C and Cl includes Si whose bonding to C or Cl is completely broken as well as Si whose bonding to C or Cl is not completely broken.

The BTCSM gas adsorption layer includes a continuous adsorption layer and a discontinuous adsorption layer of the BTCSM gas molecules. That is, the BTCSM gas adsorption layer includes an adsorption layer having a thickness of one molecular layer or less constituted by BTCSM molecules.

The BTCSM $((SiCl_3)_2CH_2)$ molecules constituting the BTCSM gas adsorption layer include not only those shown in the chemical structural formula of FIG. 15A but also those in which Si is partially decoupled from C and those in which Si is partially decoupled from Cl. That is, the BTCSM gas adsorptive layer includes a BTCSM molecular chemical adsorption layer and a BTCSM molecular physical adsorption layer.

As used herein, the phrase "layer having a thickness of less than one atomic layer" means an atomic layer discontinuously formed and the phrase "layer having a thickness of one atomic layer" means an atomic layer continuously formed. Similarly, the phrase "layer having a thickness of less than one molecular layer" means a molecular layer discontinuously formed and the phrase "layer having a thickness of one molecular layer" means a molecular layer continuously formed. Although the Si-containing layer containing C and Cl may include both the Si layer containing C and Cl and the BTCSM gas adsorption layer, representations such as "one atomic layer", "several atomic layers" and the like are used for the Si-containing layer containing C and Cl, as described above.

If the thickness of the Si-containing layer containing C and Cl as the first layer formed on the wafer 200 exceeds several atomic layers, oxidization reaction in Step 2a, which will be described later, may not be applied to the entire first layer. The minimum thickness of the first layer which can be formed on the wafer 200 is less than one atomic layer. Accordingly, the thickness of the first layer may be set to fall within a range of less than one atomic layer to several atomic layers. When the thickness of the first layer is not more than one atomic layer, i.e., one atomic layer or less, the oxidization reaction in Step 2a, which will be described later, can be relatively expedited and the time required for the oxidization reaction in Step 2a can be shortened. The time required for the formation of the first layer in Step 1a can be also shortened. As a result, processing time per one set and hence total processing time can be shortened. In other words, a film formation rate can be increased. In addition, when the thickness of the first layer is not more than one atomic layer, controllability for uniform film thickness can be improved.

Under the condition where the BTCSM gas is autolyzed (pyrolyzed), that is, under the condition where a pyrolytic reaction of the BTCSM gas occurs, Si is deposited on the wafer 200, thereby forming the Si layer containing C and Cl. Under the condition where the BTCSM gas is not autolyzed (pyrolyzed), that is, under the condition where no pyrolytic reaction of the BTCSM gas occurs, the BTCSM gas is adsorbed on the wafer 200, thereby forming the BTCSM gas adsorption layer. Forming the Si layer containing C and Cl on the wafer 200 can advantageously provide a higher film formation rate than forming the BTCSM gas adsorption layer on the wafer 200. However, in this embodiment, since the temperature of the wafer 200 is set to, for example, 150 degrees C. or less, forming the BTCSM gas adsorption layer on the wafer 200 may have a possibility of providing a higher film formation rate than forming the Si layer containing C and Cl on the wafer 200. In addition, if no catalyst gas is supplied, weaker physical adsorption becomes more dominant than strong chemical adsorption in bonding of BTCSM molecules to a base layer such as a surface of the wafer 200 or bonding between BTCSM molecules in the BTCSM gas adsorption layer. That is, if no catalyst gas is supplied, the BTCSM gas adsorption layer is likely to be mostly formed of a physical adsorption layer of the BTCSM gas.

Figure 13A:
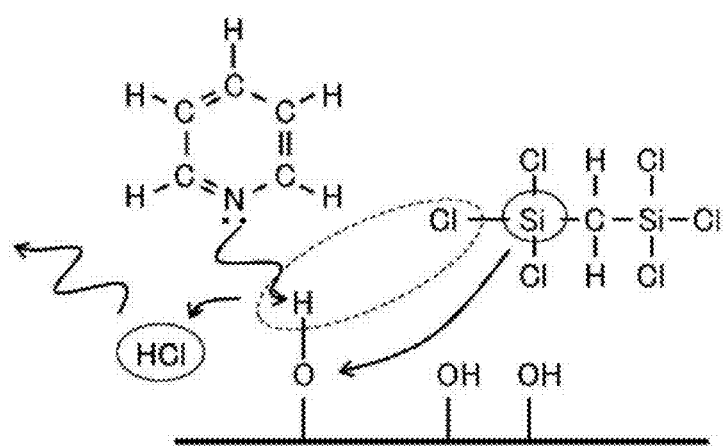

Here, the pyridine gas serving as the catalyst gas weakens an O—H bonding force of the surface of the wafer 200 to accelerate dissociation of the BTCSM gas and formation of the first layer by chemical adsorption of BTCSM molecules. That is, as shown in FIG. 13A, for example, the pyridine gas serving as the catalyst gas acts on the O—H bond existing on the surface of the wafer 200 to weaken the O—H bonding force. When hydrogen (H) with the weakened bonding force reacts with Cl of the BTCSM gas, a hydrogen chloride (HCl) gas is generated and desorbed and BTCSM molecules (halide) without Cl are chemisorbed on the surface of the wafer 200. That is, a chemical adsorption layer of the BTCSM gas is formed on the surface of the wafer 200. The reason why the pyridine gas weakens the O—H bonding force is that an N atom having an electron lone pair in pyridine molecules has an action to attract H. The acid dissociation constant (pKa) may be an indicator for the size of the action that a certain compound containing N atoms or the like attracts H.

As described above, pKa is a constant representing an equilibrium constant (Ka) in a dissociation reaction by which hydrogen ions are released from an acid, by a negative common logarithm. A compound having a larger pKa has a stronger force to attract H.

For example, when a compound having pKa of 5 or more is used as a catalyst gas, decomposition of the BTCSM gas is urged to accelerate the formation of the first layer. On the other hand, if the pKa of the catalyst gas is too large, Cl drawn out of BTCSM molecules is combined with the catalyst gas and accordingly a salt (ion compound) such as ammonium chloride ($NH_4Cl$) produced by such combination may act as a particle source. In order to prevent this, the pKa of the catalyst gas may be set to be not more than 11, more specifically, not more than 7. The pyridine gas having a relatively large pKa of about 5.67 has a strong force to attract H. Also, since the kPa of the pyridine gas is not more than 7, particles are rarely produced.

As described above, by supplying the pyridine gas as the catalyst gas along with the BTCSM gas, even under the condition of low temperature of, for example, 150 degrees C. or less, the first layer can be formed by accelerating the decomposition of the BTCSM gas such that the BTCSM gas chemical adsorption layer is dominantly formed rather than the BTCSM gas physical adsorption layer.

In addition, as described above, by using the BTCSM gas as the precursor gas containing Si, C and a halogen element and having a Si—C bonding, even under the condition of relatively low temperature of, for example, 150 degrees C. or less, C can be introduced into the first layer. The first layer containing C can be oxidized in Step 2a to be subsequently performed, thereby forming a silicon oxycarbide (SiOC) layer containing C at a high concentration or a SiOC film including a stack of the SiOC layers and containing C at a high concentration. In addition, the C concentration in the SiOC layer or the SiOC film can be controlled with high precision.

(Residual Gas Removal)

After the Si-containing layer containing C and Cl is formed as the first layer on the wafer 200, the valve 243a is closed to stop the supply of the BTCSM gas. In addition, the valve 243c is closed to stop the supply of the pyridine gas. At this time, with the APC valve 244 of the exhaust pipe 231 opened, the interior of the process chamber 201 is vacuum-exhausted by the vacuum pump 246 and the BTCSM gas and the pyridine gas in the process chamber 201 which do not react or remain after contributing to the formation of the first layer is excluded from the process chamber 201 (residual gas removal). At this time, with the valves 243g to 243j opened, the supply of the $N_2$ gas, as an inert gas, into the process chamber 201 is maintained. The $N_2$ gas acts as a purge gas, and thus, the BTCSM gas and the pyridine gas in the process chamber 201 which do not react or remain after contributing to the formation of the Si-containing layer containing C and Cl can be effectively removed from the process chamber 201.

The residual gas in the process chamber 201 may not be completely excluded and the interior of the process chamber 201 may not be completely purged. If an amount of the residual gas in the process chamber 201 is very small, this has no adverse effect on the subsequent Step 2a. In this case, there is no need to provide a high flow rate of $N_2$ gas supplied into the process chamber 201. For example, approximately the same volume of the $N_2$ gas as the reaction tube 203 (the process chamber 201) may be supplied into the process chamber 201 to purge the interior of the process chamber 201 such that there is no adverse effect generated in Step 2a. In this way, when the interior of the process chamber 201 is not completely purged, purge time can be shortened, thereby improving throughput. This can also limit consumption of the $N_2$ gas to a minimal necessity.

Examples of the precursor gas containing Si, C and a halogen element and having a Si—C bonding may include a BTCSE gas, a TCDMDS gas, a DCTMDS gas, a MCP-MDS gas and the like, in addition to the BTCSM gas. Examples of the catalyst gas may include an aminopyridine gas, a picoline gas, a lutidine gas, a pyrimidine gas, a quinoline gas, a piperazine gas, a piperidine gas and the like, in addition to the pyridine gas. Examples of the inert gas may include rare gases such as an Ar gas, a He gas, a Ne gas, a Xe gas and the like, in addition to the $N_2$ gas.

[Step 2a]

(Supply of $H_2O$ Gas and Pyridine Gas)

After Step 1a is completed and the residual gas is removed from the process chamber 201, the valve 243b is opened to allow $H_2O$ gas to flow into the gas supply pipe 232b. A flow rate of the $H_2O$ gas is regulated by the MFC 241b. The $H_2O$ gas with its flow rate regulated is supplied from the gas supply holes 250b into the process chamber 201 and is exhausted from the exhaust pipe 231. At this time, the $H_2O$ gas is supplied to the wafer 200 under a non-plasma atmosphere ($H_2O$ gas supply). At the same time, the valve 243h is opened to allow $N_2$ gas as an inert gas to flow into the gas supply pipe 232h. A flow rate of the $N_2$ gas is regulated by the MFC 241h. The $N_2$ gas with its flow rate regulated is supplied into the process chamber 201, along with the $H_2O$ gas, and is exhausted from the exhaust pipe 231.

In addition, like the supply of the pyridine gas in Step 1a, the pyridine gas is supplied to the wafer 200 (pyridine gas supply).

At this time, in order to prevent the $H_2O$ gas and the pyridine gas from being introduced into the nozzles 249a and 249d and the buffer chamber 237, the valves 243g and 243j are opened to allow the $N_2$ gas to flow into the gas supply pipes 232g and 232j. The $N_2$ gas is supplied into the process chamber 201 through the gas supply pipes 232a and 232d, the nozzles 249a and 249d and the buffer chamber 237 and is exhausted from the exhaust pipe 231.

At this time, the APC valve 244 is appropriately regulated to set the internal pressure of the process chamber 201 to fall within a range of, for example, 1 to 13300 Pa, more specifically 133 to 2666 Pa. The flow rate of $H_2O$ gas controlled by the MFC 241b is set to fall within a range of, for example, 1000 to 10000 sccm, more specifically 10 to 1000 sccm. The flow rate of pyridine gas controlled by the MFC 241c is set to fall within a range of, for example, 1 to 2000, more specifically 10 to 1000. The flow rates of $N_2$ gases controlled by the MFCs 241g to 241j are set to fall within a range of, for example, 100 to 10000 sccm. The time period during which the $H_2O$ gas and the pyridine gas are supplied to the wafer 200, that is, gas supply time (irradiation time), is set to fall within a range of, for example, 1 to 100 seconds, more specifically 5 to 60 seconds. The heater 207 is set to a temperature such that the temperature of the wafer 200 is set to fall within the same temperature range as the wafer 200 in Step 1a, i.e., a range of, for example, from room temperature to 150 degrees C., more specifically from room temperature to 100 degrees C., or further more specifically 50 to 100 degrees C.

The $H_2O$ gas supplied into the process chamber 201 is activated by heat and is exhausted from the exhaust pipe 231. At this time, the thermally-activated $H_2O$ gas is supplied to the wafer 200. That is, the gas flowing into the process chamber 201 is the thermally-activated $H_2O$ gas rather than the HCDS gas. Therefore, the thermally-activated $H_2O$ gas is supplied to the wafer 200 without causing any gaseous reaction and reacts with at least a portion of the first layer (the Si-containing layer containing C and Cl) formed on the wafer 200 in Step 1a. This allows the first layer to be thermally oxidized with non-plasma so as to be changed into a second layer containing Si, O and C, that is, a SiOC layer.

Figure 13B:
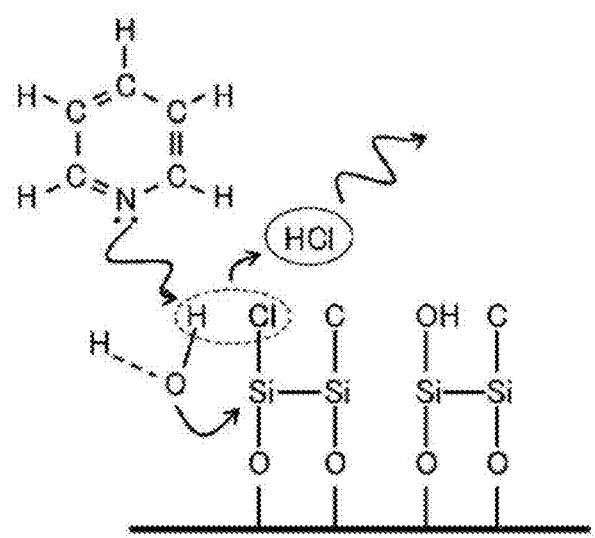

Here, the pyridine gas as the catalyst gas weakens an O—H bonding force of the $H_2O$ gas to accelerate dissociation of the $H_2O$ gas and reaction between the $H_2O$ gas and the first layer. That is, as shown in FIG. 13B, the pyridine gas as the catalyst gas acts on an O—H bonding of the $H_2O$ gas to weaken an O—H bonding force. When H with the weakened bonding force reacts with Cl contained in the first layer formed on the wafer 200, a hydrogen chloride (HCl) gas is generated and desorbed, and O in the $H_2O$ gas, which lost H, is combined with Si in the first layer from which Cl is desorbed with at least a portion of C left therein.

In addition, in the process of supplying the $H_2O$ gas and the pyridine gas, a supply amount of the pyridine gas may be appropriately regulated depending on a desired film composition and so on. If the supply amount of the pyridine gas is increased, an effect of the pyridine gas is increased to improve an oxidizing power of the $H_2O$ gas and the Si—C bonding is easily broken to desorb C, which results in a decrease of the C concentration in the SiOC layer. If the supply amount of the pyridine gas is decreased, an effect of the pyridine gas is weakened to lower the oxidizing power of the $H_2O$ gas and the Si—C bonding is easily maintained, which results in an increase of the C concentration in the SiOC layer. Accordingly, by appropriately adjusting the supply amount of the pyridine gas, it is possible to change the C concentration, silicon (Si) concentration and oxygen (O) concentration in the SiOC layer and the SiOC film formed of a stack of the SiOC layers in a relative manner.

In addition, a supply amount of the catalyst gas supplied in the process of supplying the oxidizing gas and the catalyst gas may be adjusted independently of the supply amount of the catalyst gas supplied in the process of supplying the precursor gas and the catalyst gas. That is, the supply amounts of catalyst gases in both processes may be adjusted to be equal to or different from each other.

In addition, a plurality of process recipes (programs in which process orders and process conditions are described) which sets the supply amount or flow rate of the catalyst gas to different numerical values may be prepared.

In addition, under the condition of low temperature of, for example, 150 degrees C. or less, the SiOC layer is likely to contain a relatively large amount of water ($H_2O$). Therefore, the SiOC film formed of a stack of the SiOC layers may contain a large amount of water. The water contained in the SiOC layer and the SiOC film is derived from, for example, the $H_2O$ gas used as the oxidizing gas.

(Residual Gas Removal)

After Step 2a, the valve 243b is closed to stop the supply of the $H_2O$ gas. In addition, the valve 243c is closed to stop the supply of the pyridine gas. At this time, with the APC valve 244 of the exhaust pipe 231 opened, the interior of the process chamber 201 is vacuum-exhausted by the vacuum pump 246 and the $H_2O$ gas and the pyridine gas in the process chamber 201 which do not react or remain after contributing to the reaction, or reaction products are excluded from the process chamber 201 (residual gas removal). At this time, with the valves 243g to 243j opened, the supply of the $N_2$ gas, as an inert gas, into the process chamber 201 is maintained. The $N_2$ gas acts as a purge gas which is capable of further improving the effect of excluding the $H_2O$ gas and the pyridine gas in the process chamber 201 which do not react or remain after contributing to the formation of the second layer, or the reaction byproducts from the process chamber 201.

The residual gas in the process chamber 201 may not be completely excluded and the interior of the process chamber 201 may not be completely purged. If an amount of the residual gas in the process chamber 201 is very small, this has no adverse effect on the subsequent Step 1a. In this case, there is no need to provide a high flow rate of the $N_2$ gas supplied into the process chamber 201. For example, approximately the same volume of the $N_2$ gas as the reaction tube 203 (the process chamber 201) may be supplied into the process chamber 201 to purge the interior of the process chamber 201 such that there is no adverse effect generated in Step 1a. In this way, when the interior of the process chamber 201 is not completely purged, purge time can be shortened, thereby improving a throughput. This can also limit consumption of the $N_2$ gas to a minimal necessity.

Examples of the oxidizing gas may include a hydrogen peroxide ($H_2O_2$) gas, hydrogen ($H_2$)+oxygen ($O_2$) gas, hydrogen ($H_2$)+ozone ($O_3$) gas, and the like, in addition to the $H_2O$ gas. Examples of the catalyst gas may include the above-mentioned various amine-based catalyst gases, in addition to the pyridine gas. Examples of the inert gas may include the above-mentioned various rare gases, in addition to the $N_2$ gas.

(Performing Predetermined Number of Times)

When one set including the above-described Steps 1a and 2a is performed one or more times (i.e., a predetermined number of (n) times), it is possible to form a SiOC film having a predetermined composition and a predetermined film thickness, as a first film, on the wafer 200. The one set may be repeated several times. That is, a thickness of a SiOC layer formed per set is set to be smaller than a desired thickness and the one set is repeated several times until the SiOC layer reaches the desired thickness.

At this time, when process conditions such as the internal pressure of the process chamber 201, gas supply time and so on in each step are controlled, percentages of element components (i.e., Si, O and C components) in the SiO layer, that is, concentrations of Si, O and C components, can be finely adjusted and a composition ratio of the SiOC film can be more closely controlled.

When the set is performed several times, the phase "supplying a predetermined gas to the wafer 200" in each step after at least two sets means "supplying a predetermined gas to a layer formed on the wafer 200, i.e., to an outermost surface of the wafer 200 as a laminated body". The phrase "forming a layer on the wafer 200" means "forming a layer on a layer formed on the wafer 200, i.e., on an outermost surface of the wafer 200 as a laminated body". This is as above and is equally applied to descriptions on performing a set or a cycle several times in modifications and other embodiments which will be described later.

(SiOC Film Modifying Process)

The SiOC film formed as above has an excellent etching resistance and a low dielectric constant although it is formed under the condition of low temperature of, for example, 150 degrees C. or less. However, the SiOC film may have a low ashing resistance. Therefore, in this embodiment, a process of modifying the SiOC film into a SiOCN film using a $NH_3$ gas as a modifying gas is performed to form a thin film having a high etching resistance and a high ashing resistance.

(Pressure Adjustment and Temperature Adjustment)

The interior of the process chamber 201 is vacuum-exhausted by the vacuum pump 246 to a desired pressure (vacuum level) while feedback-controlling the APC valve 244 (pressure adjustment). Also, the process chamber 201 is heated by the heater 207 such that the wafer 200 reaches a desired temperature. Here, an electrical conduction state to the heater 207 is feedback-controlled based on the temperature information detected by the temperature sensor 263 until the interior of the process chamber 201 reaches a desired temperature distribution (temperature adjustment). In this processing, the rotation of the boat 217 and wafer 200 by the rotary mechanism 267 continues to be performed.

($NH_3$ Gas Supply)

The valve 243d is opened to allow $NH_3$ gas to flow into the gas supply pipe 232d. A flow rate of the $NH_3$ gas is regulated by the MFC 241d. The $NH_3$ gas with its flow rate regulated is supplied from the gas supply holes 250d into the process chamber 201 and from the gas supply holes 250e into the process chamber 201 and is exhausted from the exhaust pipe 231. At this time, the $NH_3$ gas is supplied to the wafers 200 ($NH_3$ gas supply). At the same time, the valve 243j is opened to allow the flow of an inert gas such as a $N_2$ gas into the gas supply pipe 232j. A flow rate of the $N_2$ gas is regulated by the MFC 241j. The $N_2$ gas with its flow rate regulated is supplied into the process chamber 201, along with the $NH_3$ gas, and is exhausted from the exhaust pipe 231.

At this time, in order to prevent the $NH_3$ gas from being introduced into the nozzles 249a to 249c, the valves 243g to 243i are opened to allow the $N_2$ gas to flow into the gas supply pipes 232g to 232i. The $N_2$ gas is supplied into the process chamber 201 via the gas supply pipes 232a to 232c and the nozzles 249a to 249c and is exhausted from the exhaust pipe 231.

At this time, the APC valve 244 is appropriately regulated to set the internal pressure of the process chamber 201 to fall within a range of, for example, less than atmospheric pressure, more specifically 1 to 13300 Pa (0.0075 to 100 Torr), or further more specifically 133 to 2666 Pa (1 to 20 Torr). The flow rate of $NH_3$ gas controlled by the MFC 241d is set to fall within a range of, for example, 1 to 2000 sccm, more specifically 10 to 1000 sccm. The flow rates of $N_2$ gases controlled by the MFCs 241g to 241j are set to fall within a range of, for example, 100 to 10000 sccm. The time period during which the $NH_3$ gas is supplied to the wafer 200 is set to fall within a range of, for example, 1 to 120 minutes, more specifically 10 to 120 minutes.

At this time, the heater 207 is set to a temperature such that the temperature of the wafer 200 is set to be higher than the temperature of wafers 200 in the above-described process of forming the SiOC film. Specifically, the temperature of wafers 200 is set to fall within a range of, for example, 200 to 900 degrees C., more specifically 200 to 700 degrees C., or further more specifically 200 to 600 degrees C. This temperature range is determined in consideration of heat load and heat history suffered by the wafers 200. That is, if the temperature of wafers 200 exceeds 900 degrees C., the heat load may be too large, which may have an effect on electrical characteristics of semiconductor devices formed on the wafers 200. When the temperature of the wafer 200 is set to at least 900 degrees C. or less, it is possible to limit the effect of the heat load on the electrical characteristics. Specifically, in a case where the wafer 200 on which a SiOC film to be thermally treated is formed is prepared for a memory device, the wafer 200 can withstand temperatures of about 900 degrees C. Even when the wafer 200 is prepared for a logic device, the wafer 200 can withstand temperatures of up to 700 degrees C. When the temperature of the wafers 200 is set to 600 degrees C. or less, it is easy to avoid thermal damage to device structures more reliably. On the other hand, if the temperature of the wafer 200 is set to less than 200 degrees C., the effect of modification of the SiOC film is lowered and the $NH_3$ gas supply time (i.e., the modification time) is lengthened, which results in deterioration of productivity. When the temperature of the wafer 200 is set to 200 degrees C. or more, the modification of the SiOC film is appropriately promoted, thereby keeping the modification time within practical processing times. As a result, the temperature of wafers 200 may be set to 200 to 900 degrees C., more specifically 200 to 700 degrees C., or further more specifically 200 to 600 degrees C.

The $NH_3$ gas supplied into the process chamber 201 is activated by heat and is exhausted from the exhaust pipe 231. At this time, the thermally-activated $NH_3$ gas is supplied to the wafer 200. That is, the gas flowing into the process chamber 201 is the thermally-activated $NH_3$ gas rather than the BTCSM gas, the $H_2O$ gas and the pyridine gas. Therefore, the thermally-activated $NH_3$ gas is supplied to the wafer 200 without causing any gaseous reaction and reacts with at least a portion of the first film (SiOC film) formed on the wafer 200 by performing Steps 1a and 2a a predetermined number of times. This allows the SiOC film to be thermally modified by non-plasma and to be changed into a second film containing Si, O, C and N, that is, a SiOCN film.

At this time, since the temperature of the wafer 200 is set to a relatively high temperature as described above, reaction of the $NH_3$ gas and the SiOC film is promoted so that N components can be introduced into the SiOC film. In addition, since the temperature of the wafer 200 is set to be higher than the temperature of the wafer 200 in the above-described process of forming the SiOC film, if the SiOC film contains a large amount of water as described above, the water is easily desorbed from the film. Minute pores (or spaces) are produced in portions of missing water in the SiOC film, thereby making the SiOC film porous. As N enters the pores without water, the N components are even more likely to be introduced into the SiOC film and accordingly the modification is performed on substantially the entire SiOC film. At this time, at least a portion of N components introduced into the SiOC film may form a Si—N bonding with Si in the SiOC film.

In addition, the SiOC film modification is performed after the temperature of the wafer 200 is increased to and stably kept at the desired temperature by the above-described temperature adjustment. That is, the process of modifying the SiOC film indicates the duration for which the $NH_3$ gas is supplied to the wafers 200 in the state where the temperature of the wafer 200 is kept at a predetermined temperature. However, when the temperature of the wafer 200 is increased in the above-described process of adjusting the temperature of the wafer 200, the SiOC film modification may be started by starting the supply of the $NH_3$ gas to the wafers 200 at a certain timing. Alternatively, a decrease in the temperature of the wafer 200 performed in a process of purging the interior of the process chamber 201, which will be described later, may be started during the supply of the $NH_3$ gas and then the SiOC film modification may continue while decreasing the temperature of the wafer 200. In this manner, the supply of the $NH_3$ gas is performed in at least some periods of the process of adjusting (increasing) the temperature of the wafer 200 and the process of decreasing the temperature of the wafer 200, and these periods may be included in the process of modifying the SiOC film. However, the desired temperature to which the temperature of the wafer 200 is adjusted as described above is a temperature suitable to introduce N into the SiOC film. Accordingly, at a temperature lower than the desired temperature when increasing or decreasing the temperature of the wafer 200, the introduction of N into the SiOC film may be limited or not made at all, and the modification will be limited or not made at all. Accordingly, the modification is performed at the specific temperature with the temperature of the wafer 200 kept at the desired temperature. This allows a rate or amount of introduction of N into the SiOC film to be stable, thereby achieving a thin film having higher quality and more stable characteristics.

(Residual Gas Removal and Purge)

Thereafter, the valve 243d is closed to stop the supply of the $NH_3$ gas. At this time, with the APC valve 244 of the exhaust pipe 231 opened, the interior of the process chamber 201 is vacuum-exhausted by the vacuum pump 246 and an unreacted $NH_3$ gas remaining in the process chamber 201 or a $NH_3$ gas which remains after contributing to the reaction, or reaction products are excluded from the process chamber 201 (residual gas removal). At this time, with the valves 243g to 243j opened, the supply of the $N_2$ gas, as an inert gas, into the process chamber 201 is maintained. The $N_2$ gas acts as a purge gas which is capable of further improving the effect of excluding the unreacted $NH_3$ gas remaining in the process chamber 201 or the $NH_3$ gas which remains after contributing to the formation of the SiOC film, or the reaction byproducts from the process chamber 201 (purge).

Examples of the modifying gas containing at least one selected from the group consisting of C and N may include non-amine-based gases containing two elements of N and H, such as a diazene ($N_2H_2$) gas, a hydrazine ($N_2H_4$) gas, an $N_3H_8$ gas, and the like, as an N-containing modifying gas, in addition to the $NH_3$ gas. Examples of the inert gas may include the above-mentioned various rare gases, in addition to the $N_2$ gas.

(Return to Atmospheric Pressure)

After the interior of the process chamber 201 is purged by the inert gas, with the valves 243g to 243j opened, as the $N_2$ gas as the inert gas continues to be supplied from each of the gas supply pipes 232g to 232j into the process chamber 201, the internal atmosphere of the process chamber 201 is substituted with the inert gas (inert gas substitution) and the internal pressure of the process chamber 201 is returned to atmospheric pressure (return to atmospheric pressure).

In addition, the temperature of wafers 200 is decreased to less than 200 degrees C., more specifically around room temperature (temperature decreasing process). That is, the temperature of wafers 200 is decreased by adjusting the state of electrical conduction to the heater 207 or stopping the electrical conduction to the heater 207. By performing such decrease of the temperature of the wafer 200 in parallel to the purge and the atmospheric pressure return, the temperature of the wafer 200 can be decreased to a predetermined temperature in a shorter time by a cooling effect of the purge gas such as the $N_2$ gas. However, as described above, the temperature decreasing process of decreasing the temperature of the wafer 200 may be started during the period of the $NH_3$ gas supplying process. Even in this case, the temperature of the wafer 200 can be decreased to a predetermined temperature in a shorter time by a cooling effect of the $NH_3$ gas.

(Boat Unload and Wafer Discharge)

Thereafter, the seal cap 219 is descended by the boat elevator 115 to open the bottom of the reaction tube 203 while carrying the processed wafers 200 from the bottom of the manifold 209 out of the reaction tube 203 with the wafer 200 supported by the boat 217 (boat unload). Thereafter, the processed wafers 200 are discharged out of the boat 217 (wafer discharge).

(3) Certain Advantages

This embodiment provides one or more advantages as follows.

(a) According to the film forming sequence of this embodiment, in Step 1a of the SiOC film forming process, the BTCSM gas is supplied to the wafers 200 as the precursor gas. In this manner, by using a precursor gas containing Si, C and Cl and having a Si—C bonding, particularly, a precursor gas containing C, Cl and at least two S is in one molecule and having a Si—C bonding, it is possible to form a film containing C at a high concentration, that is, a SiOC film having a high C concentration. Accordingly, it is possible to obtain a SiOC film having a high etching resistance and a low dielectric constant.

In a case where a catalyst gas is used to form a thin film such as a SiO film under the condition of low temperature, it is easy to form a film having a high wet etching rate (WER), i.e., a film having a low etching resistance, by, for example, a hydrofluoric acid of 1% concentration (1% HF aqueous solution). Although an etching resistance to the film may be increased if C is contained in the film, it is difficult to introduce C into the SiO film when the film is formed under a temperature of, for example, 150 degrees C. or less.

Accordingly, this embodiment employs a precursor gas containing Si, C and Cl and having a Si—C bonding, such as the BTCSM gas. Accordingly, in the step of forming the first layer as an initial layer on the wafer 200, since C can be introduced in the first layer, a SiOC film having a sufficient C concentration can be formed. In addition, the C concentration in the SiOC film can be controlled with high precision.

Accordingly, it is possible to obtain a SiOC film having a high etching resistance and a low dielectric constant.

(b) According to the film forming sequence of this embodiment, in the SiOC film modifying process, the $NH_3$ gas is supplied to the wafers 200 and the SiOC film is modified into a SiOCN film. Accordingly, it is possible to obtain a thin film having a high etching resistance and a high ashing resistance.

A SiOC film containing C may have a low ashing resistance and a low dry etching resistance. Therefore, an etching resistance of the SiOC film to HF may be lowered by an ashing or dry etching using $O_2$ plasma or the like. It is believed that this is because a strong oxidizing power by the $O_2$ plasma further oxidizes the SiOC film and forms many C—O bondings in the film. C coupled with O is changed into a CO gas or a $CO_2$ gas and is easily desorbed from the SiOC film. Accordingly, it is believed that the C concentration in the SiOC film is lowered by the ashing or the like, which results in a film having a low etching resistance.

Accordingly, in this embodiment, the $NH_3$ gas is used as the modifying gas and N is introduced into the SiOC film. In this manner, by introducing a new element such as N into the SiOC film, a bonding state of each of Si, O and C becomes different from that in the SiOC film before the modification. Accordingly, it is possible to prevent a C—O bonding from being formed in the film or prevent C from being desorbed from the film in the ashing or the like using the $O_2$ plasma. Accordingly, it is possible to improve an ashing resistance, i.e., oxidation resistance, of the film over the SiOC film before the modification. That is, it is possible to prevent an etching resistance of the film to HF from deteriorating due to ashing or the like. As a result, it is possible to obtain a thin film having a high etching resistance and a high ashing resistance.

(c) According to the film forming sequence of this embodiment, a thin film having a high etching resistance and a high ashing resistance can be obtained. Accordingly, when such a thin film is applied to various kinds of semiconductor devices, a signal delay is less likely to be produced, thereby realizing high-integrated semiconductor devices operated at a high speed.

There is a recent need of high integration for semiconductor devices including memory devices such as flash memory, DRAMs (Dynamic Random Access Memories), SRAMs (Static Random Access Memories) and the like, logic devices and so on. To meet this need, there have been proposed methods of miniaturizing patterns and decreasing size of individual semiconductor devices by lessening a pitch corresponding to the sum of a pattern width and a pattern interval.

Accordingly, for example, to cope with miniaturization of transistors, it has been reviewed to use a low electric constant thin film for a side wall spacer (SWS) which is a peripheral structure of a gate electrode. A multi-layered wiring layer also can highly contribute to high integration of semiconductor devices. In this case, a low dielectric constant (low-k) thin film is often used as an interlayer insulating film to isolate fine patterns from each other or devices or wiring layers from each other in a 3D structure such as a multi-layered wiring layer. In this manner, by using the low-k thin film for the SWS or the interlayer insulating film, it is possible to limit a signal delay which may be caused by electrostatic induction or the like.

In this embodiment, the SiOC film is modified into the SiOCN film by forming and then modifying the SiOC film. Accordingly, a thin film having a high etching resistance and a high ashing resistance can be obtained, which can result in high-speed and high-integrated semiconductor devices.

(d) The substrate processing apparatus of this embodiment may include a plurality of gas supply lines for various gases such as a precursor gas, a catalyst gas, an oxidizing gas, a modifying gas and the like and may also be configured to supply one or more selected from multiple kinds of gases having different molecular structures. With this configuration, it is easy to supply a particular precursor gas, catalyst gas, oxidizing gas or modifying gas selected from the multiple kinds of gases depending on a desired film composition or the like. Accordingly, it is possible to form general-purposed thin films having different composition ratios and film qualities with high reproducibility using a single substrate processing apparatus. In addition, it is possible to secure a degree of freedom of apparatus operability for addition or replacement of gas species.

(e) In the substrate processing apparatus of this embodiment, a plurality of process recipes (programs in which process orders and process conditions are described) used for film formation may be prepared for different kinds of gases, i.e., different gas systems. In addition, in the substrate processing apparatus of this embodiment, a plurality of process recipes may be prepared for different process conditions, such as setting the supply amount or flow rate of each gas such as the catalyst gas to different numerical values. With these process recipes, it is easy to select a particular precursor gas, catalyst gas, oxidizing gas or modifying gas from the multiple kinds of gases and select a flow rate or the like thereof, depending on a desired film composition, film quality, film thickness or the like. An operator may operate a film forming process according to a proper process selected from the plurality of process recipes depending on the desired film composition or the like. Accordingly, it is possible to form general-purpose thin films having different composition ratios and film qualities with high reproducibility using a single substrate processing apparatus. In addition, an operation burden (a burden on input of process procedures and process conditions) of the operator can be reduced, and thus, processing of the substrate may be rapidly initiated, while avoiding a manipulation error.

(4) Modifications of the Embodiment

Next, modifications of this embodiment will be described with reference to FIGS. 5B, 6A and 6B.
(Modification)

In the above-described SiOC film modifying process, for example, an element other than N can be selected as an element to be added to the SiOC film by selecting a different kind of modifying gas to be supplied.

That is, in the SiOC film modifying process, an element to be contained in the SiOC film can be selected by selecting and supplying a particular modifying gas (a carbon (C)-containing modifying gas, a nitrogen (N)-containing modifying gas, or a C and N-containing modifying gas) from multiple kinds of modifying gases containing different elements (i.e., multiple kinds of modifying gases containing at least one selected from the group consisting of C and N).

In order to select and supply a particular modifying gas from the multiple kinds of modifying gases, the particular modifying gas can be supplied by selecting a particular modifying gas from a plurality of supply lines for supplying multiple kinds of modifying gases containing different elements or multiple kinds of modifying gases having different molecular structures. As described above, in the example of the film forming sequence shown in FIGS. 4 and 5A, the $NH_3$ gas is supplied as the particular modifying gas by selecting the $NH_3$ gas supply line. In addition, as shown in FIG. 5B, in an example of a film forming sequence of a modification of the embodiment, the $C_3H_6$ gas is supplied as the particular modifying gas by selecting the $C_3H_6$ gas supply line. In this manner, by using the $C_3H_6$ gas as the modifying gas instead of the $NH_3$ gas, it is possible to obtain a SiOC film further containing C, i.e., a SiOC film having the C concentration even higher than that in the SiOC film before the modification, unlike the SiOCN film obtained in the above-described embodiment. Here, the SiOC film further containing C may be referred to as a SiOC film doped (added) with C.

In this modification, instead of the above-described $NH_3$ gas supplying process, the SiOC film modifying process including the process of supplying the $C_3H_6$ gas to the wafers 200 is performed. A sequence of supplying the $C_3H_6$ gas to the wafers 200 will be described below.

($C_3H_6$ Gas Supply)

After forming the SiOC film on the wafers 200 by performing the same steps as the above-described Steps 1a and 2a a predetermined number of times and then making pressure adjustments and temperature adjustments, the valve 243f is opened to allow $C_3H_6$ gas to flow into the gas supply pipe 232f. A flow rate of the $C_3H_6$ gas is regulated by the MFC 241f. The $C_3H_6$ gas with its flow rate regulated is supplied from the gas supply holes 250c into the process chamber 201 through the gas supply pipe 232c and is exhausted from the exhaust pipe 231. At this time, the $C_3H_6$ gas is supplied to the wafers 200 ($C_3H_6$ gas supply). At the same time, the valve 243i is opened to allow flow of an inert gas such as a $N_2$ gas into the gas supply pipe 232i. A flow rate of the $N_2$ gas is regulated by the MFC 241i. The $N_2$ gas with its flow rate regulated is supplied into the process chamber 201, along with the $C_3H_6$ gas, and is exhausted from the exhaust pipe 231.

The $C_3H_6$ gas supplied into the process chamber 201 is activated by heat and is exhausted from the exhaust pipe 231. At this time, the thermally-activated $C_3H_6$ gas is supplied to the wafer 200. That is, the gas flowing into the process chamber 201 is the thermally-activated $C_3H_6$ gas rather than the BTCSM gas, the $H_2O$ gas and the pyridine gas. Therefore, the thermally-activated $C_3H_6$ gas is supplied to the wafer 200 without causing any gaseous reaction and reacts with at least a portion of the SiOC film formed on the wafer 200 by performing the same steps as Steps 1a and 2a a predetermined number of times. This allows the SiOC film to be thermally modified by non-plasma and to be changed into a thin film containing Si, O and C, that is, a SiOC film further containing C.

At this time, by setting the temperature of the wafer 200 to a relatively high temperature, reaction of the $C_3H_6$ gas and the SiOC film is promoted so that C components in the $C_3H_6$ gas can be introduced into the SiOC film. In addition, by setting the temperature of the wafer 200 to be higher than the temperature of the wafer 200 in the process of forming the SiOC film, if the SiOC film contains a large amount of water, the water is easily desorbed from the film. Minute pores (or spaces) are produced in portions of missing water in the SiOC film, thereby making the SiOC film porous. As C enters the pores without water, the C components are even more likely to be introduced into the SiOC film and accordingly the modification is performed for substantially the entire SiOC film. At this time, at least a portion of C components introduced into the SiOC film may form a Si—C bonding with Si in the film.

In this manner, by modifying the formed SiOC film into the SiOC film further containing C, it is possible to obtain a thin film having a high ashing resistance. This is because, as the SiOC film after the modification has a higher C concentration than that in the SiOC film before the modification, the C concentration in the former can still be kept at a higher level than that in the latter even if a certain amount of C is desorbed from the former due to, for example, ashing. When the SiOC film further contains C instead of N, a wet etching rate for hot phosphoric acid can be improved. When the SiOC film further contains C instead of N, a dielectric constant can be lower than that of the SiOC film before the modification.

After the formed SiOC film is modified into the SiOC film further containing C, the valve 243f is closed to stop the supply of the $C_3H_6$ gas.

Figure 4:
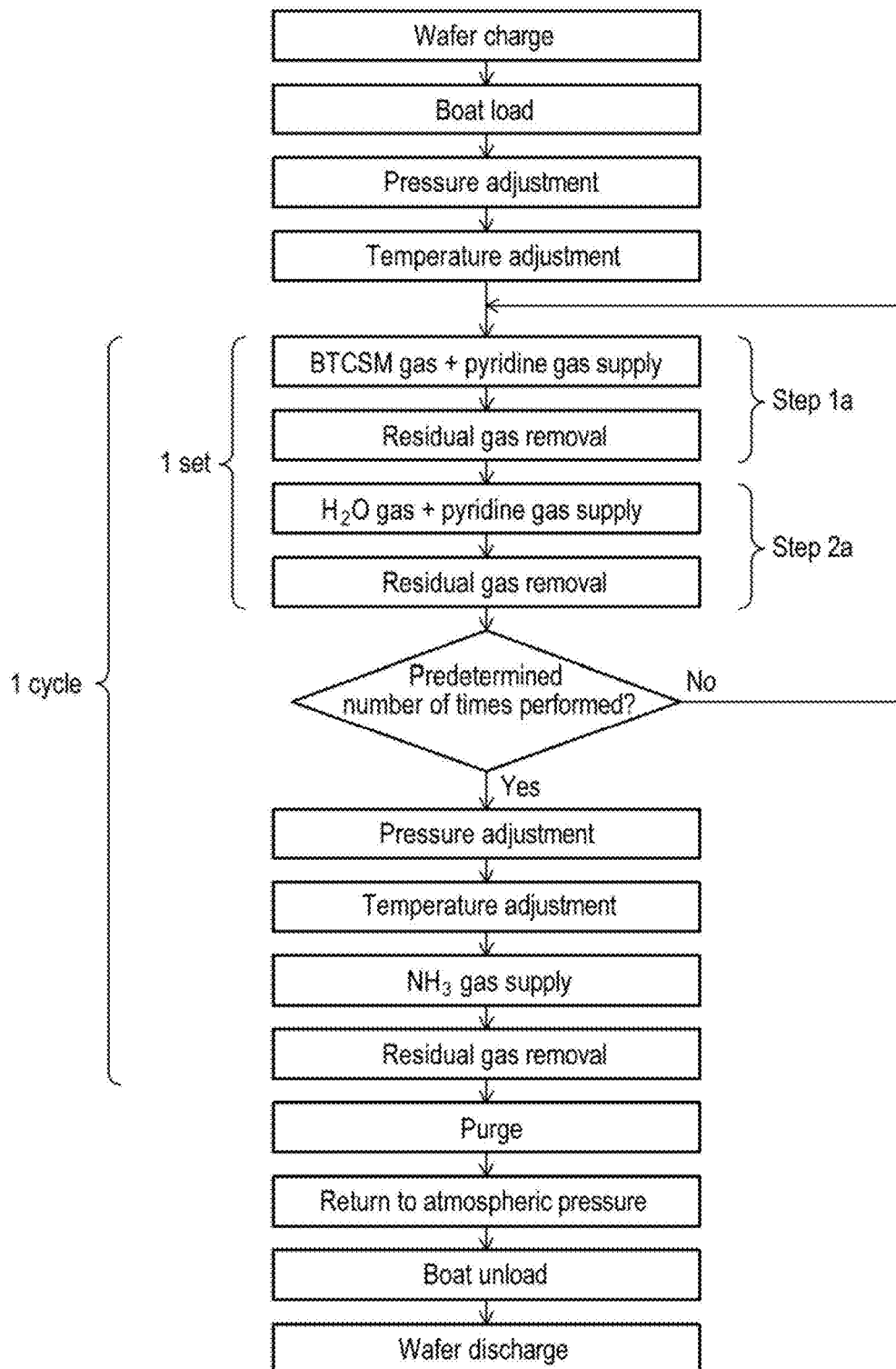
FIG. 4 is a view illustrating a flow of film formation in a film forming sequence according to the first embodiment.
Figure 5A:
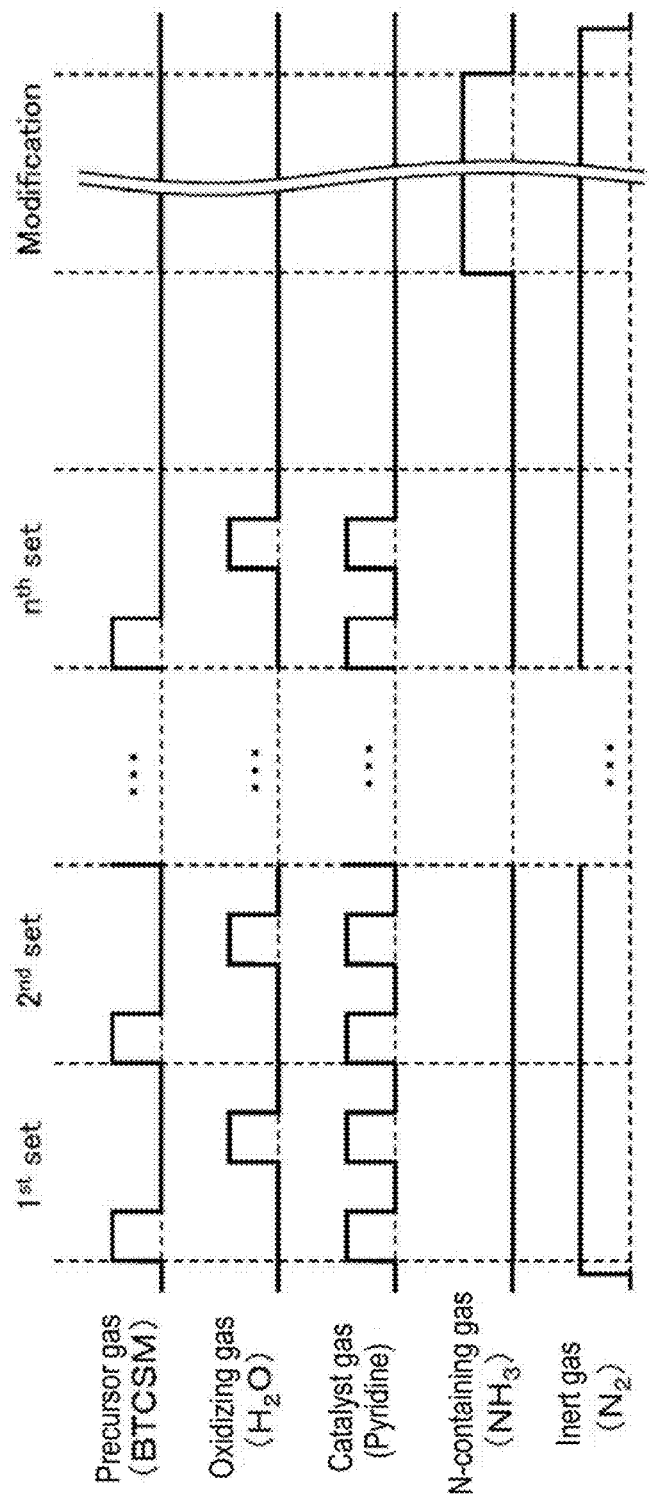
FIGS. 5A and 5B are views illustrating gas supply timings in the film forming sequence and gas supply timings in a modification of the film forming sequence, respectively, according to the first embodiment.

At this time, the process conditions such as the internal pressure of the process chamber 201, supply amount and supply time of gases such as the modifying gas and the $N_2$ gas, the temperature of the wafer 200, and so on may be the same as the process conditions for the above-described sequence of FIGS. 4 and 5A. When the $C_3H_6$ gas is supplied, like the above-described embodiment, supply of the $N_2$ gas is performed to prevent the $C_3H_6$ gas from being introduced into the nozzles 249a, 249b and 249d and the buffer chamber 237 that are not in current use.

Examples of the modifying gas containing at least one selected from the group consisting of C and N may include hydrocarbon-based gases such as an ethylene ($C_2H_4$) gas and a methane gas ($CH_4$) gas, monomethylsilane ($CH_3SiH_3$) gas and the like, as C-containing modifying gases, in addition to the $C_3H_6$ gas. Examples of the inert gas may include the above-mentioned various rare gases, in addition to the $N_2$ gas.

Alternatively, another modifying gas containing C and N may be used. In this case, a SiOCN film further containing C and N can be formed. Examples of the modifying gas containing C and N may include a C-containing gas such as a $C_3H_6$ gas, an N-containing gas such as a $NH_3$ gas, a C and N-containing as such as an amine-based gas, and the like. Examples of the amine-based gas may include a triethylamine (($C_2H_5$)$_3$N, abbreviation: TEA) gas, a diethylamine (($C_2H_5$)$_2$NH, abbreviation: DEA) gas, a monoethylamine (($C_2H_5$)$NH_2$, abbreviation: MEA) gas, a trimethylamine (($CH_3$)$_3$N, abbreviation: TMA) gas, monomethylamine (($CH_3$)$NH_2$, abbreviation: MMA) gas, and the like.

In this manner, by using the modifying gas containing C and N to form the SiOCN film further containing C and N, the C concentration can be higher than that in the SiOC film before the modification and a bonding state of each element in the film is changed by the newly introduced N, thereby obtaining a film having an even higher ashing resistance.

A method of changing a film composition and so on by changing the kind of gas supplied to the wafers 200 as described above can be also applied to, for example, a process of forming a SiOC film.

That is, in the above-described process of supplying the precursor gas and the catalyst gas, by selecting a proper gas from the supplied precursor gases (for example, BTCSM gas, BTCSE gas, TCDMDS gas, DCTMDS gas and MCP-MDS gas), the C concentration in the SiOC layer and further the SiOC film formed of a stack of SiOC layers can be controlled. In other words, in the process of supplying the precursor gas and the catalyst gas, by selecting a particular precursor gas from multiple kinds of precursor gases having different molecular structures, the C concentration in the SiOC layer and the SiOC film can be controlled.

The C concentration in the SiOC film may be controlled by the selected kind of precursor gas, because C arrangements in molecular structures of the precursor gases are different from each other. An alkylenehalosilane-based precursor gas having a Si—C—Si bonding or a Si—C—C—Si bonding in one molecule, such as the BTCSM gas or the BTCSE gas, has a molecular structure where C is inserted between S is. Accordingly, this precursor gas maintains a state where many Cls are combined with the remaining Si bonding hands. For example, in the BTCSM gas and the BTCSE gas, Cls are combined with three of four Si bonding hands. It is believed that many Cls included in the one molecule improve reactivity of the BTCSM gas and the BTCSE gas. Accordingly, when the BTCSM gas or the BTCSE gas is used, for example, a deposition rate of the SiOC film is improved. The improved deposition rate leads to extension of a usable condition range (process window) of the film forming process using the BTCSM gas or the BTCSE gas. In this manner, since film forming conditions for obtaining a desired C concentration can be selected from the extended process window, it is easy to increase the C concentration in the SiOC film. The controllability of the C concentration in the SiOC film can also be improved. The number of Cs included in the SiOC film is smaller than that of the TCDMDS gas and the like. However, it is believed that this has an adverse action on improvement of the C concentration in the SiOC film. The present inventors have confirmed that the BTCSM gas is superior to the TCDMDS gas in terms of improvement of the C concentration.

An alkylhalosilane-based precursor gas having an alkyl group such as a methyl group combined with Si, such as the TCDMDS gas, the DCTMDS gas or the MCPMDS gas, has a molecular structure where some chloro groups of a chlorosilane-based precursor gas are substituted with methyl groups. As the number of Cls in gas molecules is decreased as much, reaction for the TCDMDS gas, the DCTMDS gas or the MCPMDS gas proceeds relatively slowly, which is more likely to obtain a more compact SiOC film. Accordingly, even a SiOC film having a properly limited C concentration is likely to maintain a high etching resistance. In comparison between the TCDMDS gas and the DCTMDS gas, it has been confirmed that the DCTMDS gas including methyl groups, i.e., many Cs, in its molecules has a favorable action on introduction of C into the film.

Similarly, in the process of supplying the oxidizing gas and the catalyst gas, the kind of supplied catalyst gas can be appropriately selected depending on a desired film composition or the like. For example, it is believed that catalyst gases having different molecular structures have different intensities of catalystic action. It is also believed that such a difference in catalystic action is one factor in the controllability of the film composition in the SiOC film by the selected kind of catalyst gas. For example, if a catalyst gas having a large pKa value as an index of the catalystic action is selected, an oxidizing power of the oxidizing gas is strengthened, the Si—C bonding is broken, and accordingly the C concentration tends to decrease. If a catalyst gas having a small pKa value is selected, an oxidizing power of the oxidizing gas is weakened, the Si—C bonding is maintained, and accordingly the C concentration tends to increase. As another factor in the controllability of the film composition in the SiOC film, various factors may be considered which include a difference in vapor pressure, a difference in pKa value and so on of various materials related to catalystic reaction of various catalyst gases, produced salts and so on, and a combination thereof. In this manner, by selecting and supplying a particular catalyst gas from multiple kinds of catalyst gases having different molecular structures, it is possible to control the C concentration in the SiOC layer and the SiOC film.

The kind of catalyst gas supplied in the process of supplying the oxidizing gas and the second catalyst gas may be the same as or different from the kind of catalyst gas supplied in the process of supplying the precursor gas and the first catalyst gas.

When the kinds of precursor gas and catalyst gas are selected, the Si concentration and the O concentration may be relatively changed by controlling the C concentration in the SiOC film. That is, the composition of the SiOC film may be entirely changed, or alternatively, the kinds of precursor gas and catalyst gas may be selected for the purpose of overall control of the composition of the SiOC film.

When the above-described set of Steps 1a and 2a is performed several times, the kinds of precursor gas and catalyst gas may be changed in the course of the performance. When the set of Steps 1a and 2a is performed several times, the supply amount of the catalyst gas may be changed in the course of the performance. Accordingly, the C concentration in the SiOC film may be changed in the film thickness direction.

(Other Modifications)

It has been illustrated in the above embodiment that the SiOC film forming process and the SiOC film modifying process are performed under the state where the wafers 200 to be processed are accommodated in the same process chamber 201. In this modification, the SiOC film forming process and the SiOC film modifying process are performed in different process chambers in which the wafers 200 to be processed are accommodated.

Figure 6A:
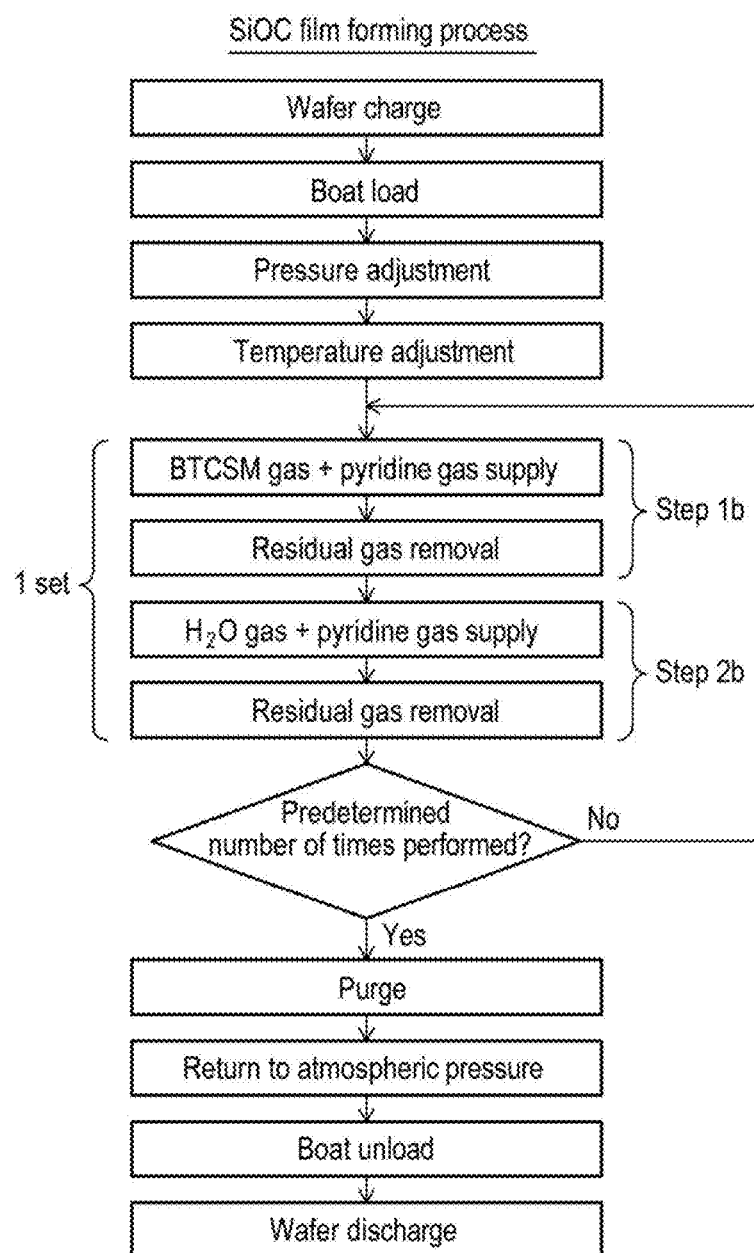
FIGS. 6A and 6B are views illustrating a flow of film formation in another modification of the film forming sequence according to the first embodiment, FIG. 6A showing a process of forming a SiOC film and FIG. 6B showing a process of modifying the SiOC film.
Figure 6B:
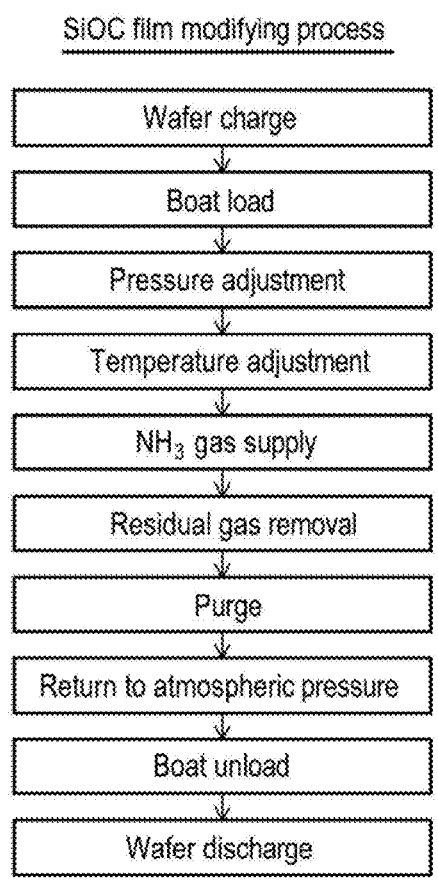

Specifically, as shown in FIGS. 6A and 6B, for example, the SiOC film forming process is performed in the process chamber 201 (hereinafter referred to as a first process chamber) of the substrate processing apparatus (hereinafter referred to as a first substrate processing part) shown in FIGS. 1 and 2, like the above embodiment. Operation of various components constituting the first substrate processing part is controlled by the controller 121 (hereinafter referred to as a first control part). Then, after performing a set including the same Steps 1b and 2b as the above-described Steps 1a and 2a a predetermined number of times, purge, return to atmospheric pressure, boat unload and wafer discharge in the process chamber are sequentially performed.

Subsequently, the process of modifying the SiOC film formed on the wafers 200 unloaded from the boat 217 is performed in another process chamber other than the process chamber 201. This other process chamber (hereinafter referred to as a second process chamber) is used in a separate substrate processing apparatus (hereinafter referred to as a second substrate processing part) which is similar to the substrate processing apparatus used in the above embodiment but is different from the substrate processing apparatus in which the SiOC film forming process is performed. Operation of various components constituting the second substrate processing part is controlled by a second control part. In the second substrate processing part, wafer charge and boat load are sequentially performed, as in the above embodiment for the first substrate processing part. In addition, like the SiOC film modifying process of the above embodiment, pressure adjustment, temperature adjustment, $NH_3$ gas supply and residual gas removal are performed. Thereafter, like the above embodiment, purge, return to atmospheric pressure, boat unload and wafer discharge are sequentially performed.

In the above process, a substrate processing system is mainly configured by the first substrate processing part for forming the SiOC film and the second substrate processing part for modifying the SiOC film.

As described above, the SiOC film forming process and the SiOC film modifying process may be performed in the same process chamber 201 (i.e., in-situ) or different process chambers (the first process chamber and the second process chamber) (i.e., ex-situ). When both processes are performed in-situ, the wafers 200 can be consistently processed under a state where the wafers 200 are put under vacuum, without being exposed to the air. Accordingly, a film forming process can be performed with higher stability. When both processes are performed ex-situ, the internal temperature of each process chamber can be preset to a process temperature in each process or a temperature close to the process temperature, thereby shortening the time required for temperature adjustment. Accordingly, it is possible to increase yield.

The process chamber in which the SiOC film is modified may be a process chamber including a heat processing furnace used for heat treatment and a diffusion furnace used for diffusion, unlike the substrate processing apparatus of the above embodiment. The substrate processing system may be configured as a group of stand-alone type apparatuses in which the first substrate processing part is separated from the second substrate processing part, as described above, or as a single cluster type apparatus in which the first and second substrate processing parts are mounted on the same platform. This substrate processing system also can form a thin film under the same process conditions as those in the sequence shown in FIGS. 4 and 5A.

Second Embodiment

Next, a second embodiment of the present disclosure will be described.

(1) Film Forming Process

It has been illustrated in the above embodiment that the SiOC film is formed by performing the set including Steps 1a and 2a a predetermined number of times and then the SiOC film is modified by the modifying gas. In the second embodiment, a SiOCN film is formed by performing a cycle a predetermined number of times, the cycle including modifying a SiOC layer, which is formed by the same Steps 1c and 2c as the above Steps 1a and 2a, into a SiOCN layer further containing N. In the second embodiment, like the first embodiment, the substrate processing apparatus shown in FIGS. 1 and 2 is used. In the following description, operation of various components constituting the substrate processing apparatus is controlled by the controller 121.

Figure 7:
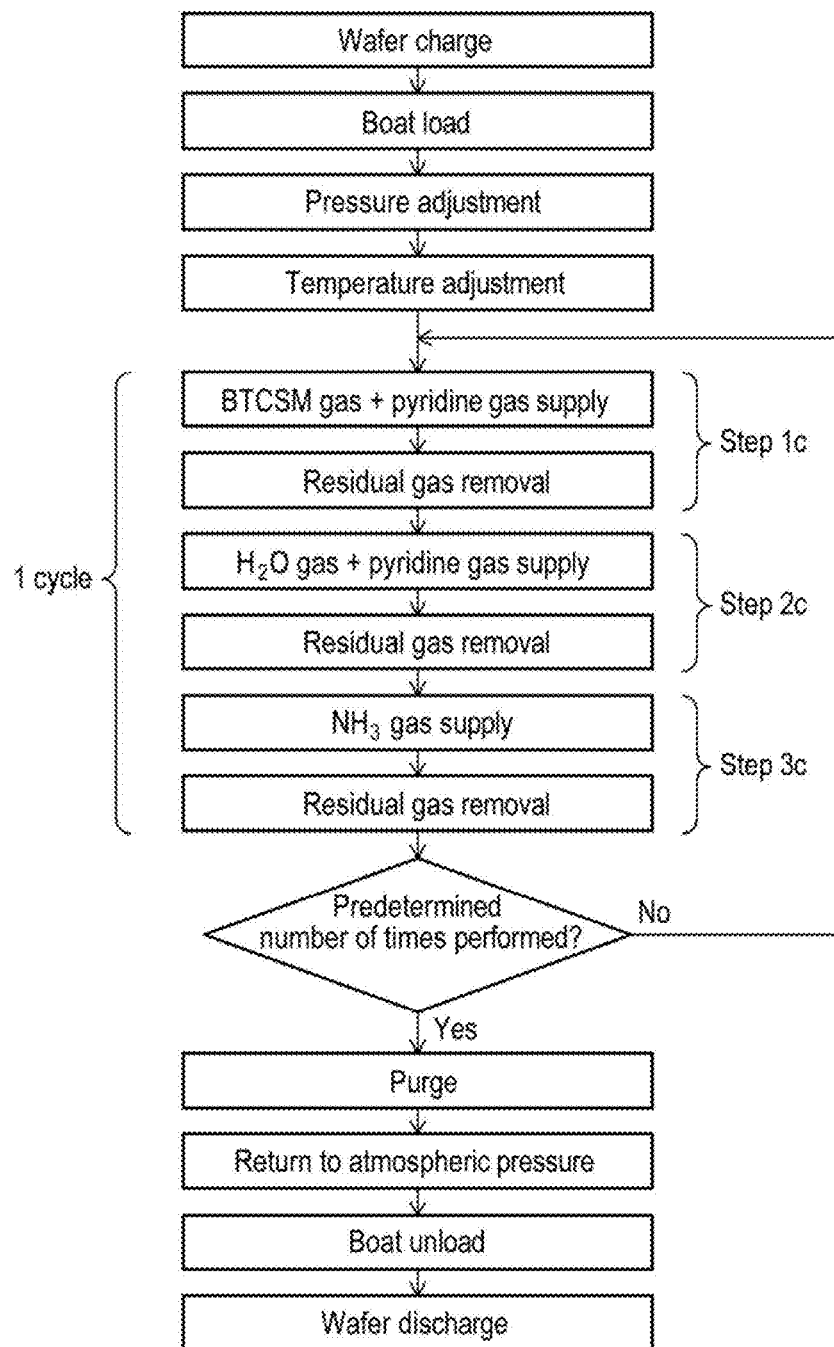
FIG. 7 is a view illustrating a flow of film formation in a film forming sequence according to a second embodiment.

As shown in FIGS. 7 and 8A, in the second embodiment, an example will be described in which a SiOCN film as a thin film containing Si, O, C and N is formed on a wafer 200 by performing a cycle a predetermined number of times, the cycle including: supplying a BTCSM gas as a precursor gas and a pyridine gas as a first catalyst gas to the wafer 200 (Step 1c); supplying a $H_2O$ gas as an oxidizing gas and the pyridine gas as a second catalyst gas to the wafer 200 (Step 2c); and supplying an N-containing modifying $NH_3$ gas as a modifying gas containing at least one selected from the group consisting of C and N to the wafer 200 (Step 3c).

In this case, in the act of supplying the $NH_3$ gas to the wafer 200, a plasma-exited $NH_3$ gas is supplied to the wafer 200.

This sequence is different from the film forming sequence of the first embodiment in Step 3c of supplying a plasma-excited $NH_3$ gas and an order of performance of the steps. Steps 1c and 2c of this sequence are the same as those in the first embodiment. Step 3c of this embodiment and an order of performance of the steps will be described below.

[Step 3c]

($NH_3$ Gas Supply)

After Step 2c is terminated to remove a residual gas from the process chamber 201, the valve 243d is opened to allow $NH_3$ gas to flow into the gas supply pipe 232d. A flow rate of the $NH_3$ gas is regulated by the MFC 241d. The $NH_3$ gas with its flow rate regulated is supplied from the gas supply holes 250d into the buffer chamber 237. At this time, by applying high-frequency (RF) power from the high-frequency power source 273 between the rod-shaped electrodes 269 and 270 through the matcher 272, the $NH_3$ gas supplied into the buffer chamber 237 is plasma-excited. The plasma-excited $NH_3$ gas is supplied, as active species, from the gas supply holes 250e into the process chamber 201 and is exhausted from the exhaust pipe 231. At this time, the plasma-activated (excited) $NH_3$ gas is supplied to the wafers 200 ($NH_3$ gas supply). At the same time, the valve 243j is opened to flow an $N_2$ gas into the gas supply pipe 232j. A flow rate of the $N_2$ gas is regulated by the MFC 241j. The $N_2$ gas with its flow rate regulated is supplied into the process chamber 201, along with the $NH_3$ gas, and is exhausted from the exhaust pipe 231. At this time, like the first embodiment, $N_2$ gas supply is appropriately performed in order to prevent the $NH_3$ gas from being introduced into the nozzles 249a to 249c and so on that are not in current use.

At this time, the APC valve 244 is appropriately regulated to set the internal pressure of the process chamber 201 to fall within a range of, for example, less than atmospheric pressure, more specifically 1 to 13300 Pa (0.0075 to 100 Torr), or further more specifically 133 to 2666 Pa (1 to 20 Torr). The flow rate of $NH_3$ gas controlled by the MFC 241d is set to fall within a range of, for example, 1 to 2000 sccm, more specifically 10 to 1000 sccm. The flow rates of $N_2$ gases controlled by the MFCs 241g to 241j are set to fall within a range of, for example, 100 to 10000 sccm. The time period during which the $NH_3$ gas is supplied to the wafer 200 is set to fall within a range of, for example, 1 to 100 seconds, more specifically 5 to 60 seconds.

The heater 207 is set to a temperature such that the temperature of the wafer 200 is set to the same range of temperature of the wafers 200 in Steps 1c and 2c, i.e., a temperature within a range of room temperature to 150 degrees C., more specifically room temperature to 100 degrees C., or further more specifically 50 to 100 degrees C. The high-frequency power applied from the high-frequency power source 273 between the rod-shaped electrodes 269 and 270 is set to fall within a range of, for example, 50 to 1000 W.

At this time, the gas flowing into the process chamber 201 is the plasma-excited $NH_3$ gas and contains active species of, for example, N radicals (N*). In addition, the BTCSM gas, the $H_2O$ gas and the pyridine gas do not flow into the process chamber 201. Therefore, the activated $NH_3$ gas is supplied to the wafer 200 without causing any gaseous reaction. A SiOC layer as a second layer formed on the wafer 200 in Steps 1c and 2c is mainly modified by this active species. The energy of this active species is higher than the energy of the thermally-activated $NH_3$ gas in the first embodiment. Accordingly, by providing the energy of the active species to the SiOC layer, at least a portion of Si—O bonding and Si—C bonding included in the SiOC layer is broken. N* as the active species is coupled with the remaining Si bonding hands separated from the bonding with O or C. In this manner, it is believed that at least a portion of Ns introduced into the SiOC layer forms a Si—N bonding. In addition, some Ns may be coupled with the remaining O or C bonds to form an N—O bonding or an N—C bonding.

In this manner, the SiOC layer as the second layer is changed (modified) into a third layer containing N, i.e., a SiOCN layer.

(Residual Gas Removal)

After the SiOCN layer as the third layer is formed on the wafer 200, the application of the high-frequency power from the high-frequency power source between the rod-shaped electrodes 269 and 270 is stopped. In addition, the valve 243d is closed to stop the supply of the $NH_3$ gas. At this time, the residual gas is removed from the process chamber 201 in the same order as the first embodiment.

Examples of the modifying gas containing at least one selected from the group consisting of C and N may include the above-mentioned N-containing gases, as an N-containing modifying gas, in addition to the $NH_3$ gas. Examples of the inert gas may include the above-mentioned various rare gases, in addition to the $N_2$ gas.

(Performance of Predetermined Number of Times)

When one cycle including Steps 1c, 2c and 3c is performed one or more times (i.e., a predetermined number of (n) times), it is possible to form a SiOCN film having a predetermined composition and a predetermined film thickness on the wafer 200. The one cycle may be repeated several times. That is, a thickness of a SiOCN layer formed per one cycle may be set to be smaller than a desired thickness and the one cycle is repeated several times until the SiOCN layer reaches the desired thickness.

Thereafter, purge, return to atmospheric pressure, boat unload and wafer discharge are performed in the same order as the first embodiment and then the film forming process of the second embodiment is ended.

(2) Certain Advantages

The second embodiment provides one or more advantages as follows, in addition to the advantages of the first embodiment.

(a) According to the film forming sequence of this embodiment, in Step 3c, the plasma-excited $NH_3$ gas is supplied to the wafer 200. Accordingly, the $NH_3$ gas remains more activated than thermally-activated $NH_3$ gas and modification action of the $NH_3$ gas on the SiOC layer can be remarkably enhanced. N* as the active species introduced in the SiOC layer is mostly combined with Si or the like and is contained in the SiOC layer more robustly and stably. That is, the SiOCN layer obtained by this modifying process can be a more robust and stable layer containing many Si—N bonds. Accordingly, the resultant SiOCN film can be a higher quality thin film.

(b) According to the film forming sequence of this embodiment, in Step 3c, the plasma-excited $NH_3$ gas is supplied to the wafer 200. Modification action on the SiOC layer can be remarkably enhanced by the plasma-excited $NH_3$ gas.

Accordingly, the SiOC layer modification can be sufficiently performed even under the condition of low temperature of, for example, 150 degrees C. or less, which can result in further improvement of thermal history suffered by the wafer 200.

For example, a low meting point metal material has been increasingly used around a gate of a transistor. Accordingly, a low-k thin film used for a SWS (Side Wall Spacer) or an interlayer insulating film has to be formed under the condition of low temperature of, for example, 150 degrees C. or less, sometimes, 100 degrees C. or less.

In this embodiment, the SiOCN film is formed by performing the SiOC film forming process and the SiOC film modifying process under the condition of low temperature of, for example, 150 degrees C. Accordingly, a thin film having a high etching resistance and a high ashing resistance can be obtained, which can result in high-speed and high-integrated semiconductor devices.

(c) According to the film forming sequence of this embodiment, the temperature of the wafer 200 in Step 3c is set to be equal to the temperature of the wafer 200 in Steps 1c and 2c. Accordingly, for example, when the cycle including Steps 1c, 2c and 3c is performed a predetermined number of times, each step can be performed without making temperature adjustment en route. Accordingly, the time required for increasing or decreasing the temperature of the wafer 200 can be saved to reduce processing time per one cycle and hence total processing time.

(3) Modifications

Next, modifications of this embodiment will be described.

As shown in FIG. 8B, in one modification, for the SiOC layer modifying process, a modifying gas containing C and N may be used instead of the modifying gas containing N. As the C and N-containing modifying gas, a gas including a C-containing gas and an N-containing gas may be used. For example, a $C_3H_6$ gas and a $NH_3$ gas may be plasma-excited and supplied to the wafer 200 in parallel. In this case, the $C_3H_6$ gas may be indirectly excited in the process chamber 201 by plasma of the $NH_3$ gas supplied into the process chamber 201. Alternatively, as the C and N-containing modifying gas, for example, an amine-based gas may be plasma-excited and supplied to the wafer 200. In this case, the amine-based gas may be supplied from a nozzle installed outside of the buffer chamber 237 but within the process chamber 201 and may be indirectly excited in the process chamber 201 by an assist gas such as an $N_2$ gas supplied into the process chamber 201. Accordingly, a SiOCN film further containing C and N can be obtained.

In another modification, for the SiOC layer modifying process, a modifying gas containing C may be used instead of the modifying gas containing N. As the C-containing modifying gas, for example, a $C_3H_6$ gas may be indirectly plasma-excited by an assist gas and supplied to the wafer 200. Accordingly, a SiOC film further containing C can be obtained.

In still another modification, for the SiOC layer modifying process, as the C-containing modifying gas, instead of supplying a plasma-excited $C_3H_6$ gas to the wafer 200, a non-plasma-excited $C_3H_6$ gas may be supplied to the wafer 200, along with a pyridine gas as a catalyst gas. When the non-plasma-excited $C_3H_6$ gas and the pyridine gas are supplied together, under the condition of low temperature of, for example, 150 degrees C. or less, the $C_3H_6$ gas can be activated and modification of the SiOC layer can be performed by the activated $C_3H_6$ gas. In addition, the temperature of the wafer 200 in the SiOC layer modifying process may be equal to the temperature of the wafer 200 in the SiOC layer forming process and processing time per one cycle can be reduced.

In these modifications, the process conditions such as the internal pressure of the process chamber 201, supply amount and supply time of gases such as the modifying gas and the $N_2$ gas, the temperature of the wafer 200, and so on may be the same as the process conditions for the above-described sequence of FIGS. 7 and 8A. If a catalyst gas is used, a flow rate of the catalyst gas may be set to fall within a range of 1 to 2000 sccm, more specifically 10 to 1000 sccm. When each gas is supplied, like the above embodiment, supply of the $N_2$ gas is performed to prevent each gas from being introduced into the nozzles 249a to 249d and buffer chamber 237 that are not in current use.

In the second embodiment and its modification, the cycle including the processes of supplying several kinds of gases to the wafer 200 sequentially is performed a predetermined number of times. However, like the first embodiment, by performing a set including the same steps as Steps 1a and 2a a predetermined number of times, the SiOC film may be first formed on the wafer 200. Then, a modifying gas may be plasma-excited and supplied to the wafer 200 or a $C_3H_6$ gas as a modifying gas, along with a pyridine gas, may be supplied to the wafer 200. In this manner, the SiOC film may be modified into a SiOC film or a SiOCN film further containing C and/or N. Even in this case, the process conditions may be the same process conditions as the sequence of FIGS. 7 and 8A.

However, in the case where the SiOC film is modified by supplying the $C_3H_6$ gas, along with the pyridine gas, to the wafer 200, the temperature of wafer 200 may be set to be higher than the temperature of the wafer 200 in the SiOC film forming process. Specifically, the temperature of the wafer 200 may be set to be equal to the temperature of the wafer 200 in the SiOC film modifying process of the first embodiment. If the temperature of the wafer 200 in the SiOC film modifying process is approximately equal to the temperature of the wafer 200 in the SiOC film forming process of the sequence shown in FIGS. 4 and 5A, although an effect of modifying at least a surface of the SiOC film may be achieved, there is a possibility that the modification by the $C_3H_6$ gas is not performed for the entire film. When the temperature of the wafer 200 in the SiOC film modifying process is set to be higher than the temperature of the wafer 200 in the SiOC film forming process, the modification by the $C_3H_6$ gas can be performed for the entire SiOC film, thereby obtaining a more uniform thin film. In addition, water can be easily desorbed from the SiOC film and C can be easily introduced into pores of missing water.

In the case where the modifying gas is plasma-excited and supplied to the wafer 200 to modify the SiOC film, the temperature of the wafer 200 may be set to be equal to the temperature of the wafer 200 in the same steps as Steps 1a and 2a. Since the plasma-excited modifying gas remains more active, the modification of the modifying gas can be performed for the entire SiOC film even at low temperatures. However, even in the case where plasma is used, the temperature of the wafer 200 may be set to be higher than the temperature of the wafer 200 in the same steps as Steps 1a and 2a or may be set to 500 degrees C. or less. As the temperature of the wafer 200 is increased with the upper limit of 500 degrees C., water can be easily desorbed from the SiOC film and C and N can be easily introduced into pores of missing water. If the temperature of the wafer 200 exceeds 500 degrees C., the effects of water desorption and introduction of C and N may not be enhanced any longer. Accordingly, when the temperature of the wafer 200 is set to 500 degrees C. or less, the effect of water desorption from the SiOC film and introduction of C and N into the SiOC film can be enhanced without deteriorating thermal history of the wafer 200. In particular, when the temperature of the wafer 200 is set to 300 to 500 degrees C., more specifically 300 to 400 degrees C., this effect can be further enhanced.

Third Embodiment

Next, a third embodiment of the present disclosure will be described.
(1) Film Forming Process It has been illustrated in the above embodiments that the precursor gas serving as the Si source and the C source, such as the BTCSM gas or the like, is used to form the SiOC film and the SiOC film is modified by the modifying gas. In the third embodiment, a precursor gas serving as a Si source but not a C source is used to form a SiO film and the SiO film is modified by a modifying gas. In the third embodiment, like the first and second embodiments, the substrate processing apparatus shown in FIGS. 1 and 2 is used. In the following description, operation of various components constituting the substrate processing apparatus is controlled by the controller 121.

Figure 10A:
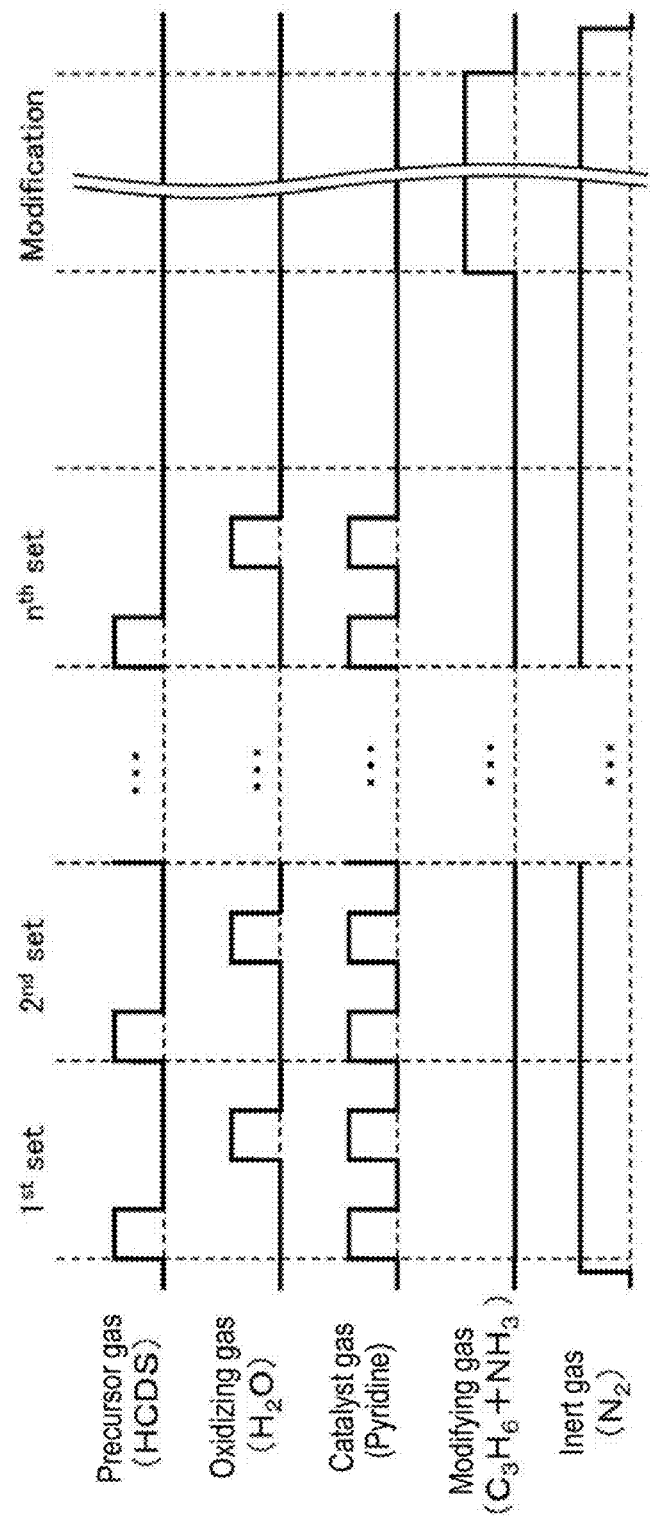
FIGS. 10A and 10B are views illustrating gas supply timings in the film forming sequence and gas supply timings in a modification of the film forming sequence, respectively, according to the third embodiment.

As shown in FIGS. 9 and 10A, in the third embodiment, an example will be described in which a SiO film as a first film containing Si and O is formed on the wafer 200 by performing a set a predetermined number of (n) times, the set including: supplying an HCDS gas containing Si and a halogen element, as a precursor gas serving as a Si source but not a C source, and a pyridine gas as a first catalyst gas, to the wafer 200 (Step 1d); and supplying a $H_2O$ gas as an oxidizing gas and the pyridine gas as a second catalyst gas to the wafer 200 (Step 2d), and the SiO film is modified into a SiOCN film as a second film further containing C and N by supplying a $C_3H_6$ gas and an $NH_3$ gas containing C and N, as a modifying gas containing at least one selected from the group consisting of C and N, to the wafer 200.
(SiO Film Forming Process)

Like the first and second embodiments, after performing wafer charge, boat load, pressure adjustment and temperature adjustment, the following steps, i.e., Step 1d and 2d, are sequentially performed.
[Step 1d]
(Supply of HCDS Gas and Pyridine Gas)

The valve 243d is opened to allow HCDS gas to flow into the gas supply pipe 232e. A flow rate of the HCDS gas is regulated by the MFC 241e. The HCDS gas with its flow rate regulated is supplied from the gas supply holes 250a into the process chamber 201 and is exhausted from the exhaust pipe 231. At this time, the HCDS gas is supplied to the wafer 200 (HCDS gas supply). At the same time, the valve 243g is opened to allow an inert gas such as an $N_2$ gas to flow into the gas supply pipe 232g. A flow rate of the $N_2$ gas is regulated by the MFC 241g. The $N_2$ gas with its flow rate regulated is supplied into the process chamber 201, along with the HCDS gas, and is exhausted from the exhaust pipe 231.

Like the above-described supply of pyridine gas, the pyridine gas is supplied to the wafer 200. When each gas is supplied, like the first and second embodiments, supply of the $N_2$ gas is performed to prevent each gas from being introduced into the nozzles 249b and 249d and buffer chamber 237 that are not in current use.

In this manner, when the HCDS gas is supplied to the wafer 200, a Si-containing layer containing C and having a thickness of, for example, less than one atomic layer to several atomic layers is formed as a first layer on a surface (base layer) of the wafer 200. The Si-containing layer containing C may be a Si layer containing C, an HCDS gas adsorption layer, or both.

The Si layer containing C generally refers to a continuous or discontinuous layer made of Si and containing C, or a Si thin film containing C and formed by laminating these continuous and discontinuous layers. The continuous layer made of Si and containing C may be sometimes referred to as a Si thin film containing C. Si in the Si layer containing C also includes not only one which is not completely decoupled from Cl but also one which is completely decoupled from Cl.

The HCDS gas adsorption layer includes an HCDS gas molecule continuous adsorption layer and an HCDS gas molecule discontinuous adsorption layer. That is, the HCDS gas adsorption layer includes an adsorption layer having a thickness of one molecular layer or less constituted by HCDS molecules. The HCDS ($Si_2Cl_6$) molecules constituting the HCDS gas adsorption layer include those in which Si is partially decoupled from Cl. That is, the HCDS gas adsorption layer includes an HCDS molecular chemical adsorption layer and an HCDS molecular physical adsorption layer.

The pyridine gas serving as the catalyst gas weakens an O—H bonding force of the surface of the wafer 200 to accelerate the dissociation of the HCDS gas and promote the formation of the first layer by molecular chemical adsorption. That is, for example, the pyridine gas serving as the catalyst gas acts on the O—H bonding existing on the surface of the wafer 200 to weaken the O—H bonding force. When hydrogen (H) with the weakened bonding force reacts with Cl of the HCDS gas, a hydrogen chloride (HCl) gas is generated and desorbed and HCDS molecules (halide) without Cl are chemisorbed on the surface of the wafer 200. That is, an HCDS gas chemical adsorption layer is formed on the surface of the wafer 200. In this manner, the pyridine gas as the catalyst gas for the HCDS gas shows the same catalyst action as the precursor gas as the Si source and the C source, such as the above-described BTCSM gas.

At this time, the process conditions such as the internal pressure of the process chamber 201, supply amount and supply time of gases such as the precursor gas, the catalyst gas and the $N_2$ gas, the temperature of the wafer 200, and so on may be the same as the process conditions for the above-described sequence of FIGS. 4 and 5A.

(Residual Gas Removal)

After the Si-containing layer containing Cl is formed as the first layer on the wafer 200, the valve 243e is closed to stop the supply of the HCDS gas. In addition, in the same order as the first and second embodiments, the supply of the pyridine gas is stopped and the residual gas is removed from the process chamber 201.

Examples of the precursor gas serving as the Si source but not the C source may include chlorosilane-based precursor gases containing no C in gas molecules, such as a silicon tetrachloride ($SiCl_4$, abbreviation: STC) gas, a trichlorosilane ($SiHCl_3$, abbreviation: TCS) gas, a dichlorosilane ($SiH_2Cl_2$, abbreviation: DCS) gas, a monochlorosilane ($SiH_3Cl$, abbreviation: MCS) gas and the like, as precursor gases containing Si and a halogen element, in addition to the HCDS gas.

Examples of the catalyst gas may include the above-mentioned various amine-based catalyst gases, in addition to the pyridine gas. Examples of the inert gas may include the above-mentioned various rare gases, in addition to the $N_2$ gas.

[Step 2d]
(Supply of $H_2O$ Gas and Pyridine Gas)

After Step 1d is completed to remove the residual gas from the process chamber 201, in the same order as the first and second embodiments, a $H_2O$ gas and a pyridine gas are supplied to the wafer 200. When the $H_2O$ gas and the pyridine gas are supplied, like the first and second embodiments, supply of the $N_2$ gas is performed to prevent each gas from being introduced into the nozzles 249a and 249d and buffer chamber 237 that are not in current use.

When the $H_2O$ gas activated by heat is supplied to the wafer 200, the $H_2O$ gas reacts with at least a portion of the first layer (the Si-containing layer containing Cl) formed on the wafer 200 in Step 1d and the first layer can be thermally oxidized with non-plasma and changed into a second layer containing Si and O, that is, a SiO layer.

The pyridine gas as the catalyst gas acts on an O—H bonding of the $H_2O$ gas to weaken an O—H bonding force of the $H_2O$ gas. When H with the weakened bonding force reacts with Cl contained in the first layer formed on the wafer 200, a HCl gas is generated and desorbed, and the O in the $H_2O$ gas, which lost H, is combined with Si in the first layer from which Cl is desorbed. In this manner, the pyridine gas as the catalyst gas for modification of the Si-containing layer containing Cl shows the same catalyst action as the above-described modification of the Si-containing layer containing C and Cl.

At this time, the process conditions such as the internal pressure of the process chamber 201, supply amount and supply time of gases such as the oxidizing gas, the catalyst gas and the $N_2$ gas, the temperature of the wafer 200, and so on may be the same as the process conditions for the above-described sequence of FIGS. 4 and 5A.

For example, even under the condition of low temperature of 150 degrees C. or less, a SiO layer containing a relatively large amount of water ($H_2O$) and a SiO film formed of a stack of the SiO layers can be easily formed. The water contained in the SiO layer and the SiO film is derived from, for example, the $H_2O$ gas used as the oxidizing gas.

(Residual Gas Removal)

After the second layer is formed on the wafer 200, in the same order as the first and second embodiments, the supply of the HCDS gas and the pyridine gas is stopped and the residual gas is removed from the process chamber 201.

Examples of the oxidizing gas may include the above-described various gases, in addition to the $H_2O$ gas. Examples of the catalyst gas may include the above-mentioned various amine-based catalyst gases, in addition to the pyridine gas. Examples of the inert gas may include the above-mentioned various rare gases, in addition to the $N_2$ gas.

(Performance of Predetermined Number of Times)

When one set including the above-described Steps 1d and 2d is performed one or more times (i.e., a predetermined number of (n) times), it is possible to form a SiO film having a predetermined composition and a predetermined film thickness, as a first film, on the wafer 200. The one set may be repeated several times. That is, a thickness of a SiO layer formed per one set may be set to be smaller than a desired thickness and the one set is repeated several times until the SiO layer reaches the desired thickness.

At this time, when process conditions such as the internal pressure of the process chamber 201, gas supply time and so on in each step are controlled, percentages of element components (i.e., Si and O components) in the SiO layer, that is, concentrations of Si and O components, can be adjusted and a composition ratio of the SiO film can be controlled.

(SiO Film Modifying Process)

As described above, when the HCDS gas containing no C in the gas molecules is used as the precursor gas, the above-described SiO film is formed without containing at least C derived from the precursor gas. In the SiO film modifying process, as a modifying gas containing C and N, a $C_3H_6$ gas as a C-containing gas and an $NH_3$ gas as an N-containing gas are used to modify the SiO film.

(Supply of $C_3H_6$ Gas and $NH_3$ Gas)

After performing pressure adjustment and temperature adjustment in the same order as the first embodiment, a $C_3H_6$ gas and an $NH_3$ gas are supplied to the wafer 200 in the same order as the above-described supply of the $C_3H_6$ gas and the $NH_3$ gas.

When the $C_3H_6$ gas and the $NH_3$ gas activated by heat is supplied to the wafer 200, the $C_3H_6$ gas and the $NH_3$ gas react with at least a portion of the first film (the SiO film)

formed on the wafer 200 by performing Steps 1d and 2d a predetermined number of times. Accordingly, the first film can be thermally modified with non-plasma and changed into a second film containing Si, O, C and N, that is, a SiOCN film.

At this time, by setting the temperature of the wafer 200 to a relatively high temperature, reaction of the $C_3H_6$ gas and the $NH_3$ gas with the SiO film is promoted so that C and N components can be introduced into the SiO film. In addition, by setting the temperature of the wafer 200 to be higher than the temperature of the wafer 200 in the above-described SiO film forming process, as described above, if the SiO film contains a large amount of water, the water is easily desorbed from the film. Minute pores (or spaces) are produced in portions of missing water in the SiO film, thereby making the SiO film porous. As C and N enter the pores without water, the C and N components are even more likely to be introduced into the SiO film and accordingly the modification may be performed on substantially the entire SiO film. At this time, at least a portion of C and N components introduced into the SiO film may form a Si—C bonding or Si—N bonding with Si in the film.

Figure 5B:
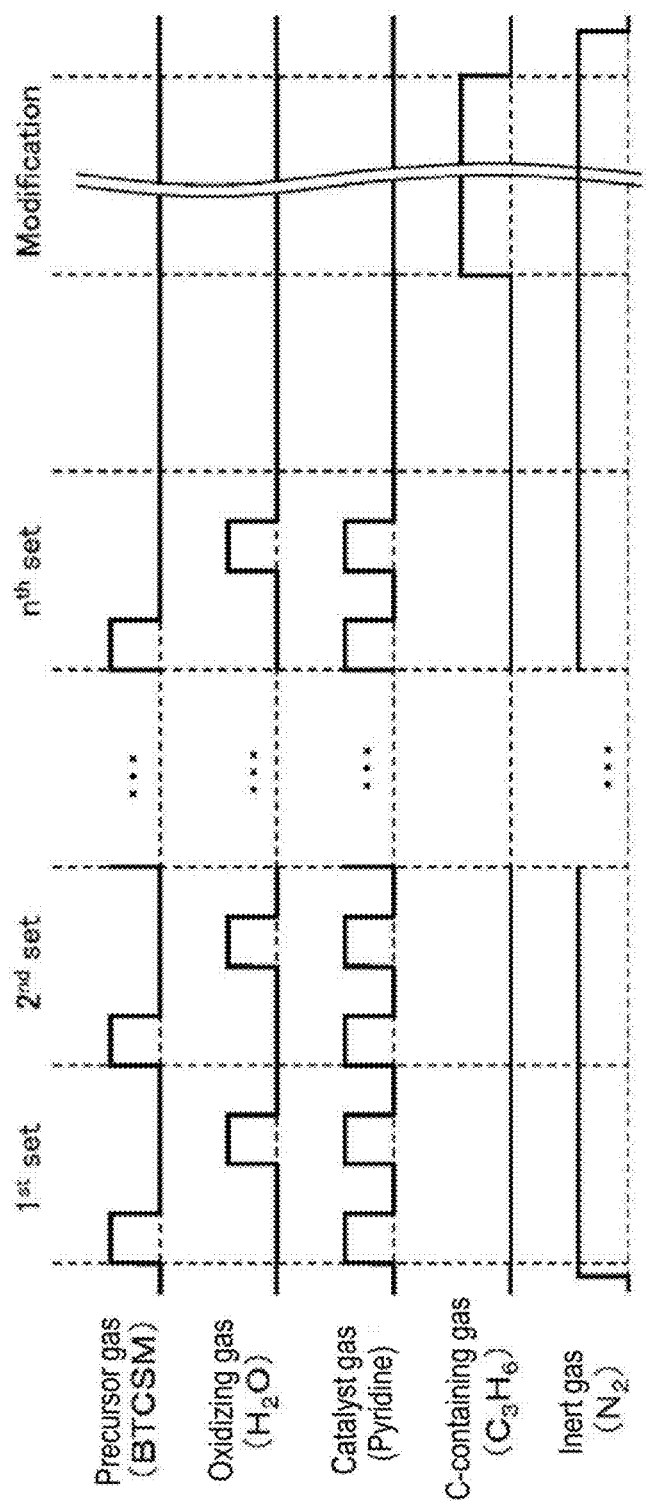

At this time, the process conditions such as the internal pressure of the process chamber 201, supply amount and supply time of gases such as the modifying gas and the $N_2$ gas, the temperature of the wafer 200, and so on may be the same as the process conditions for the above-described sequence of FIGS. 4 and 5B. In addition, when the $C_3H_6$ gas and $NH_3$ gas are supplied, like the above embodiments, supply of the $N_2$ gas is performed to prevent each gas from being introduced into the nozzles 249a and 249b that are not in current use.

(Residual Gas Removal and Purge)

After the SiOCN film as the second film is formed on the wafer 200, the supply of the $C_3H_6$ gas and the $NH_3$ gas is stopped in the same order as the above-described sequence of FIGS. 4, 5A and 5B. At this time, removal of the residual gas from the process chamber 201 and purge of the interior of the process chamber 201 are performed in the same order as the above embodiments.

Thereafter, return to atmospheric pressure, boat unload and wafer discharge are performed in the same order as the above-described sequence of FIGS. 4 and 5A and then the film forming process of this embodiment is ended.

Examples of the C and N-containing modifying gas may include the above-described various C-containing gases and N-containing gases and the above-described various amine-based gases, in addition to the $C_3H_6$ gas and the $NH_3$ gas.

Figure 10B:
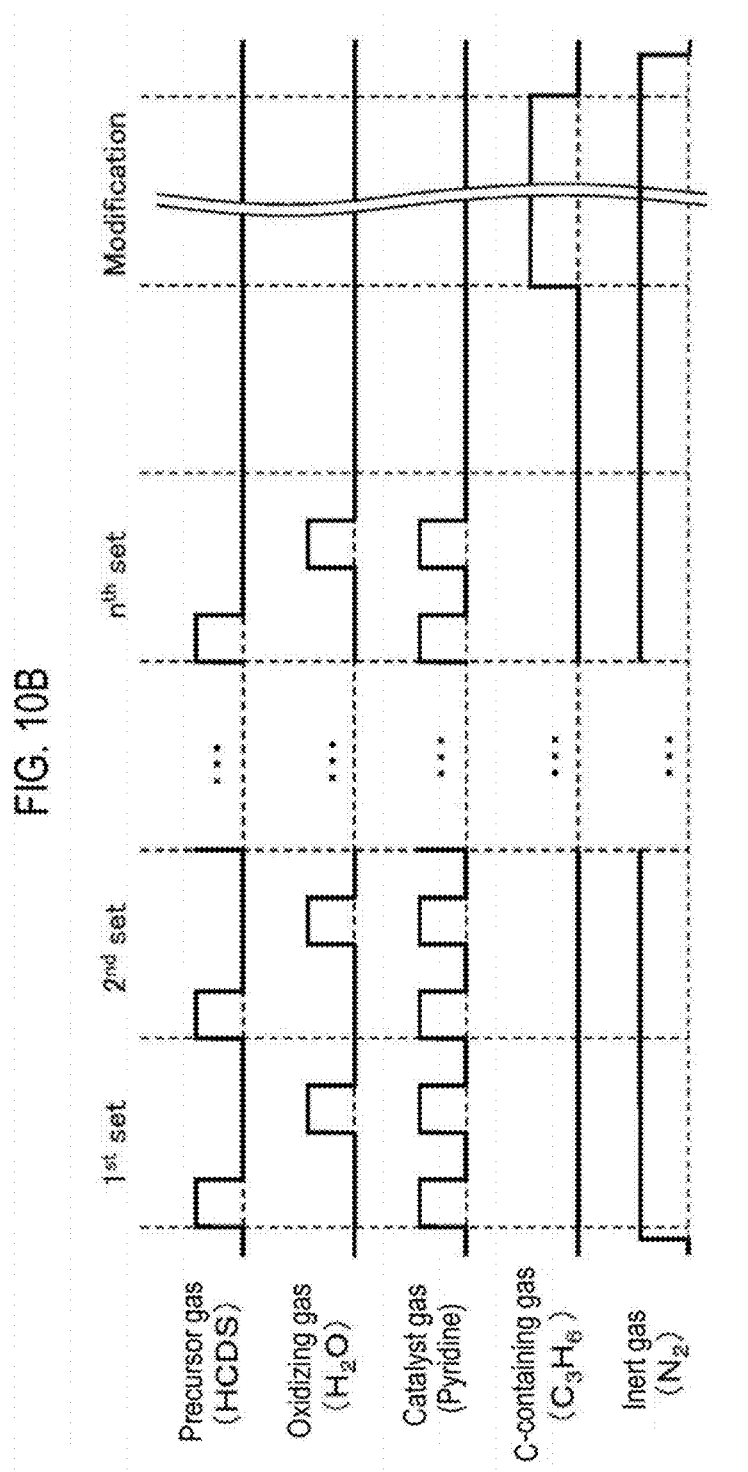

Although it has been illustrated in the above that the C and N-containing modifying gas is used to form the SiOCN film, for example, like a modification shown in FIG. 10B, a C-containing modifying gas such as a $C_3H_6$ gas may be thermally activated and used instead of the C and N-containing modifying gas. Accordingly, the SiO film can be modified into a SiOC film containing Si, O and C. In addition, an N-containing modifying gas such as an $NH_3$ gas may be thermally activated and used instead of the C and N-containing modifying gas. In this manner, the SiO film can be also modified by the N-containing modifying gas into a SiON film containing Si, O and N. The SiON film may be also referred to as an N-containing SiO film or an N-doped (added) SiO film. In these cases, the process conditions may be the same as the process conditions in the sequence of FIGS. 9 and 10A.

(2) Certain Advantages

The third embodiment provides one or more advantages as follows, in addition to the advantages of the first and second embodiments.

(a) According to the film forming sequence of this embodiment, after forming the SiO film in Steps 1d and 2d, the SiO film is modified into the SiOCN film by the C and N-containing modifying gas. Accordingly, a chlorosilane-based precursor gas containing no C in gas molecules may be used to obtain the SiOCN film. That is, a simpler and cheaper gas system may be used to obtain a thin film having a high etching resistance and a high ashing resistance.

(b) According to the film forming sequence of this embodiment, after forming the SiO film in Steps 1d and 2d, the SiO film is modified into the SiOCN film by the C-containing modifying gas. At this time, for example, by lengthening the SiO film modifying process time, it is also possible to obtain a SiOC film having the C concentration higher than that in the SiOC film formed by using the above-described precursor gas as the Si source and the C source. In this manner, by increasing the C concentration in the film, it is possible to keep the C concentration in the film high after ashing and provide a thin film having a high ashing resistance. Accordingly, a simpler and cheaper gas system may be used to obtain a thin film having a high etching resistance and a high ashing resistance.

(3) Modifications

Next, modifications of this embodiment will be described.

Figure 11:
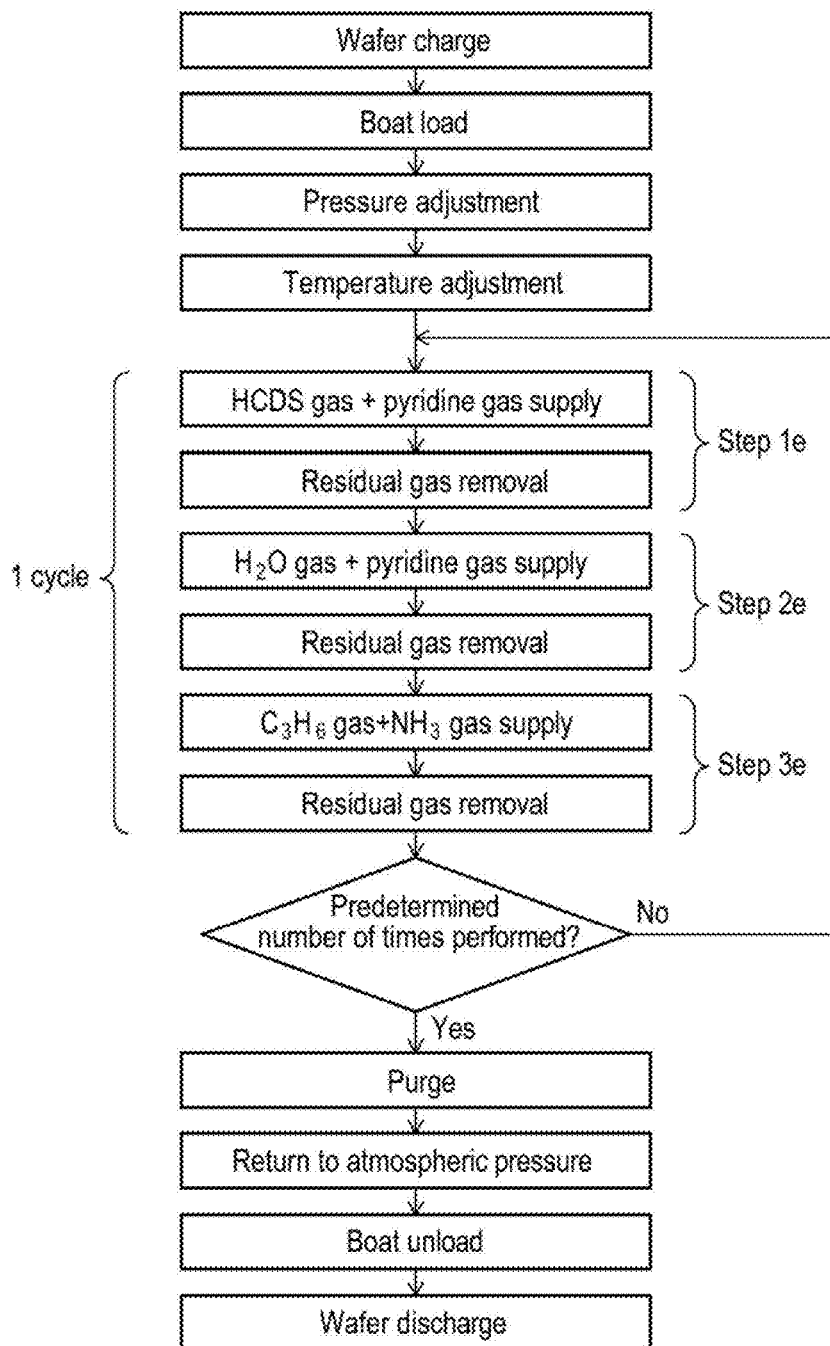
FIG. 11 is a view illustrating a flow of film formation in another modification of the film forming sequence according to the third embodiment.
Figure 12A:
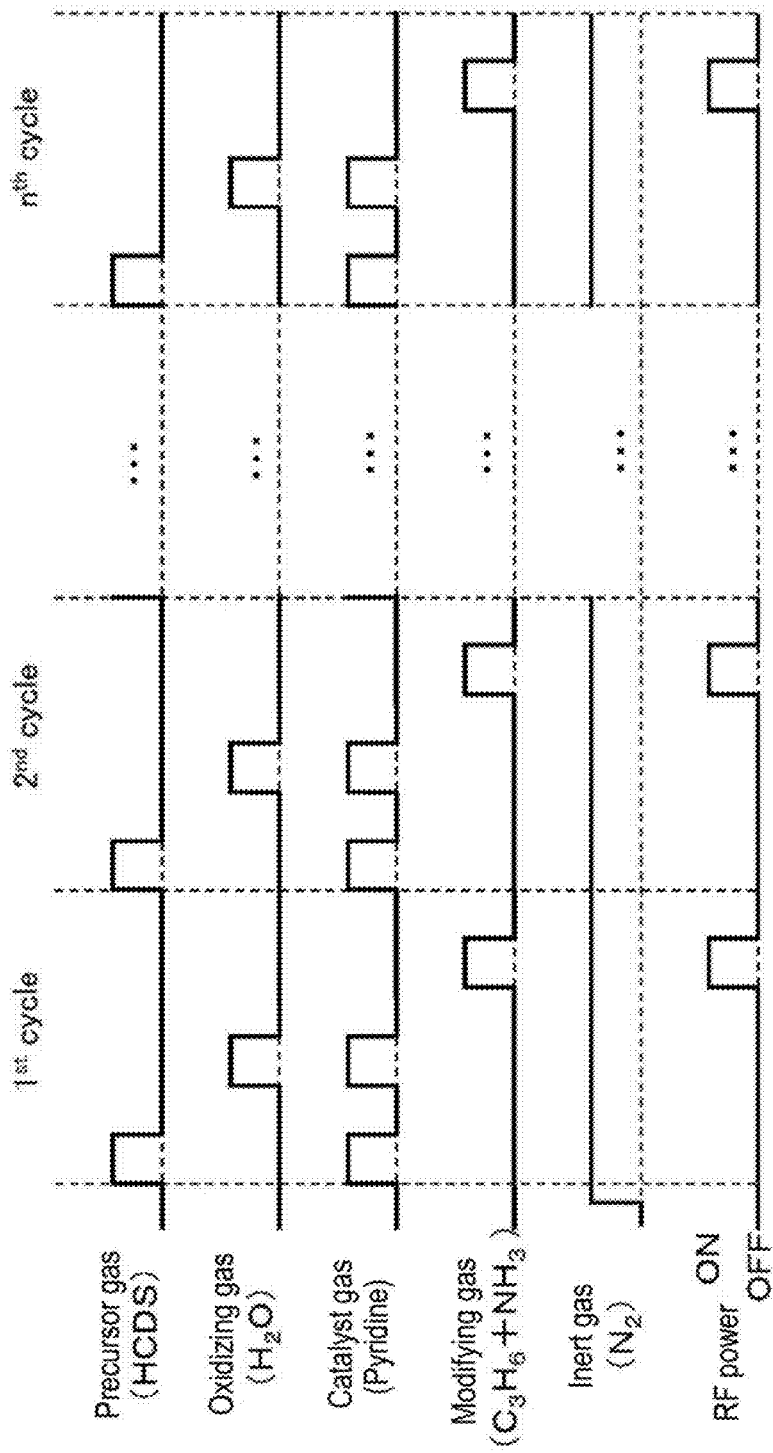

In addition to the modification shown in FIG. 10B, as shown in FIGS. 11 and 12A, in a different modification, the $C_3H_6$ gas and the $NH_3$ gas are plasma-excited to modify the SiO layer.

That is, a SiOCN film as a thin film containing Si, O, C and N may be formed on the wafer 200 by performing a cycle a predetermined number of times, the cycle including: supplying an HCDS gas as a precursor gas and a pyridine gas as a first catalyst gas to the wafer 200 (Step 1e); supplying a $H_2O$ gas as an oxidizing gas and the pyridine gas as a second catalyst gas to the wafer 200 (Step 2e); and supplying a $C_3H_6$ gas and an $NH_3$ gas, as a C and N-containing gas, to the wafer 200, with the $C_3H_6$ gas and the $NH_3$ gas plasma-excited (Step 3e).

The $NH_3$ gas can be easily plasma-excited in itself and remains activated in plasma. It is difficult to plasma-excite the $C_3H_6$ gas alone, but it may be activated in plasma when it is indirectly excited in the process chamber 201 by plasma of the $NH_3$ gas supplied into the process chamber 201. In this manner, the SiO layer formed on the wafer 200 in Steps 1e and 2e can be modified by the activated $C_3H_6$ and $NH_3$ gases into a SiOCN layer.

Examples of the C and N-containing modifying gas may include the above-described various C-containing gases and N-containing gases and the above-described various amine-based gases, in addition to the $C_3H_6$ gas and the $NH_3$ gas. If it becomes difficult to plasma-excite the selected amine-based gas alone, the amine-based gas may be plasma-excited using an assist gas.

In addition, as shown in FIG. 12B, in another modification of this embodiment, instead of the $C_3H_6$ gas and the $NH_3$ gas, a $C_3H_6$ gas may be plasma-excited to modify the SiO layer into a SiOC layer. At this time, an assist gas may be used, as will be described later. In addition, in still another modification of this embodiment, instead of the $C_3H_6$ gas and the $NH_3$ gas, a $NH_3$ gas may be plasma-excited to modify the SiO layer into a SiON layer. In this manner, a SiON film containing Si, O and N can be formed by using an N-containing modifying gas.

As described above, it could be difficult to plasma-excite the $C_3H_6$ gas alone. On the other hand, for example, a $N_2$ gas has relatively low ionization energy and can be easily plasma-excited by itself. The $N_2$ gas is used as an assist gas that assists plasma ignition. That is, at the same time of starting the supply of the $C_3H_6$ gas, the valve 243j is opened to allow the $N_2$ gas to flow into the gas supply pipe 232j. A flow rate of the $N_2$ gas is regulated by the MFC 241j. The $N_2$ gas with its flow rate regulated is supplied from the gas supply holes 250d into the buffer chamber 237. The $N_2$ gas is plasma-excited when high-frequency (RF) power is applied between the rod-shaped electrodes 269 and 270. As the $C_3H_6$ gas supplied into the process chamber 201 is indirectly excited by plasma of the $N_2$ gas supplied into the process chamber 20, the $C_3H_6$ gas is activated in plasma. At this time, for example, the supply of the $N_2$ gas may be started earlier than the supply of the $C_3H_6$ gas. That is, the plasma-excited $NH_3$ gas is first supplied into the process chamber 201 and then the $C_3H_6$ gas may be supplied. Accordingly, the $C_3H_6$ gas is supplied under the plasma-excited $N_2$ gas atmosphere and can be more easily plasma-excited. In addition, the $N_2$ gas may act as an assist gas that assists dissociation of the $C_3H_6$ gas in plasma.

The SiO layer can be modified by the activated $C_3H_6$ gas into the SiOC layer. When the SiO layer is modified by the $C_3H_6$ gas activated in plasma, for example, it is possible to obtain a SiOC layer or a SiOC film having the C concentration even higher than that in the SiOC film obtained by the above-described thermally-activated $C_3H_6$ gas.

Examples of the assist gas that assists plasma ignition may include rare gases such as an Ar gas, a He gas, a Ne gas, a Xe gas and the like, in addition to the $N_2$ gas.

In addition, in still another modification of this embodiment, the $C_3H_6$ gas may be supplied to the wafer 200, along with a pyridine gas as a catalyst gas, to modify the SiO layer. The SiO layer can be modified by the $C_3H_6$ gas activated by the pyridine gas into a SiOC layer.

In these modifications, the process conditions such as the internal pressure of the process chamber 201, supply amount and supply time of gases such as the modifying gas and the $N_2$ gas, the temperature of the wafer 200, and so on may be the same as the process conditions for the above-described sequence of FIGS. 7, 8A and 8B. A flow rate of the $N_2$ gas as the assist gas may be set to fall within a range of, for example, 100 to 10000 sccm. When each gas is supplied, like the above embodiments, supply of the $N_2$ gas is performed to prevent each gas from being introduced into the nozzles 249a to 249d and the buffer chamber 237 that are not in current use.

In these modifications, the cycle including the processes of supplying several kinds of gases to the wafer 200 sequentially is performed a predetermined number of times. However, like the above-described sequence shown in FIGS. 9 and 10A, by performing a set including the same steps as Steps 1d and 2d a predetermined number of times, the SiO film may be first formed on the wafer 200. Then, the modifying gas may be plasma-excited and supplied to the wafer 200 or the $C_3H_6$ gas as the modifying gas, along with the pyridine gas, may be supplied to the wafer 200. In this manner, the SiO film may be modified into a SiOC film or SiOCN film further containing C and/or N. When the SiO film is modified by the plasma-excited modifying gas, the temperature conditions may be set to be equal to the temperature conditions in the above-described Steps 1d and 2d and the temperature of the wafer 200 may be set to, for example, 500 degrees C. or less. When the SiO film is modified by the $C_3H_6$ gas activated by the catalyst gas, the temperature conditions may be set to be equal to the temperature conditions in the modifying process of the above-described sequence shown in FIGS. 9, 10A and 10B.

Other Embodiments

Although the specific embodiments of the present disclosure have been described in detail, the present disclosure is not limited thereto but may be changed in different ways without departing from the spirit and scope of the present disclosure.

For example, although it has been illustrated in the first embodiment that the cycle including performing Steps 1a and 2a a predetermined number of times and modifying the SiOC film is performed once, the cycle may be repeated several times. In addition, although it has been illustrated in the second embodiment that the cycle including performing Steps 1c, 2c and 3c sequentially one by one is performed a predetermined number of times, a cycle including repeating Steps 1c and 2c several times and performing Step 3c may be performed a predetermined number of times. This may be applied to the third embodiment where the cycle including performing Steps 1d and 2d a predetermined number of times and modifying the SiOC film and the modification thereof where the cycle including performing Steps 1e, 2e and 3e sequentially one by one is performed a predetermined number of times.

It has been illustrated in the above embodiments that the modifying gas supplying process is performed separately from the precursor gas and oxidizing gas supplying process. However, the modifying gas supplying process may be performed during the precursor gas and catalyst gas supplying process or during the oxidizing gas and catalyst gas supplying process. In addition, the modifying gas supplying process may be inserted between the precursor gas and catalyst gas supplying process and the oxidizing gas and catalyst gas supplying process. In this case, the process conditions may be the same as the process conditions in the sequence of FIGS. 7 and 8A.

It has been illustrated in the above embodiments that the $C_3H_6$ gas is supplied from the nozzle 249c installed outside of the buffer chamber 237 into the process chamber 201 without passing through the buffer chamber 237. However, the $C_3H_6$ gas may be supplied from a nozzle installed within the buffer chamber 237 into the process chamber 201 through the buffer chamber 237. In this case, the $C_3H_6$ gas supplied into the buffer chamber 237 may be indirectly excited by plasma of an assist gas such as the $N_2$ gas.

It has been illustrated in the above embodiments that the chlorosilane-based precursor gas containing no C in gas molecules, such as the HCDS gas containing Si and a halogen gas, is used as a precursor gas serving as a Si source but not a C source. However, the precursor gas serving as a Si source but not a C source is not limited thereto. For example, an aminosilane-based precursor gas containing Si and an amino group (amine group) may be used as a precursor gas containing Si, C and N and having a Si—N bonding. The aminosilane-based precursor gas is a silane-based precursor gas containing an amino group and is also an organic precursor gas containing an amino group including at least Si, C and N. The aminosilane-based precursor gas contains C in gas molecules but has no Si—C bonding. Even when this type of precursor gas is used, C derived from the precursor gas is less likely to be introduced into the film as a component of the film to be formed. Examples of the aminosilane-based precursor gas may include a bis(tertiary-butylamino)silane ($SiH_2[NH(C_4H_9)]_2$, abbreviation:

BTBAS) gas, a tetrakis(dimethylamino)silane (Si[N(CH$_3$)$_2$]$_4$, abbreviation: 4DMAS) gas, a tris(dimethylamino)silane (Si[N(CH$_3$)$_2$]$_3$H, abbreviation: 3DMAS) gas, a bis(ethylmethylamino)silane (Si[N(C$_2$H$_5$)(CH$_3$)]$_2$H$_2$, abbreviation: BEMAS) gas, a bis(diethylamino)silane (Si[N(C$_2$H$_5$)$_2$]$_2$H$_2$, abbreviation: BDEAS) gas, and the like.

These aminosilane-based precursor gases may be used as precursor gases to form a SiO layer or SiO film, and then, a modifying process may be performed to form a SiOC film or a SiOCN film further containing C and/or N. The aminosilane-based precursor gas is supplied to the wafer 200 without supplying a catalyst gas such as a pyridine gas. Accordingly, a Si-containing layer is formed as a first layer. Thereafter, an oxygen (O)-containing gas as an oxidizing gas such as a plasma-excited O$_2$ gas is used to oxidize the first layer to obtain a SiO layer as a second layer. Using the plasma-excited O-containing gas as the oxidizing gas can be applied to a case where the above-mentioned alkylenhalosilane-based precursor gas, alkylhalosilane-based precursor gas or halosilane-based precursor gas (chlorosilane-based gas) is used as the precursor gas. However, in a case where the alkylenhalosilane-based precursor gas or the alkylhalosilane-based precursor gas is used as the precursor gas, high-frequency power needs to be set to have a low value when supplying the oxidizing gas. The reason for this is to allow the oxidation reaction to progress relatively smoothly in order to prevent C from desorbing from the SiOC layer or the SiOC film. Even when these aminosilane-based precursor gases are used, the process conditions may be the same as the process conditions in one of the sequences of the above embodiments.

Although it has been illustrated in the above embodiments that the particular SiOC film, SiOCN film or the like is formed as a film, a laminate of films having different compositions from these particular films or a laminate of these particular films and films having compositions different from compositions of these particular films may be formed. Examples of the laminated film may include a laminate of a SiOC film and a SiOCN film, a laminate of a SiO film and a SiOC film and a laminate of a SiO film and a SiOCN film. In this manner, by forming a plurality of laminated films having different etching resistances, different dielectric constants and different ashing resistances, it is possible to enhance controllability of the general characteristics of laminated films.

Although it has been illustrated in the above embodiments that silicon oxide films such as the SiO film and the SiOC film are modified, the present disclosure is not limited thereto but may be applied to a silicon nitride film such as a SiN film. A SiN film formed at a low temperature contains oxygen as impurities and may be modified to improve its film quality.

When the films formed according to the methods of the above embodiments and modifications are used as a sidewall spacer, it is possible to provide device forming techniques with a small leak current and excellent workability.

In addition, when the films formed according to the methods of the above embodiments and modifications are used as an etching stopper, it is possible to provide device forming techniques with excellent workability.

According to the above embodiments and modifications except the second embodiment, its modifications and the modifications of the third embodiment, it is possible to form a film having an ideal stoichiometry without using plasma. In addition, since the film can be formed without using plasma, the above embodiments and modifications may be applied to processes which are concerned about plasma damage, such as, for example, forming a SADP film of DPT.

The modifying processes of the above embodiments are not limited to Si-based films such as the SiOC film and the SiOCN film but may be applied to a metal-based film such as a metal carbide film and a metal oxycarbide film containing C and metal elements such as, for example, titanium (Ti), zirconium (Zr), hafnium (Hf), tantalum (Ta), aluminum (Al), molybdenum (Mo) and the like.

In addition, a plurality of process recipes (programs describing process procedures and process conditions) used to form these various kinds of films may be individually prepared according to contents (kind, composition ratio, quality, thickness of films to be formed) of substrate processing. In addition, at the start of the substrate processing, an appropriate process recipe from the plurality of process recipes may be selected according to the substrate processing contents. Specifically, the plurality of process recipes individually prepared according to the substrate processing contents may be stored (installed) in the memory device 121c of the substrate processing via a telecommunication line or a recording medium (the external memory device 123) storing the process recipes. In addition, at start of the substrate processing, the CPU 121a of the substrate processing apparatus may select an appropriate process recipe from the plurality of process recipes stored in the memory device 121c, according to the substrate processing contents.

This configuration allows a single substrate processing apparatus to form films having different composition ratios, qualities and thicknesses for general purposes and with high reproducibility. In addition, this configuration can reduce operation burden (a burden on input of process procedures and process conditions) of an operator, thereby avoiding a manipulation error and starting the substrate processing quickly.

The above-mentioned process recipes may be prepared, for example by modifying existing process recipes already installed in the substrate processing apparatus, without being limited to newly prepared ones. When the process recipes are modified, the modified process recipes may be installed in the substrate processing apparatus via a telecommunication line or a recording medium storing the process recipes. In addition, the existing process recipes already installed in the substrate processing apparatus may be directly modified by operating the input/output device 122 of the substrate processing apparatus.

In the film forming sequences of the above embodiments, examples of forming the SiOC film, the SiO film and the like and modifying these films at room temperature has been also described. In this case, there is no need to heat the interior of the process chamber 201 with the heater 207. Accordingly, no heater may be installed in the substrate processing apparatus. Accordingly, since a heating system of the substrate processing apparatus can be simplified, the substrate processing apparatus can be constructed with a cheaper and simpler structure. In this case, when the SiOC film or the SiO film is modified at a high temperature, the modifying process may be performed ex-situ in a process chamber different from a process chamber where the SiOC film or the SiO film is formed.

In addition, although it has been described in the above embodiments that the batch type substrate processing apparatus to process a plurality of substrates at once is used to form the films, the present disclosure is not limited thereto but may be suitably applied to film formation using a single wafer type substrate processing apparatus to process a single substrate or several substrates at once. In addition, although it has been illustrated in the above embodiments that the substrate processing apparatus including the hot wall type treatment furnace is used to form the films, the present disclosure is not limited thereto but may be suitably applied to a case where a substrate processing apparatus including a cold wall type treatment furnace is used to form the films. Even in these substrate processing apparatuses, the process conditions may be the same as the process conditions in one of the sequences of the above embodiments.

In addition, the above embodiments and modifications thereof may be used in proper combinations.

Examples

As Examples and Comparative Examples of the present disclosure, the substrate processing apparatus of the above embodiments was used to form certain films on wafers and ashing resistance of these films was evaluated. As a first Example, a film (SiOC film) was formed according to the film forming sequence shown in FIG. 5B and was thermally modified. As a second Example, a film (SiOCN film) was formed according to the film forming sequence shown in FIGS. 4 and 5A and was thermally modified. As a third Example, a film (SiOCN film) was formed according to the film forming sequence shown in FIGS. 7 and 8A and was modified by plasma. As a Comparative Example, a film (SiOC film) was formed by performing only Steps 1a and 2a of the film forming sequence shown in FIGS. 4 and 5A a predetermined number of times and was not modified. After ashing these films using $O_2$ plasma, wet etching rates (WERs) by 1% HF aqueous solution were measured. For the comparative Example, WER before ashing was also measured.

FIG. 16 is a graph showing WERs of the films of Examples and the Comparative Example. In the graph, a vertical axis represents WER (a.u.) and a horizontal axis represents examples of evaluations, showing the Comparative Example (before ashing), the Comparative Example (after ashing), and first to third Examples (after ashing) in this order from the left side. It can be seen from FIG. 16 that the film of the Comparative Example (before ashing) which was not modified has a low WER but the film of the Comparative Example (after ashing) has a very high WER and hence a poor etching resistance. On the other hand, it can be seen that the modified films of first to third Examples have a low WER and hence a good etching resistance. It can be also seen that the film of first Example which was thermally modified to further contain C has a lower WER and hence a higher etching resistance than the film of the second Example which was thermally modified to further contain N. It can be also seen that the film of third Example which was modified by plasma has a lower WER and hence a higher etching resistance than the films of the first and second Examples which were thermally modified. It can be seen from the above observation that a film such as a SiOC film which was modified during or after forming the film has a high etching resistance and a high ashing resistance. In particular, it can be seen that a film modified by plasma has an even higher etching resistance and ashing resistance.

ADDITIONAL ASPECTS OF PRESENT DISCLOSURE

Hereinafter, some aspects of the present disclosure will be additionally stated.

(Supplementary Note 1)

An aspect of the present disclosure provides a method of manufacturing a semiconductor device, including: forming a thin film containing silicon, oxygen and carbon or a thin film containing silicon, oxygen, carbon and nitrogen on a substrate by performing a cycle a predetermined number of times, the cycle including: supplying a precursor gas serving as a silicon source and a carbon source or a precursor gas serving as a silicon source but no carbon source, and a first catalyst gas to the substrate; supplying an oxidizing gas and a second catalyst gas to the substrate; and supplying a modifying gas containing at least one selected from the group consisting of carbon and nitrogen to the substrate.

(Supplementary Note 2)

The act of supplying the precursor gas and the first catalyst gas and the act of supplying the oxidizing gas and the second catalyst gas are performed under a non-plasma atmosphere.

(Supplementary Note 3)

In the act of supplying the precursor gas and the first catalyst gas and the act of supplying the oxidizing gas and the second catalyst gas, a temperature of the substrate is set to a room temperature to 150 degrees C.

(Supplementary Note 4)

The cycle includes: forming a first film containing silicon, oxygen and carbon or a first film containing silicon and oxygen on the substrate by performing a set a predetermined number of times, the set including: supplying the precursor gas and the first catalyst gas; and supplying the oxidizing gas and the second catalyst gas; and modifying the first film into a second film further containing carbon, a second film further containing nitrogen or a second film further containing carbon and nitrogen by performing the act of supplying the modifying gas.

(Supplementary Note 5)

The act of forming the first film and the act of modifying the first film are performed under a state where the substrate is accommodated in the same process chamber.

(Supplementary Note 6)

The act of forming the first film and the act of modifying the first film are performed under a state where the substrate is accommodated in different process chambers.

(Supplementary Note 7)

The act of supplying the precursor gas and the first catalyst gas, the act of supplying the oxidizing gas and the second catalyst gas, and the act of supplying the modifying gas are performed in this order.

(Supplementary Note 8)

A temperature of the substrate in the act of supplying the modifying gas is set to be equal to a temperature of the substrate in the act of supplying the precursor gas and the first catalyst gas and the act of supplying the oxidizing gas and the second catalyst gas.

(Supplementary Note 9)

In the act of supplying the modifying gas, a temperature of the substrate is set to a room temperature to 500 degrees C.

(Supplementary Note 10)

In the act of supplying the modifying gas, a temperature of the substrate is set to 200 to 900 degrees C., more specifically 200 to 700 degrees C., or further more specifically 200 to 600 degrees C.

(Supplementary Note 11)

The act of supplying the modifying gas is performed under a non-plasma atmosphere.

(Supplementary Note 12)

In the act of supplying the modifying gas, the modifying gas is supplied to the substrate in a plasma-excited state.

(Supplementary Note 13)

Another aspect of the present disclosure provides a method of manufacturing a semiconductor device, including: forming a thin film containing silicon, oxygen and carbon or a thin film containing silicon, oxygen, carbon and nitrogen on a substrate by performing a cycle a predetermined number of times, the cycle including: supplying a precursor gas containing silicon, carbon and a halogen element and having a Si—C bonding, and a first catalyst gas to the substrate; supplying an oxidizing gas and a second catalyst gas to the substrate; and supplying a modifying gas containing at least one selected from the group consisting of carbon and nitrogen to the substrate.

(Supplementary Note 14)

The precursor gas contains at least one selected from the group consisting of an alkyl group and an alkylene group.

(Supplementary Note 15)

The precursor gas containing the alkylene group has at least one selected from the group consisting of a Si—C—Si bonding and a Si—C—C—Si bonding.

(Supplementary Note 16)

The modifying gas includes at least one selected from the group consisting of a carbon-containing gas, a nitrogen-containing gas and a gas containing carbon and nitrogen in one molecule.

(Supplementary Note 17)

Another aspect of the present disclosure provides a method of manufacturing a semiconductor device, including: forming a thin film containing silicon, oxygen and carbon or a thin film containing silicon, oxygen, carbon and nitrogen on a substrate by performing a cycle a predetermined number of times, the cycle including: supplying a precursor gas containing silicon and a halogen element, and a first catalyst gas to the substrate; supplying an oxidizing gas and a second catalyst gas to the substrate; and supplying a modifying gas containing at least one selected from the group consisting of carbon and nitrogen to the substrate.

(Supplementary Note 18)

The precursor gas includes a chlorosilane-based precursor gas containing silicon and chlorine (a chloro group).

(Supplementary Note 19)

The modifying gas includes at least one selected from the group consisting of a carbon-containing gas, both of a carbon-containing gas and a nitrogen-containing gas, and a gas containing carbon and nitrogen in one molecule.

(Supplementary Note 20)

The modifying gas includes at least one selected from the group consisting of a hydrocarbon-based gas, an amine-based gas and a non-amine-based gas.

(Supplementary Note 21)

The first and second catalyst gases include an amine-based catalyst gas.

(Supplementary Note 22)

Another aspect of the present disclosure provides a method of processing a substrate, including: forming a thin film containing silicon, oxygen and carbon or a thin film containing silicon, oxygen, carbon and nitrogen on a substrate by performing a cycle a predetermined number of times, the cycle including: supplying a precursor gas serving as a silicon source and a carbon source or a precursor gas serving as a silicon source but no carbon source, and a first catalyst gas to the substrate; supplying an oxidizing gas and a second catalyst gas to the substrate; and supplying a modifying gas containing at least one selected from the group consisting of carbon and nitrogen to the substrate.

(Supplementary Note 23)

Another aspect of the present disclosure provides a substrate processing apparatus including: a process chamber in which a substrate is accommodated; a precursor gas supply system configured to supply a precursor gas serving as a silicon source and a carbon source or a precursor gas serving as a silicon source but no carbon source into the process chamber; an oxidizing gas supply system configured to supply an oxidizing gas into the process chamber; a catalyst gas supply system configured to supply first and second catalyst gases into the process chamber; a modifying gas supply system configured to supply a modifying gas containing at least one selected from the group consisting of carbon and nitrogen into the process chamber; and a control unit configured to control the precursor gas supply system, the oxidizing gas supply system, the catalyst gas supply system and the modifying gas supply system such that a thin film containing silicon, oxygen and carbon or a thin film containing silicon, oxygen, carbon and nitrogen is formed on the substrate by performing a cycle a predetermined number of times, the cycle including: supplying the precursor gas and the first catalyst gas to the substrate within the process chamber; supplying the oxidizing gas and the second catalyst gas to the substrate within the process chamber; and supplying the modifying gas to the substrate within the process chamber.

(Supplementary Note 24)

Another aspect of the present disclosure provides a substrate processing system including: a first substrate processing part configured to form a first film on a substrate and a second substrate processing part configured to modify the first film, the first substrate processing part including: a first process chamber in which the substrate is accommodated; a precursor gas supply system configured to supply a precursor gas serving as a silicon source and a carbon source or a precursor gas serving as a silicon source but no carbon source into the first process chamber; an oxidizing gas supply system configured to supply an oxidizing gas into the first process chamber; a catalyst gas supply system configured to supply first and second catalyst gases into the first process chamber; and a first control unit configured to control the precursor gas supply system, the oxidizing gas supply system and the catalyst gas supply system such that a thin film containing silicon, oxygen and carbon or a thin film containing silicon and oxygen is formed on the substrate by performing a cycle a predetermined number of times, the cycle including: supplying the precursor gas and the first catalyst gas to the substrate within the first process chamber; and supplying the oxidizing gas and the second catalyst gas to the substrate within the first process chamber, and the second substrate processing part including: a second process chamber in which the substrate on which the first film is formed is accommodated; a modifying gas supply system configured to supply a modifying gas containing at least one selected from the group consisting of carbon and nitrogen into the second process chamber; and a second control unit configured to control the modifying gas supply system such that the first film is modified into a second film containing silicon, oxygen and carbon or a second film containing silicon, oxygen, carbon and nitrogen by supplying the modifying gas to the substrate within the second process chamber.

(Supplementary Note 25)

Another aspect of the present disclosure provides a non-transitory computer-readable recording medium storing a program that causes a computer to perform a process of forming a thin film containing silicon, oxygen and carbon or a thin film containing silicon, oxygen, carbon and nitrogen on a substrate within a process chamber by performing a cycle a predetermined number of times, the cycle including: supplying a precursor gas serving as a silicon source and a carbon source or a precursor gas serving as a silicon source but no carbon source, and a first catalyst gas to the substrate within the process chamber; supplying an oxidizing gas and a second catalyst gas to the substrate within the process chamber; and supplying a modifying gas containing at least one selected from the group consisting of carbon and nitrogen to the substrate within the process chamber.

According to the present disclosure in some embodiments, it is possible to provide a method of manufacturing a semiconductor device, which is capable of forming a film having a high etching resistance and a high ashing resistance.

While certain embodiments have been described, these embodiments have been presented by way of example only, and are not intended to limit the scope of the disclosure. Indeed, the novel methods and apparatuses described herein may be embodied in a variety of other forms; furthermore, various omissions, combinations, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of manufacturing a semiconductor device, comprising:
    forming a thin film containing silicon, oxygen and carbon or a thin film containing silicon, oxygen, carbon and nitrogen on a substrate by performing a cycle two or more times, the cycle including:
    forming a first film containing silicon, oxygen and carbon or a first film containing silicon and oxygen by performing a set a predetermined number of times, the set including:
        supplying a precursor gas serving as a silicon source and a carbon source or a precursor gas serving as a silicon source but no carbon source, and a first catalyst gas to the substrate; and
        supplying an oxidizing gas and a second catalyst gas to the substrate; and
    causing reaction of the first film with a modifying gas under a non-plasma atmosphere to modify the first film into a second film further containing carbon, a second film further containing nitrogen, or a second film further containing carbon and nitrogen, the modifying gas containing at least one selected from the group consisting of carbon and nitrogen.

2. The method of claim 1, wherein the act of supplying the precursor gas and the first catalyst gas and the act of supplying the oxidizing gas and the second catalyst gas are performed under a non-plasma atmosphere.

3. The method of claim 1, wherein, in the act of supplying the precursor gas and the first catalyst gas and the act of supplying the oxidizing gas and the second catalyst gas, a temperature of the substrate is set to a room temperature to 150 degrees C.

4. The method of claim 1, wherein the act of forming the first film and the act of modifying the first film are performed under a state where the substrate is accommodated in the same process chamber.

5. The method of claim 1, wherein the act of forming the first film and the act of modifying the first film are performed under a state where the substrate is accommodated in different process chambers.

6. The method of claim 1, wherein supplying the precursor gas and the first catalyst gas is performed before supplying the oxidizing gas and the second catalyst gas, and supplying the modifying gas is performed after supplying the oxidizing gas and the second catalyst gas.

7. The method of claim 1, wherein a temperature of the substrate in the act of supplying the modifying gas is set to be equal to a temperature of the substrate in the act of supplying the precursor gas and the first catalyst gas and the act of supplying the oxidizing gas and the second catalyst gas.

8. The method of claim 1, wherein, in the act of supplying the modifying gas, a temperature of the substrate is set to a room temperature to 500 degrees C.

9. The method of claim 1, wherein, in the act of supplying the modifying gas, a temperature of a substrate is set to 200 to 900 degrees C.

10. The method of claim 1, wherein, in the act of supplying the modifying gas, the modifying gas is supplied to the substrate in a plasma-excited state.

11. The method of claim 1, wherein the precursor gas contains silicon, carbon and a halogen element and has a Si—C bonding.

12. The method of claim 11, wherein the precursor gas contains at least one selected from the group consisting of an alkyl group and an alkylene group.

13. The method of claim 11, wherein the precursor gas has at least one selected from the group consisting of a Si—C—Si bonding and a Si—C—C—Si bonding.

14. The method of claim 1, wherein the modifying gas includes at least one selected from the group consisting of a carbon-containing gas, a nitrogen-containing gas and a gas containing carbon and nitrogen in one molecule.

15. The method of claim 1, wherein the modifying gas includes at least one selected from the group consisting of a hydrocarbon-based gas, an amine-based gas and a non-amine-based gas.

16. The method of claim 1, wherein the first and second catalyst gases include an amine-based catalyst gas.

* * * * *